(12) United States Patent
Ogihara et al.

(10) Patent No.: US 9,627,204 B2
(45) Date of Patent: Apr. 18, 2017

(54) COMPOSITION FOR FORMING A COATING TYPE BPSG FILM, SUBSTRATE FORMED A FILM BY SAID COMPOSITION, AND PATTERNING PROCESS USING SAID COMPOSITION

(71) Applicant: SHIN-ETSU CHEMICAL CO., LTD., Tokyo (JP)

(72) Inventors: Tsutomu Ogihara, Jyoetsu (JP); Takafumi Ueda, Jyoetsu (JP); Yoshinori Taneda, Jyoetsu (JP); Seiichiro Tachibana, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 8 days.

(21) Appl. No.: 14/306,617

(22) Filed: Jun. 17, 2014

(65) Prior Publication Data
US 2015/0004791 A1 Jan. 1, 2015

(30) Foreign Application Priority Data
Jun. 27, 2013 (JP) ................................. 2013-135207

(51) Int. Cl.
| | |
|---|---|
| *H01L 21/033* | (2006.01) |
| *H01L 21/311* | (2006.01) |
| *G03F 7/038* | (2006.01) |
| *G03F 7/004* | (2006.01) |
| *G03F 7/075* | (2006.01) |
| *G03F 7/11* | (2006.01) |

(Continued)

(52) U.S. Cl.
CPC ........ *H01L 21/0332* (2013.01); *G03F 7/0042* (2013.01); *G03F 7/0397* (2013.01); *G03F 7/0751* (2013.01); *G03F 7/0752* (2013.01); *G03F 7/094* (2013.01); *G03F 7/11* (2013.01); *G03F 7/2041* (2013.01); *G03F 7/325* (2013.01); *G03F 7/40* (2013.01); *H01L 21/02129* (2013.01); *H01L 21/02282* (2013.01); *G03F 7/0035* (2013.01)

(58) Field of Classification Search
CPC ................................................ H01L 21/02282
See application file for complete search history.

(56) References Cited

U.S. PATENT DOCUMENTS

| | | |
|---|---|---|
| 2007/0238300 A1 | 10/2007 | Ogihara et al. |
| 2009/0136869 A1 | 5/2009 | Ogihara et al. |

(Continued)

FOREIGN PATENT DOCUMENTS

| | | |
|---|---|---|
| EP | 2500775 A2 | 9/2012 |
| EP | 2657240 A1 | 10/2013 |

(Continued)

OTHER PUBLICATIONS

Dec. 23, 2014 Extended Search Report issued in European Application No. 14002107.

(Continued)

*Primary Examiner* — Alexander Ghyka
(74) *Attorney, Agent, or Firm* — Oliff PLC

(57) ABSTRACT

The present invention provides a composition for forming a coating type BPSG film, which comprises: one or more structures comprising a silicic acid represented by the following general formula (1) as a skeletal structure, one or more structures comprising a phosphoric acid represented by the following general formula (2) as a skeletal structure and one or more structures comprising a boric acid represented by the following general formula (3) as a skeletal structure. There can be provided a composition for forming a coating type BPSG film which is excellent in adhesiveness in fine pattern, can be easily wet etched by a peeling solution which does not cause any damage to the semiconductor apparatus substrate, the coating type organic film or the CVD film mainly comprising carbon which are necessary in the patterning process, and can suppress generation of particles by forming it in the coating process.

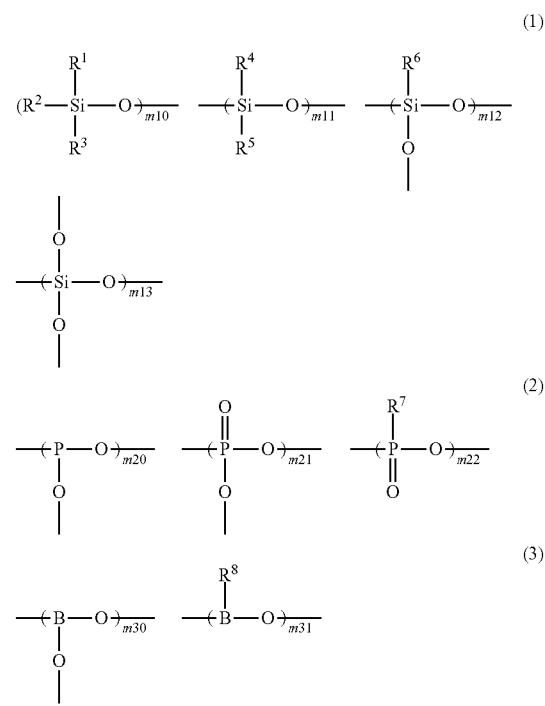

21 Claims, No Drawings

(51) Int. Cl.
  *H01L 21/02*   (2006.01)
  *G03F 7/40*    (2006.01)
  *G03F 7/039*   (2006.01)
  *G03F 7/09*    (2006.01)
  *G03F 7/20*    (2006.01)
  *G03F 7/32*    (2006.01)
  *G03F 7/00*    (2006.01)

(56) References Cited

U.S. PATENT DOCUMENTS

| | | |
|---|---|---|
| 2009/0286188 A1 | 11/2009 | Hatakeyama et al. |
| 2010/0086870 A1 | 4/2010  | Ogihara et al. |
| 2010/0086872 A1 | 4/2010  | Ogihara et al. |
| 2010/0147334 A1 | 6/2010  | Ogihara et al. |
| 2010/0285407 A1 | 11/2010 | Ogihara et al. |

FOREIGN PATENT DOCUMENTS

| | | |
|---|---|---|
| JP | A-2007-302873 | 11/2007 |
| JP | A-2009-126940 | 6/2009 |
| JP | A-2010-85893  | 4/2010 |
| JP | A-2010-85912  | 4/2010 |
| JP | A-2010-139764 | 6/2010 |
| JP | A-2010-262230 | 11/2010 |

OTHER PUBLICATIONS

Nakamura et al., "Contact Hole Formation by Multiple Exposure Technique in Ultra-low $k_1$ Lithography", *Optical Microlithography XVII, Proceedings of SPIE*, 2004, vol. 5377, p. 255-263.

COMPOSITION FOR FORMING A COATING TYPE BPSG FILM, SUBSTRATE FORMED A FILM BY SAID COMPOSITION, AND PATTERNING PROCESS USING SAID COMPOSITION

BACKGROUND OF THE INVENTION

Field of the Invention

The present invention relates to a composition for forming a coating type BPSG film usable in a process for producing a semiconductor device etc., a substrate formed a film by said composition, and a patterning process using said composition.

Description of the Related Art

In the 1980s, exposure light whose source is g-beam (436 nm) or i-beam (365 nm) of a mercury lamp was commonly used for resist patterning. To achieve a further micro resist pattern, a method for making exposure wavelength shorter has been regarded as more effective means. In the 1990s, 64 MB (work size: 0.25 μm or less) dynamic random access memory (DRAM) were mass produced, in which short-wavelength KrF excimer laser (248 nm) were employed as an exposure source instead of the i-beam (365 nm).

However, the production of DRAMs with an integration degree of 256 MB and 1 GB or more requires finer processing technology (work size: 0.2 μm or less), and needs a light source of shorter wavelength. Amid this technological need, the introduction of photolithography using ArF excimer laser (193 nm) has been seriously studied since about a decade ago. According to initial strategy, ArF lithography was going to be introduced in conjunction with the production of 180 nm-node devices, but a conventional KrF excimer lithography was continuously used until 130 nm-node device mass production. Therefore, official introduction of ArF lithography started with 90 nm-node device production.

Meanwhile, mass production of 65 nm-node devices are being promoted by combining with lenses whose numerical aperture (NA) was raised to 0.9. Because of advantageous shorter exposure wavelength, $F_2$ lithography with wavelength of 157 nm was regarded as a next promising production technology for subsequent 45 nm-node devices. However, development of $F_2$ lithography was canceled due to several problems such as higher scanner costs from expensive $CaF_2$ single crystals into projection lenses in large volumes, change in the optical system in accordance with introduction of hard pellicles instead of conventional extremely low durable soft pellicles, and reduced etch resistance of a resist film, thereby introducing ArF-immersion lithography. In the ArF-immersion lithography, water with a refractive index of 1.44 is inserted between a projection lens and a wafer by partial fill method, enabling high-speed scanning. Accordingly, 45 nm-node devices are mass produced by using lenses with an NA of 1.3.

Extreme-ultraviolet (EUV) lithography with wavelength of 13.5 nm is regarded as a next promising fine processing technology by using 32 nm-node lithography. Unfortunately, the EUV lithography is prone to numerous technical problems such as needs for higher laser output, higher sensitivity of a resist film, higher resolution, lower line edge roughness (LER), use of defect-free MoSi laminated mask, and lower aberration of a reflective mirror. Development of another promising 32 nm-node device production technology, high-refractive index immersion lithography, was canceled due to low transmission factor of another promising high-refractive index lens (LUAG) and an inability to obtain a target value of a liquid's refractive index at 1.8. Under the circumstances, general-purpose light exposure technology seems to fail to significantly improve the resolution unless a light source wavelength is changed.

Accordingly, development of a fine processing technology for obtaining a work size exceeding a limiting resolution of an existing ArF-immersion exposure technology has been promoted. As a technology thereof, double patterning technology is being proposed. Specifically, the double patterning technology is a method (method (1)) for forming a first photoresist pattern with an interval rate of a line to a space of 1:3 by using first exposure and development, processing an under layer hard mask by dry etching, laying another hard mask thereon, forming a second line pattern at a space portion obtained by the first exposure by using second exposure and development of a photoresist film, processing the hard mask by dry etching, to form the first pattern and the second pattern alternately. By this method, it is possible that forming a line and space pattern whose pitch is half that of an exposure pattern.

Also, there is another method (method (2)) for forming a first photoresist pattern with an interval rate of a line to a space of 3:1 by using first exposure and development, processing an under layer hard mask by dry etching, forming a pattern on a remaining portion of the hard mask by using second exposure by applying a photoresist film on the under layer hard mask, and processing the hard mask by dry etching with the pattern as a mask. In both methods, by processing a hard mask by two dry etching, a pattern whose pitch is half that of an exposure pattern can be formed. Nevertheless, while the method (1) requires formation of a hard mask twice, the method (2) needs one-time hard mask formation, but additional formation of a trench pattern which is more difficult to resolve than a line pattern.

Another method (method (3)) proposed is to form a line pattern on a positive resist film in X direction by using a dipole light, cure a resist pattern, apply a resist composition thereon again, expose a line pattern in Y direction by using a dipole light, and form a hole pattern from a gap of a grid-like line pattern (Non-Patent Document 1). Moreover, a method for halving a pitch by one-time pattern exposure by using spacer technology in which a resist pattern, an organic hard mask or a polysilicon film whose pattern is transferred and is regarded as a core pattern, and the core pattern is removed by using dry etching, after forming a silicon oxide film around the core pattern at a low temperature, is being proposed.

Accordingly, since finer processing is difficult to achieve only by using a resist film present in an upper layer, a finer patterning process cannot readily be introduced without using a hard mask formed in an under layer of a resist film. Under the circumstances, multilayer resist method is known as a method for using a hard mask as a resist under layer film. The method is that a middle layer film (e.g. a silicon-containing resist under layer film), whose etching selectivity is different from a photo resist film (i.e. an upper layer resist film), is formed between the upper layer resist film and a substrate to be processed; a pattern is formed with the upper layer resist film; then the pattern is transferred to the resist under layer film by dry etching using upper layer resist pattern as a dry etching mask; and further the pattern is transferred to the substrate to be processed or a core film of the spacer process by dry etching using the resist under layer film as a dry etching mask.

The present inventor has proposed a composition for forming a silicon-containing resist under layer film as disclosed in Patent Document 1 or Patent Document 2, etc., for a patterning process in a manufacturing process of a semiconductor apparatus which exceeds the limit of resolution of ArF liquid immersion lithography in recent years. However, it has inherently been used in a process exceeding the limit of resolution of the ArF liquid immersion lithography, so that the degree of difficulty is extremely high; thereby it is in fact impossible to pass through the patterning process with the yield of 100%, whereby there are cases where retry of coating the upper layer resist has to be done due to abnormality in coating the upper layer resist, in exposing it, etc. If the above-mentioned double patterning process becomes the mainstream of the patterning process in the future, the degree of difficulty of the patterning process is further heightened, and a ratio of the retrying process is expected to be higher.

The retrying process until now is to remove all the multi-layer resist under layer film by dry etching, or to remove the silicon-containing resist under layer film by a peeling solution containing hydrofluoric acid, etc., after peeling the upper layer resist by a solvent, so that damage to the substrate to be processed is concerned.

On the other hand, in the cutting-edge semiconductor apparatus, technologies such as three-dimensional transistor and through interconnection, etc., have been used to improve properties of the semiconductor apparatus. In a patterning process to be used for forming such a structure in the semiconductor apparatus, patterning by the multilayer resist method has been carried out. In such a patterning, after pattern formation, there are cases where the process for removing the silicon-containing resist under layer film without causing any damage to the pattern is necessary. However, main constitutional elements of the conventional silicon-containing resist under layer film and main constitutional elements of the pattern are both silicon in many cases, so that if one wishes to selectively remove the resist under layer film, constitutional components are similar whereby it is difficult to suppress damage of the pattern even by either of the methods of dry etching or wet etching which uses a hydrofluoric acid type peeling solution.

Further, after forming a structure at the so-called previous process portion of the semiconductor apparatus, there is a process which makes a wiring process easy by flattening the structure before forming a wire on the structure. Previously, a BPSG (boron phosphorus silica glass) film is formed by the CVD method, subsequently the BPSG film is flattened by thermo-fusion with a heat treatment. However, in the CVD method, generation of fine grains, the so-called particles cannot be avoided principally, and a special cleaning process for removing the particles is required so that the process is inefficient.

PRIOR ART DOCUMENTS

Patent Documents

Patent Document 1: Japanese Patent Laid-Open Publication No. 2007-302873
Patent Document 2: Japanese Patent Laid-Open Publication No. 2010-262230
Patent Document 3: Japanese Patent Laid-Open Publication No. 2009-126940
Patent Document 4: Japanese Patent Laid-Open Publication No. 2010-085893
Patent Document 5: Japanese Patent Laid-Open Publication No. 2010-085912
Patent Document 6: Japanese Patent Laid-Open Publication No. 2010-139764

Non-Patent Document

Non-Patent Document 1: Proc. SPIE Vol. 5377 p 255 (2004)

SUMMARY OF THE INVENTION

As mentioned above, when the conventional silicon-containing resist under layer film is used, there is a problem that dry etching or a hydrofluoric acid type peeling solution causes damage to the substrate in the retrying process of patterning or manufacturing process of the semiconductor apparatus structure. Also, in the conventional BPSG film formation by the CVD, there is a problem that a large amount of particles are generated, so that a process for washing and removing these particles is required, which makes the process inefficient.

The present invention has been done in view of the above-mentioned problems, and an object thereof is to provide a composition for forming a coating type BPSG film which is excellent in adhesiveness in fine pattern, can be easily wet etched by a peeling solution which does not cause any damage to the semiconductor apparatus substrate, the coating type organic film or the CVD film mainly comprising carbon which are necessary in the patterning process, and can suppress generation of particles by forming it in the coating process.

To solve the above-mentioned problems, the present invention provides, a composition for forming a coating type BPSG film which comprises one or more structures comprising a silicic acid represented by the following general formula (1) as a skeletal structure, one or more structures comprising a phosphoric acid represented by the following general formula (2) as a skeletal structure and one or more structures comprising a boric acid represented by the following general formula (3) as a skeletal structure,

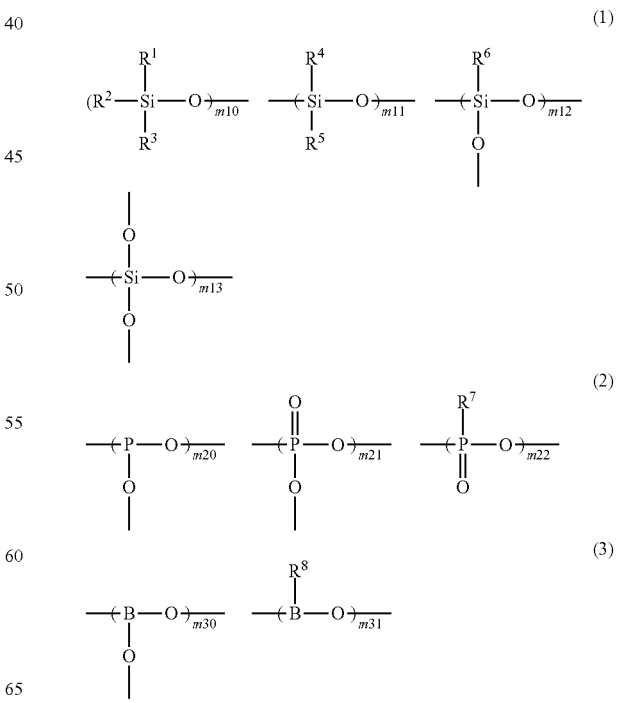

wherein, $R^1$, $R^2$, $R^3$, $R^4$, $R^5$, $R^6$, $R^7$ and $R^8$ each represent a hydrogen atom or an organic group having 1 to 30 carbon atoms, wherein a hydrogen atom(s) in the organic group may be substituted by a halogen atom(s); m10, m11, m12 and m13 each represent a molar fraction in the structure comprising a silicic acid as a skeletal structure, and satisfy m10+m11+m12+m13=1, 0≤m10≤0.3, 0≤m11≤0.5, 0≤m12≤0.7, and 0<m13≤1; m20, m21 and m22 each represent a molar fraction in the structure comprising a phosphoric acid as a skeletal structure, and satisfy m20+m21+m22=1, 0≤m20≤1, 0≤m21≤1, and 0≤m22<1; m30 and m31 each represent a molar fraction in the structure comprising a boric acid as a skeletal structure, and satisfy m30+m31=1, 0≤m30≤1, and 0≤m31≤1.

According to the above-mentioned composition for forming a coating type BPSG film of the present invention, it gives a composition for forming a coating type BPSG film which is excellent in adhesiveness in fine pattern, is capable of easily subjecting to wet etching with a peeling solution which does not cause any damage to a semiconductor apparatus substrate, a coating type organic film or a CVD film mainly comprising carbon which are necessary in the patterning process, and is capable of suppressing generation of particles by forming it in the coating process. Especially, by introducing an organic group(s) substituted by a halogen atom(s), peeling property of the BPSG film can be improved.

Also, the above-mentioned composition for forming a coating type BPSG film preferably comprises a solvent(s) and one or more polymers selected from a hydrolysate, a condensate and a hydrolysis condensate of a mixture, as Component (A), which comprises one or more silicon compounds represented by the following general formulae (A-1-1) to (A-1-4), and either one or both of one or more phosphorus compounds represented by the following general formulae (A-2-1) to (A-2-6) and one or more boron compounds represented by the following general formulae (A-3-1) to (A-3-3), $$R^1R^2R^3SiOR \quad (A\text{-}1\text{-}1)$$

$$R^4R^5Si(OR)_2 \quad (A\text{-}1\text{-}2)$$

$$R^6Si(OR)_3 \quad (A\text{-}1\text{-}3)$$

$$Si(OR)_4 \quad (A\text{-}1\text{-}4)$$

wherein, R represents a hydrocarbon group having 1 to 6 carbon atoms; and $R^1$, $R^2$, $R^3$, $R^4$, $R^5$ and $R^6$ have the same meanings as defined above, $$PX_3 \quad (A\text{-}2\text{-}1)$$

$$POX_3 \quad (A\text{-}2\text{-}2)$$

$$P_2O_5 \quad (A\text{-}2\text{-}3)$$

$$H(HPO_3)_aOH \quad (A\text{-}2\text{-}4)$$

$$R^7PX_2 \quad (A\text{-}2\text{-}5)$$

$$R^7POX_2 \quad (A\text{-}2\text{-}6)$$

wherein, $R^7$ has the same meaning as defined above, X represents a halogen atom, a hydroxyl group or an alkoxy group having 1 to 6 carbon atoms; and "a" is an integer of 1 or more, $$BX_3 \quad (A\text{-}3\text{-}1)$$

$$B_2O_3 \quad (A\text{-}3\text{-}2)$$

$$R^8BX_2 \quad (A\text{-}3\text{-}3)$$

wherein, $R^8$ and X have the same meanings as defined above.

By using such a silicon compound, a phosphorus compound and a boron compound as Component (A), the composition for forming a coating type BPSG film having a structure comprising a silicic acid as a skeletal structure, a structure comprising a phosphoric acid as a skeletal structure, and a structure comprising a boric acid as a skeletal structure as mentioned above can be obtained.

Further, it is preferred that the above-mentioned composition for forming a coating type BPSG film further comprises, as Component (B), one or more selected from one or more silicon compounds represented by the following general formula (B-1), a hydrolysate, a condensate and a hydrolysis condensate thereof, $$R^{1B}{}_{b1}R^{2B}{}_{b2}R^{3B}{}_{b3}Si(OR^{OB})_{(4-b1-b2-b3)} \quad (B\text{-}1)$$

wherein, $R^{OB}$ represents a hydrocarbon group having 1 to 6 carbon atoms, $R^{1B}$, $R^{2B}$, $R^{3B}$ each represent a hydrogen atom or an organic group having 1 to 30 carbon atoms; and b1, b2 and b3 are each 0 or 1, and satisfy 1≤b1+b2+b3≤3.

By using such Component (B) in addition to Component (A), when it is used as a resist under layer film, a composition for forming a coating type BPSG film which becomes a resist under layer film in which adhesiveness to the photoresist pattern is improved, and causing no collapse of the pattern even in a fine pattern, can be obtained.

At this time, it is also preferable that one or more of $R^{1B}$, $R^{2B}$ and $R^{3B}$ in the above general formula (B-1) is/are an organic group(s) having a hydroxyl group or a carboxyl group each substituted by an acid-labile group.

If such Component (B) is used, the pattern adhesiveness to the fine pattern can be more improved.

Also, the Component (B) preferably comprises one or more selected from one or more silicon compounds represented by the above general formulae (A-1-1) to (A-1-4), one or more phosphorus compounds represented by the above general formulae (A-2-1) to (A-2-6), and one or more boron compounds represented by the above general formulae (A-3-1) to (A-3-3), each singly, or a mixture thereof, and a hydrolysate, a condensate and a hydrolysis condensate thereof.

By using such Component (B) containing the silicon compound(s), the phosphorus compound(s) and the boron compound(s), the composition for forming a coating type BPSG film containing the structure comprising a silicic acid as a skeletal structure, the structure comprising a phosphoric acid as a skeletal structure, and the structure comprising a boric acid as a skeletal structure as mentioned above can be more reliably obtained.

Further, it is preferable that the composition for forming a coating type BPSG film contains an organic compound(s) having 3 or more hydroxyl groups or carboxyl groups in one molecule.

By adding such an organic compound(s), collapse of the BPSG film is promoted at the time of the wet etching whereby peeling becomes easy.

The present invention also provides a substrate which is to be used in a manufacturing process of a semiconductor apparatus, and comprise a BPSG film formed on a body to be processed (a material to be processed) by coating the above-mentioned composition for forming a coating type BPSG film.

At this time, the BPSG film may function as at least one of a resist under layer film, a flattening film and an insulating film.

Thus, the composition for forming a coating type BPSG film of the present invention is coated on the body to be processed to obtain a substrate using it as a resist under layer film, a flattening film or an insulating film.

Further, a semiconductor apparatus substrate on which a part or whole of the semiconductor circuits has/have been formed is used as a body to be processed, and the above-mentioned composition for forming a coating type BPSG film is spin coated on the semiconductor apparatus substrate, and baked to obtain a material on which the BPSG film is formed.

By using the composition for forming a coating type BPSG film of the present invention, it is spin coated on a semiconductor apparatus substrate on which a part or whole of the semiconductor circuits has/have been formed, and baked, whereby a BPSG film can be formed on such a substrate.

The present invention also provides a patterning process which comprises forming an organic under layer film on a body to be processed by using a coating type organic under layer film material, forming a BPSG film on the organic under layer film by using the above-mentioned composition for forming a coating type BPSG film, forming an upper layer resist film on the BPSG film, forming a pattern to the upper layer resist film, pattern transferring to the BPSG film by etching using the upper layer resist film having the formed pattern as a mask, and pattern transferring to the organic under layer film by etching using the BPSG film having the formed pattern as a mask, to form a mask pattern for processing the body to be processed.

Further, the present invention provides a patterning process which comprises forming a hard mask mainly comprising carbon on a body to be processed by a CVD method, forming a BPSG film on the hard mask by using the above-mentioned composition for forming a coating type BPSG film, forming an upper layer resist film on the BPSG film, forming a pattern to the upper layer resist film, pattern transferring to the BPSG film by etching using the upper layer resist film having the formed pattern as a mask, and pattern transferring to the hard mask by etching using the BPSG film having the formed pattern as a mask, to form a mask pattern for processing the body to be processed.

When pattern formation is carried out by using the composition for forming a coating type BPSG film of the present invention, by optimizing the combination of the coating type organic under layer film or the CVD film mainly comprising carbon as mentioned above, the pattern formed at the upper layer resist film can be formed on the body to be processed by transferring the pattern without generating the difference in size conversion.

After subjecting to the process for forming the mask pattern for processing the body to be processed, a process for removing the BPSG film by wet etching may be performed.

When a pattern is formed by using the composition for forming a coating type BPSG film of the present invention, it is possible to easily perform wet etching of the BPSG film without causing any damage to the coating type organic under layer film or the CVD film mainly comprising carbon.

Further, the body to be processed may be a material in which any of a metal film, an amorphous metal film, a metal carbide film, a metal oxide film, a metal nitride film, a metal oxycarbide film or a metal oxynitride film is formed on a semiconductor apparatus substrate on which a part or whole of semiconductor circuits has/have been formed, as a layer to be processed.

Further, the metal constitutes the body to be processed may comprise silicon, titanium, tungsten, hafnium, zirconium, chromium, germanium, copper, aluminum, indium, gallium, arsenic, palladium, iron, tantalum, iridium, molybdenum, or an alloy thereof.

Accordingly, the patterning process of the present invention can form a pattern by processing the above body to be processed.

Further, the pattern formation of the upper layer resist film is preferably carried out by a lithography method using light with a wavelength of 300 nm or less or EUV light, an electron beam direct drawing method, a directed self-assembly method or a nano-imprinting lithography method.

By using these methods, a fine pattern can be formed to a resist upper layer film.

The coating type BPSG film formed by using the composition for forming a coating type BPSG film of the present invention shows good adhesiveness to the photoresist pattern formed thereon by using it as a resist under layer film, and even in a fine pattern, it becomes a resist under layer film which causes no collapse of the pattern. Moreover, this coating type BPSG film shows high etching selectivity to both of the resist pattern formed at the upper side and the organic film formed at the lower side, so that the formed photoresist pattern can be transferred to the substrate by using the dry etching process. Moreover, it can easily perform wet etching by a peeling solution without causing any damage to the coating type organic under layer film or the CVD film mainly comprising carbon, and is possible to perform wet etching of the BPSG film easily also in the retrying process. Especially, by introducing an organic group(s) substituted by a halogen atom(s), peeling property of the BPSG film can be improved.

Further, when a flattening film or an insulating film is formed by using the composition for forming a coating type BPSG film of the present invention, the BPSG film can be formed without generating particles at the time of film formation.

Moreover, when a pattern is formed by using the composition for forming a coating type BPSG film of the present invention, by optimizing the combination of a coating type organic under layer film or a CVD film mainly comprising carbon, a pattern formed with the photoresist can be formed on the substrate without generating the difference in size conversion.

DETAILED DESCRIPTION OF THE PREFERRED EMBODIMENTS

As mentioned above, when the conventional silicon-containing resist under layer film is used, in the retrying process of patterning or in the manufacturing process of the semiconductor apparatus structure, there is a problem that the substrate is damaged by dry etching or by a hydrofluoric acid type peeling solution. In addition, in the conventional formation of the BPSG film by the CVD, a large amount of particles are generated, so that a process for washing and removing the particles is required, which makes the process inefficient.

Thus, it has been desired to develop a composition for forming a coating type BPSG film which is excellent in adhesiveness in fine pattern, and is easily capable of subjecting to wet etching by a peeling solution which does not cause any damage to a semiconductor apparatus substrate, a coating type organic film or a CVD film mainly comprising carbon which are necessary in the patterning process, for example, an ammonia aqueous solution containing hydrogen peroxide which is called as SC (Standard Clean) 1 or hydrochloric acid containing hydrogen peroxide which is called as SC2 which has been generally used in the semiconductor manufacturing process.

The present inventors have intensively studied to solve the above-mentioned problems, and as a result, they have found that a coating film obtained from a composition containing a silicon-containing compound which contains boron and phosphorus is easily removable by SC1, and shows the same heat-fusible properties such as flattening, etc., as those of the conventional BPSG film formed by the CVD, whereby they have accomplished the present invention.

In the prior art regarding the silicon-containing resist under layer film, there are techniques disclosed in Patent Documents 3 to 6 as a material containing boron or phosphorus, or further containing an organic cross-linking agent. However, in said prior art references, combination of these other than silicon is too limitative, and wet etching property that is shown by combining boron and phosphorus, and further with an organic cross-linking agent as disclosed in the present invention is not referred to therein.

In the following, the embodiments of the present invention are explained, but the present invention is not limited by them. Meanwhile, in the present specification, "Me" represents a methyl group, "Et" represents an ethyl group and "Ac" represents an acetyl group.

The present invention is a composition for forming a coating type BPSG film, which comprises one or more structures comprising a silicic acid represented by the following general formula (1) as a skeletal structure, one or more structures comprising a phosphoric acid represented by the following general formula (2) as a skeletal structure, and one or more structures comprising a boric acid represented by the following general formula (3) as a skeletal structure,

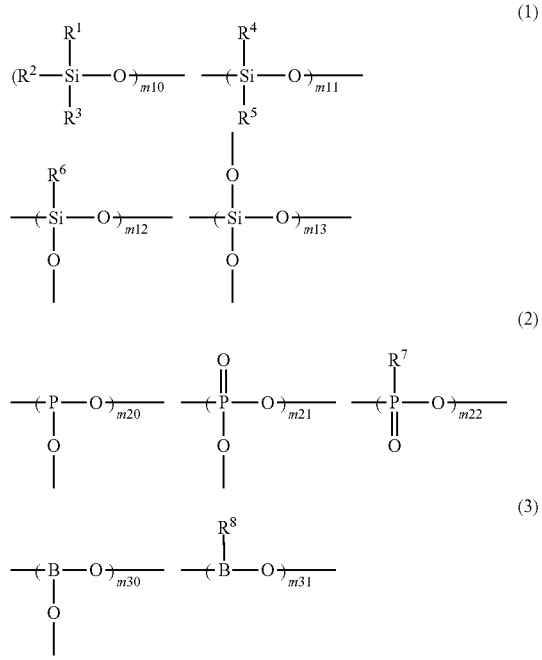

wherein, $R^1$, $R^2$, $R^3$, $R^4$, $R^5$, $R^6$, $R^7$ and $R^8$ each represent a hydrogen atom or an organic group having 1 to 30 carbon atoms, wherein a hydrogen atom(s) in the organic group may be substituted by a halogen atom(s), and a fluorine atom and a chlorine atom are preferable as the halogen atom; m10, m11, m12 and m13 each represent a molar fraction in the structure comprising a silicic acid as a skeletal structure, and satisfy $m10+m11+m12+m13=1$, $0 \le m10 \le 0.3$, $0 \le m11 \le 0.5$, $0 \le m12 \le 0.7$, and $0 < m13 \le 1$; m20, m21 and m22 each represent a molar fraction in the structure comprising a phosphoric acid as a skeletal structure, and satisfy $m20+m21+m22=1$, $0 \le m20 \le 1$, $0 \le m21 \le 1$, and $0 \le m22 < 1$; m30 and m31 each represent a molar fraction in the structure comprising a boric acid as a skeletal structure, and satisfy $m30+m31=1$, $0 \le m30 \le 1$, and $0 \le m31 \le 1$.

m10, m11, m12 and m13 in the above general formula (1) each represent a molar fraction in the structure comprising a silicic acid as a skeletal structure, and satisfy $m10+m11+m12+m13=1$, $0 \le m10 \le 0.3$, $0 \le m11 \le 0.5$, $0 \le m12 \le 0.7$, and $0 < m13 \le 1$.

$SiO_2$ is an essential unit in the structure comprising a silicic acid as a skeletal structure. Also, when the respective units satisfy the above ratio, a composition for forming a coating type BPSG film having good dry etching resistance, pattern adhesiveness and wet etching property with good balance, can be obtained.

m20, m21 and m22 in the above general formula (2) each represent a molar fraction in the structure comprising a phosphoric acid as a skeletal structure, and satisfy $m20+m21+m22=1$, $0 \le m20 \le 1$, $0 \le m21 \le 1$, and $0 \le m22 < 1$.

$PO_{1.5}$ or $PO_{2.5}$ is an essential unit in the structure comprising a phosphoric acid as a skeletal structure. Also, when the respective units satisfy the above ratio, a composition for forming a coating type BPSG film having dry good etching resistance, pattern adhesiveness and wet etching property with good balance, can be obtained.

m30 and m31 in the above general formula (3) each represent a molar fraction in the structure comprising a boric acid as a skeletal structure, and satisfy $m30+m31=1$, $0 \le m30 \le 1$, and $0 \le m31 \le 1$.

Each unit in the structure comprising a boric acid as a skeletal structure may be either one of these, or may contain both of these.

Such a composition for forming a coating type BPSG film is excellent in adhesiveness in fine pattern, is capable of easily subjecting to wet etching with a peeling solution which does not cause any damage to a semiconductor apparatus substrate, or a coating type organic film or a CVD film mainly comprising carbon which are necessary in the patterning process, and is capable of suppressing generation of particles by forming it in the coating process.

[Component (A)]

The above-mentioned composition for forming a coating type BPSG film preferably comprises a solvent(s) and one or more polymers selected from a hydrolysate, a condensate and a hydrolysis condensate of a mixture, as Component (A), which comprises one or more silicon compounds represented by the following general formulae (A-1-1) to (A-1-4), and either one of or both of one or more phosphorus compounds represented by the following general formulae (A-2-1) to (A-2-6) and one or more boron compounds represented by the following general formulae (A-3-1) to (A-3-3), $$R^1R^2R^3SiOR \quad \text{(A-1-1)}$$

$$R^4R^5Si(OR)_2 \quad \text{(A-1-2)}$$

$$R^6Si(OR)_3 \quad \text{(A-1-3)}$$

$$Si(OR)_4 \quad \text{(A-1-4)}$$

wherein, R represents a hydrocarbon group having 1 to 6 carbon atoms; and $R^1$, $R^2$, $R^3$, $R^4$, $R^5$ and $R^6$ have the same meanings as defined above, $$PX_3 \quad (A\text{-}2\text{-}1)$$

$$POX_3 \quad (A\text{-}2\text{-}2)$$

$$P_2O_5 \quad (A\text{-}2\text{-}3)$$

$$H(HPO_3)_aOH \quad (A\text{-}2\text{-}4)$$

$$R^7PX_2 \quad (A\text{-}2\text{-}5)$$

$$R^7POX_2 \quad (A\text{-}2\text{-}6)$$

wherein, $R^7$ has the same meaning as defined above; X represents a halogen atom, a hydroxyl group or an alkoxy group having 1 to 6 carbon atoms; and "a" is an integer of 1 or more, $$BX_3 \quad (A\text{-}3\text{-}1)$$

$$B_2O_3 \quad (A\text{-}3\text{-}2)$$

$$R^8BX_2 \quad (A\text{-}3\text{-}3)$$

wherein, $R^8$ and X have the same meanings as defined above.

[Silicon Compound]

The silicon compound which can be used as Component (A) may be mentioned a material represented by the following general formula (A-1-1), $$R^1R^2R^3SiOR \quad (A\text{-}1\text{-}1)$$

wherein, R represents a hydrocarbon group having 1 to 6 carbon atoms; and $R^1$, $R^2$ and $R^3$ each represent a hydrogen atom or an organic group having 1 to 30 carbon atoms, wherein a hydrogen atom(s) in the organic group may be substituted by a halogen atom(s).

Preferable examples of the silicon compound represented by the above general formula (A-1-1) include trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, dimethyl phenethyl ethoxy silane, etc.

The silicon compound which can be used as Component (A) may be mentioned a material represented by the following general formula (A-1-2), $$R^4R^5Si(OR)_2 \quad (A\text{-}1\text{-}2)$$

wherein, R represents a hydrocarbon group having 1 to 6 carbon atoms; and $R^4$ and $R^5$ each represent a hydrogen atom or an organic group having 1 to 30 carbon atoms, wherein a hydrogen atom(s) in the organic group may be substituted by a halogen atom(s).

Preferable examples of the silicon compound represented by the above general formula (A-1-2) include dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-t-butyl dimethoxy silane, di-t-butyl diethoxy silane, di-t-butyl dipropoxy silane, di-t-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl)dimethoxy silane, bis(bicycloheptenyl)diethoxy silane, bis(bicycloheptenyl)dipropoxy silane, bis(bicycloheptenyl) diisopropoxy silane, bis(bicycloheptyl)dimethoxy silane, bis(bicycloheptyl)diethoxy silane, bis(bicycloheptyl)dipropoxy silane, bis(bicycloheptyl)diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, etc.

The silicon compound which can be used as Component (A) may be mentioned a material represented by the following general formula (A-1-3), $$R^6Si(OR)_3 \quad (A\text{-}1\text{-}3)$$

wherein, R represents a hydrocarbon group having 1 to 6 carbon atoms; and $R^6$ represents a hydrogen atom or an organic group having 1 to 30 carbon atoms, wherein a hydrogen atom(s) in the organic group may be substituted by a halogen atom(s).

Preferable examples of the silicon compound represented by the above general formula (A-1-3) include trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, t-butyl trimethoxy silane, t-butyl triethoxy silane, t-butyl tripropoxy silane, t-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, anisyl trimethoxy silane, anisyl triethoxy silane, anisyl tripropoxy silane, anisyl triisopropoxy silane, tolyl trimethoxy silane, tolyl triethoxy silane, tolyl tripropoxy silane, tolyl triisopropoxy silane, phenethyl trimethoxy silane, phenethyl triethoxy silane, phenethyl tripropoxy silane, phenethyl triisopropoxy silane, benzoyloxymethyl trimethoxy silane, benzoyloxymethyl triethoxy silane, benzoyloxymethyl tripropoxy silane, benzoyloxymethyl tributoxy silane, 3-benzoyloxypropyl trimethoxy silane, 3-benzoyloxypropyl triethoxy silane, 3-benzoyloxypropyl tripropoxy silane, 3-benzoyloxypropyl tributoxy silane, naphthyl trimethoxy silane, naphthyl triethoxy silane, naphthyl tripropoxy silane, naphthyl triisopropoxy silane, etc.

Moreover, preferable examples of the silicon compound wherein a hydrogen atom(s) in the organic group represented by $R^1$, $R^2$, $R^3$, $R^4$, $R^5$ and $R^6$ is/are substituted by a halogen atom(s) are shown below.

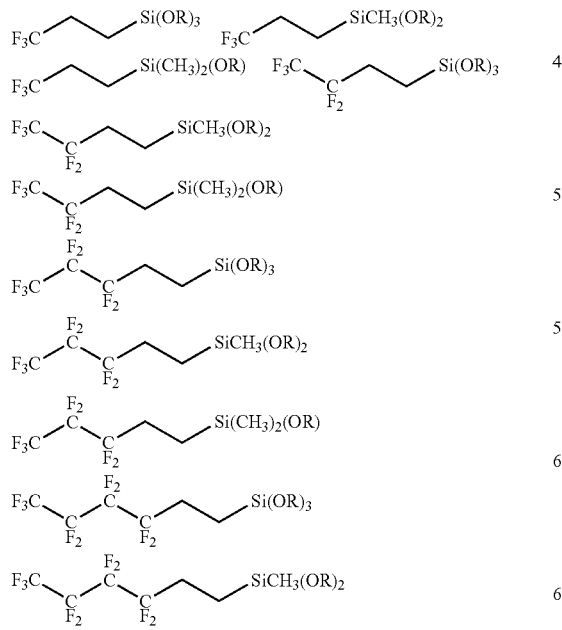

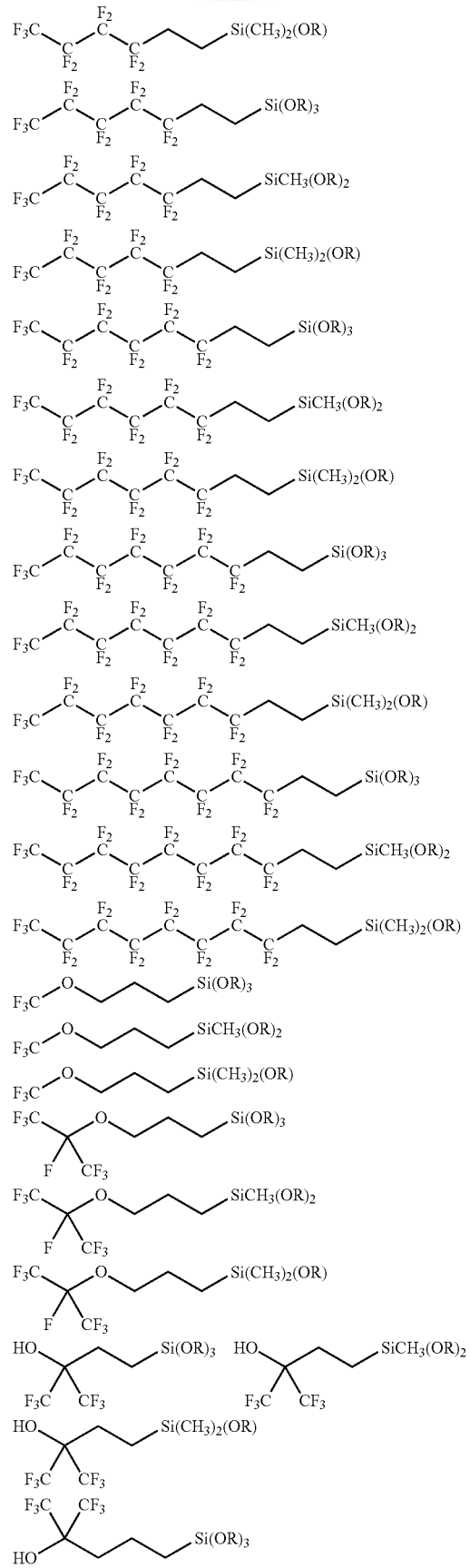

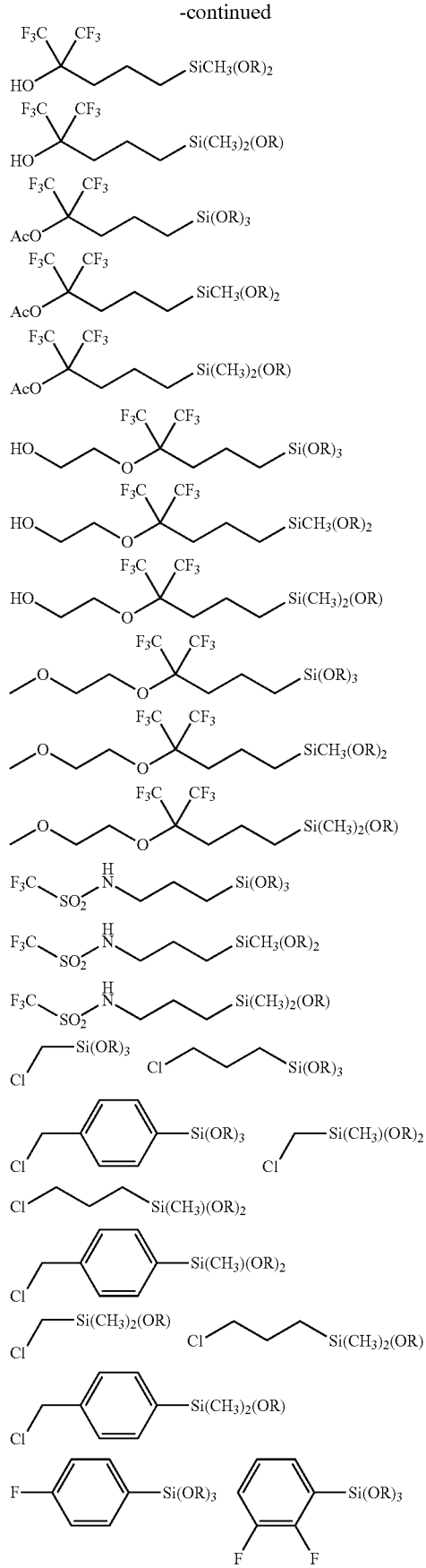
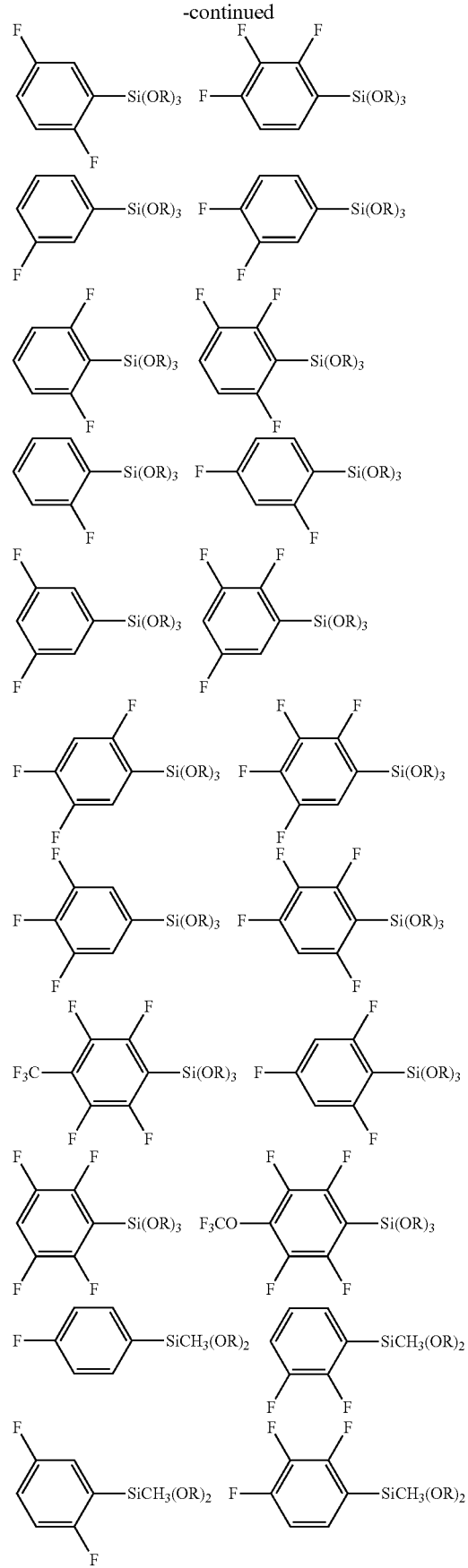

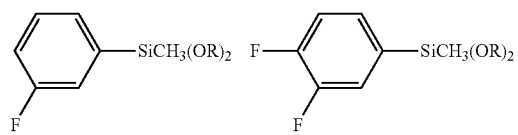
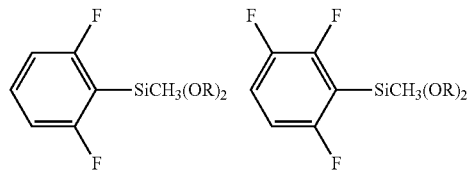
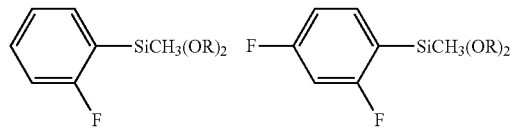
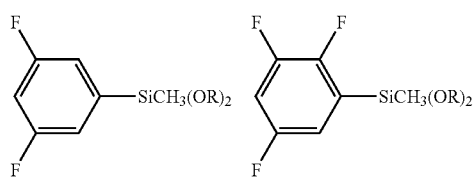
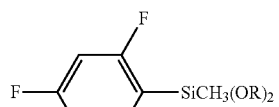
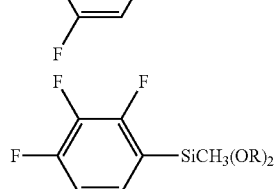
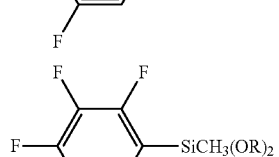
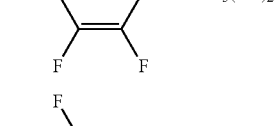
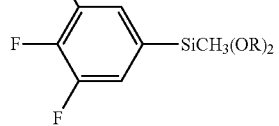
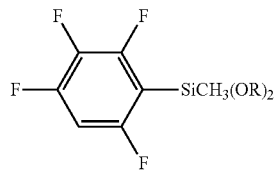
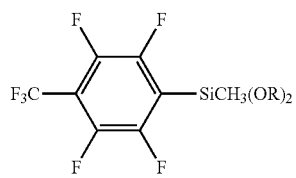
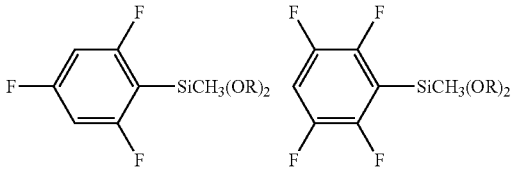
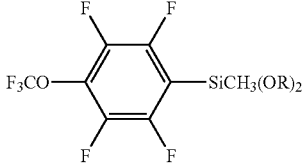
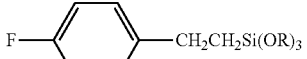
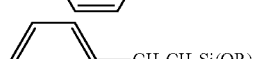
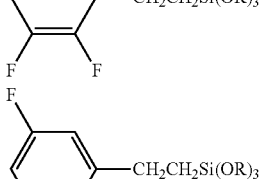
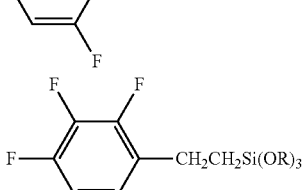
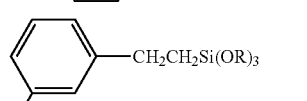
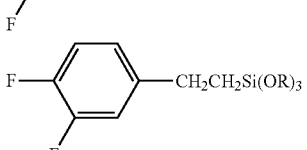
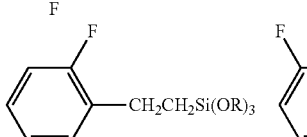
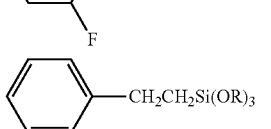
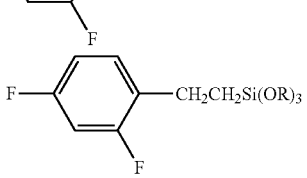
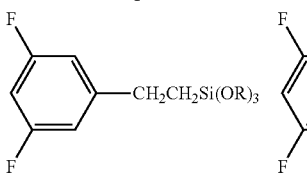

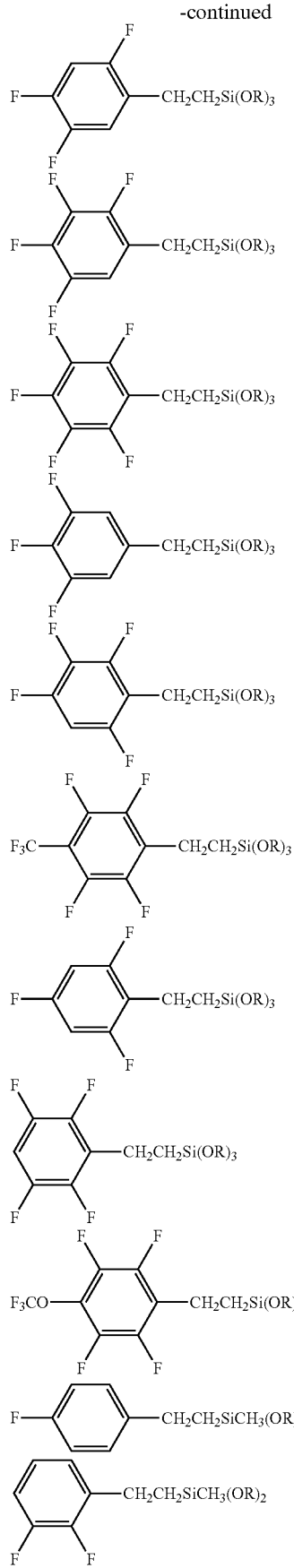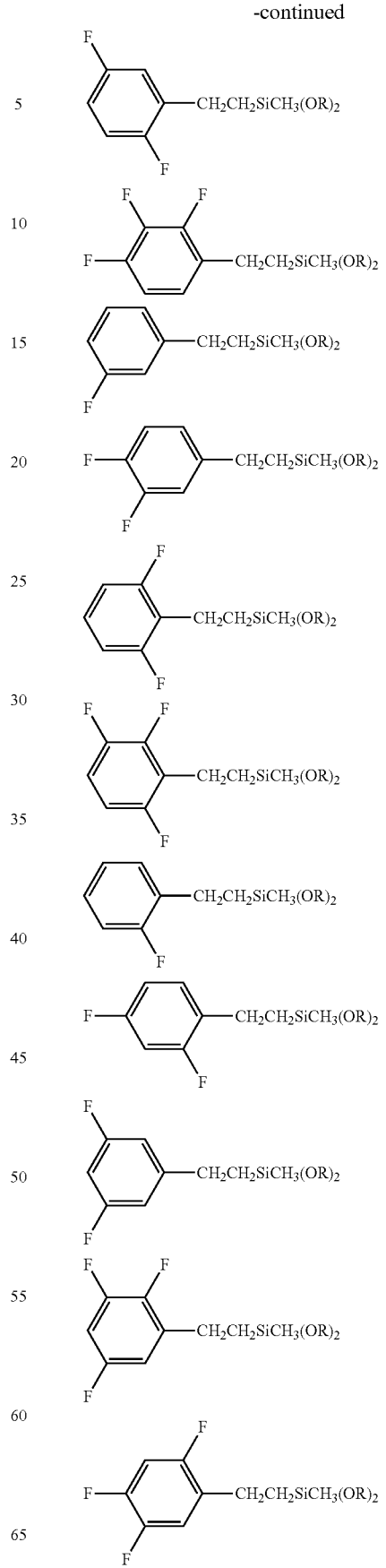

-continued
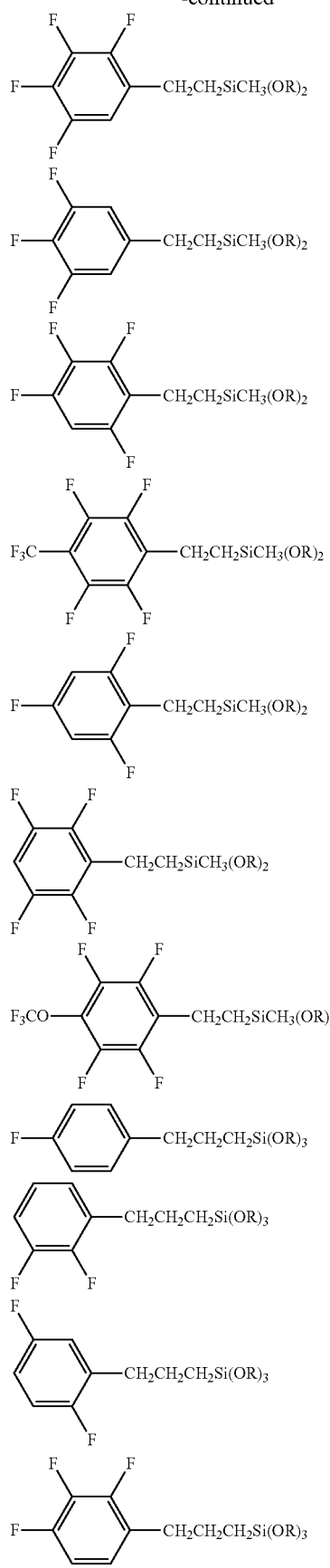
-continued
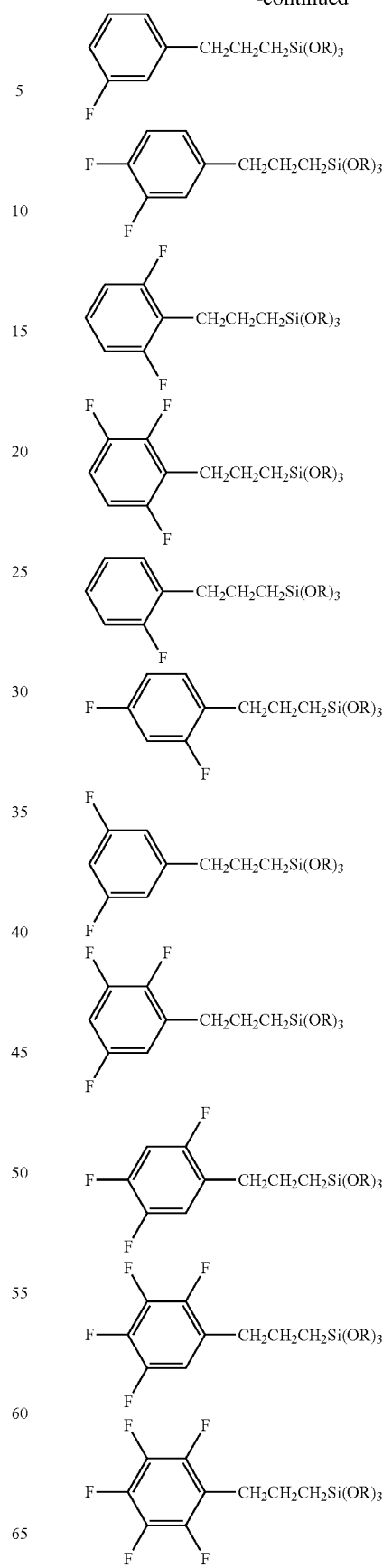

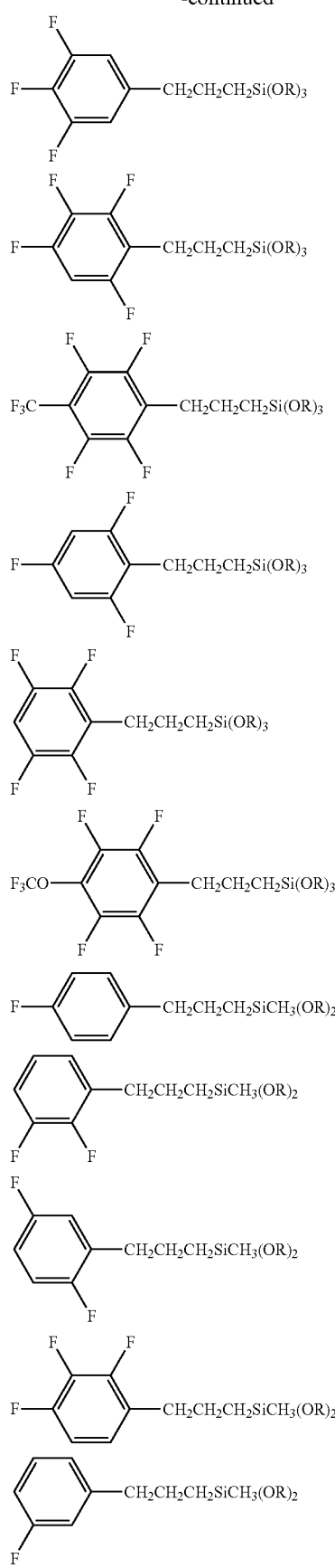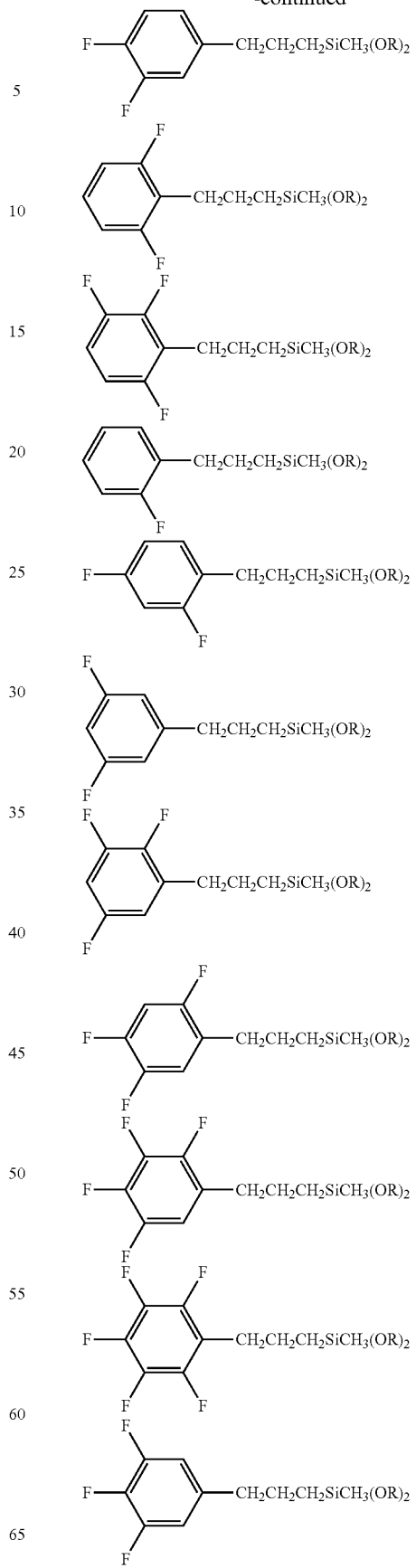

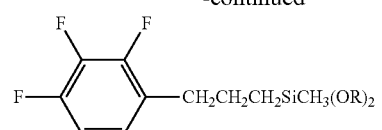
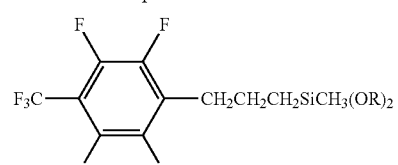
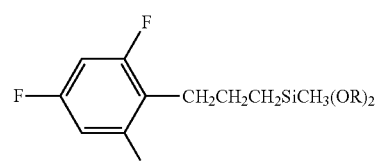
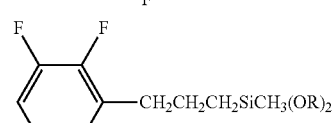
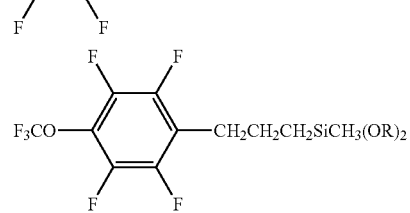
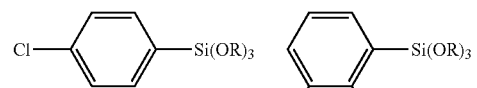
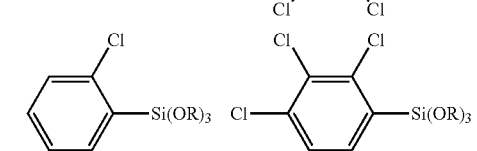
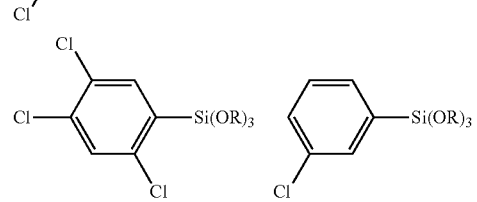
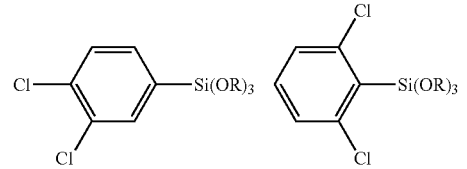
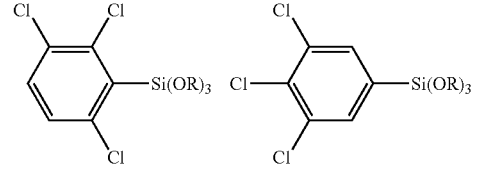
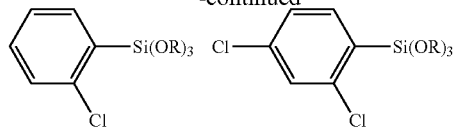
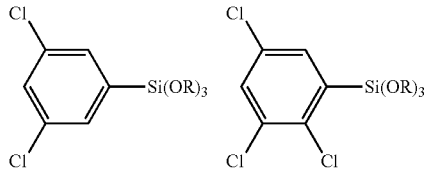
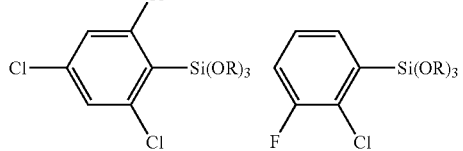
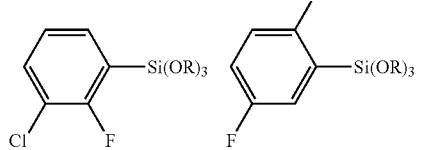
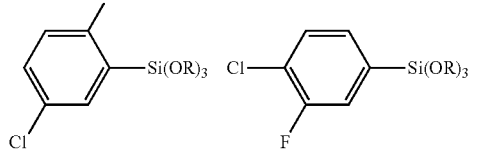
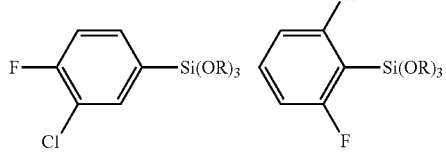
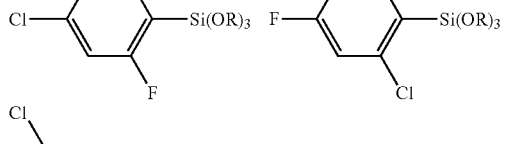
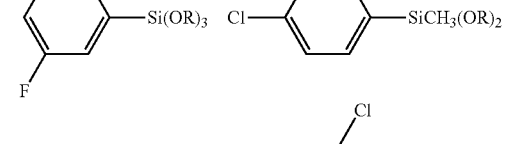
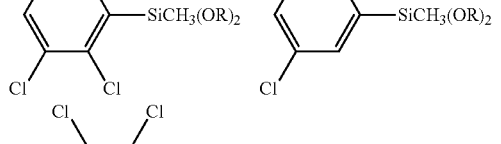
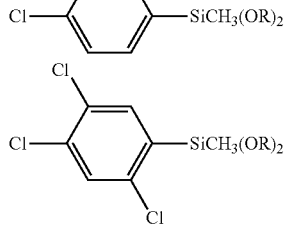

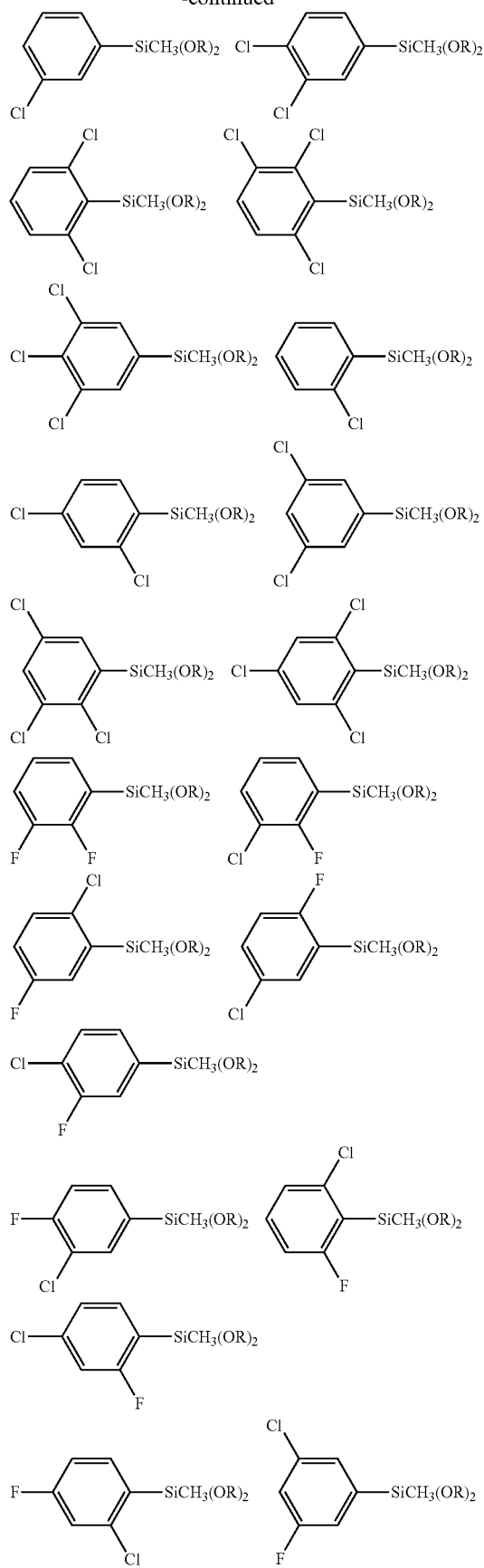
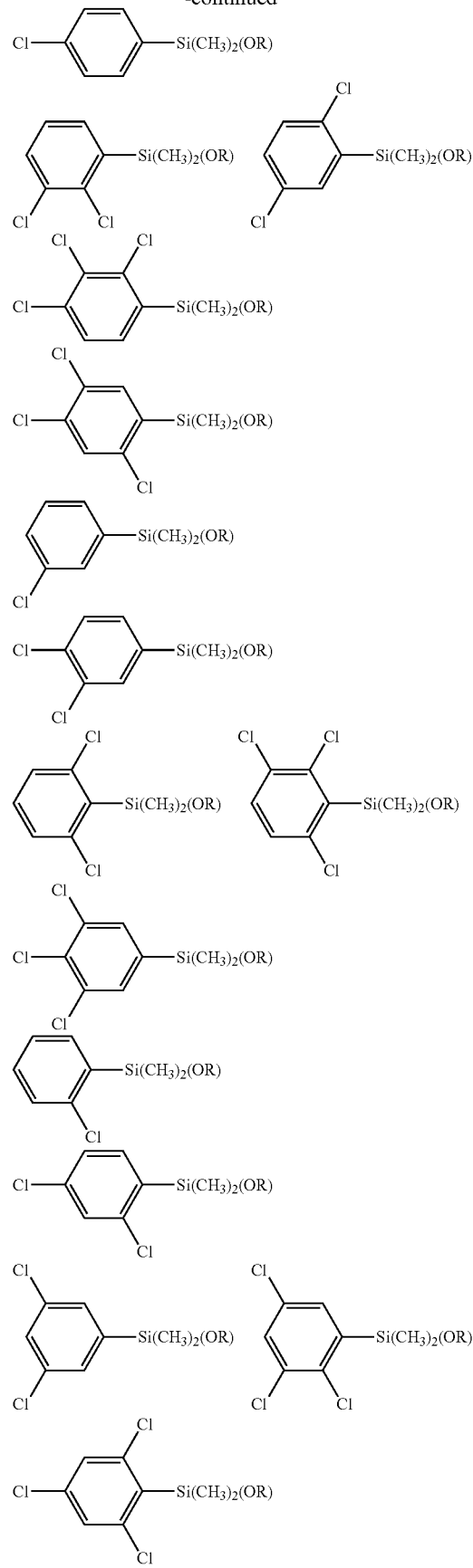

-continued
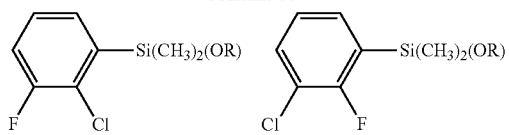
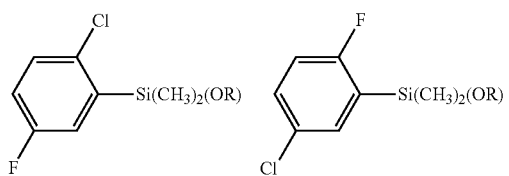
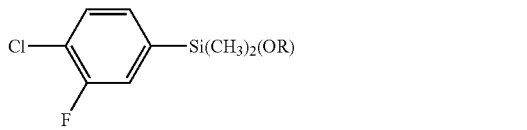
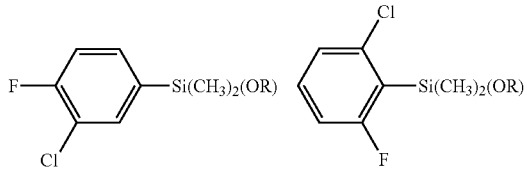
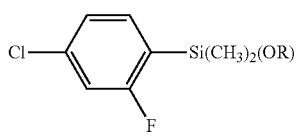
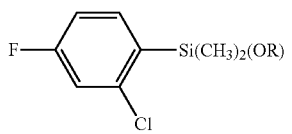
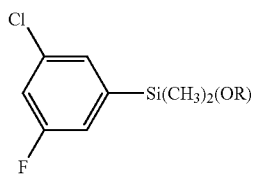
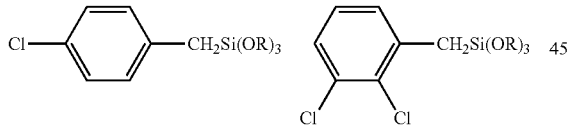
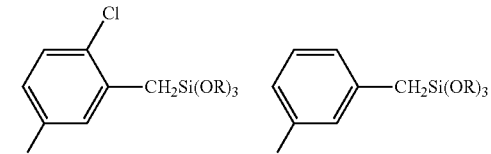
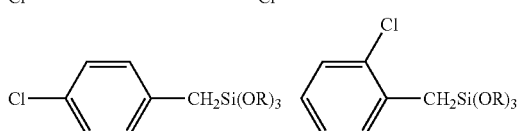
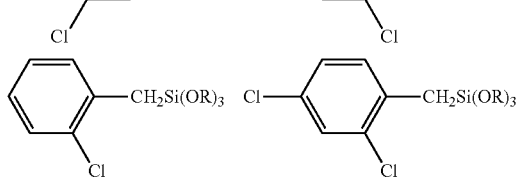
-continued
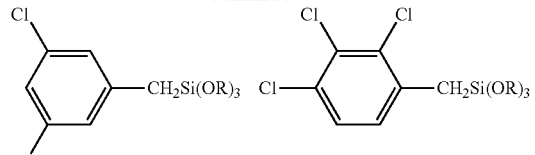
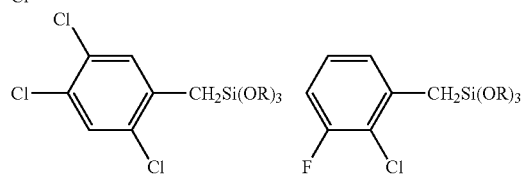
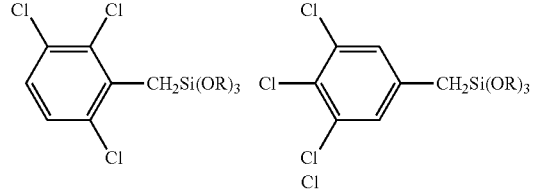
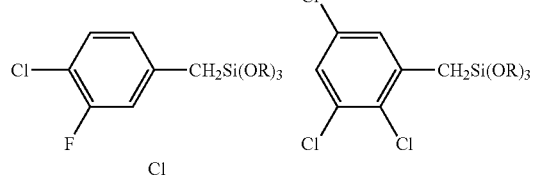
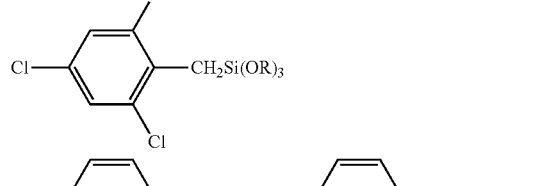
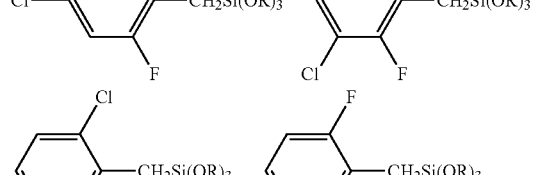
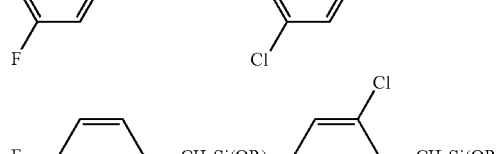
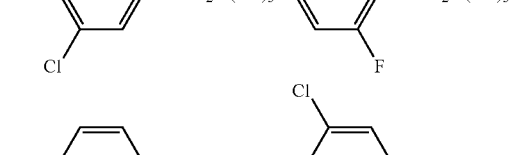
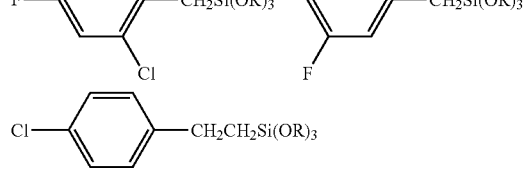
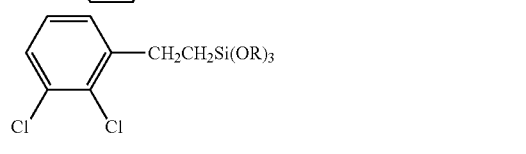

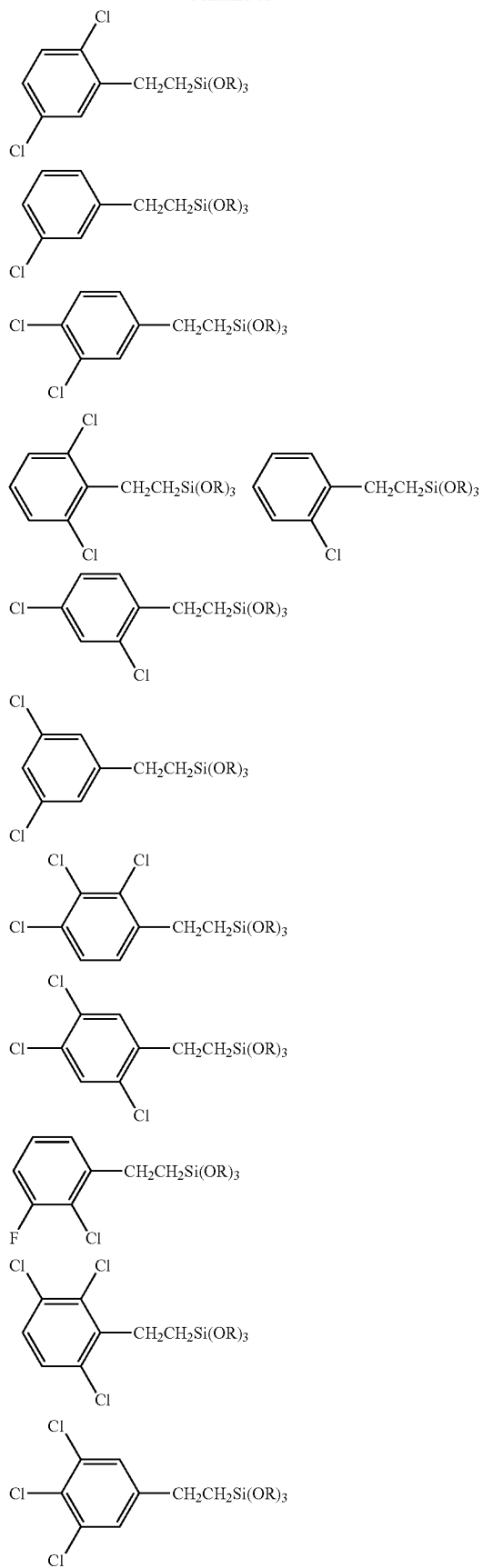
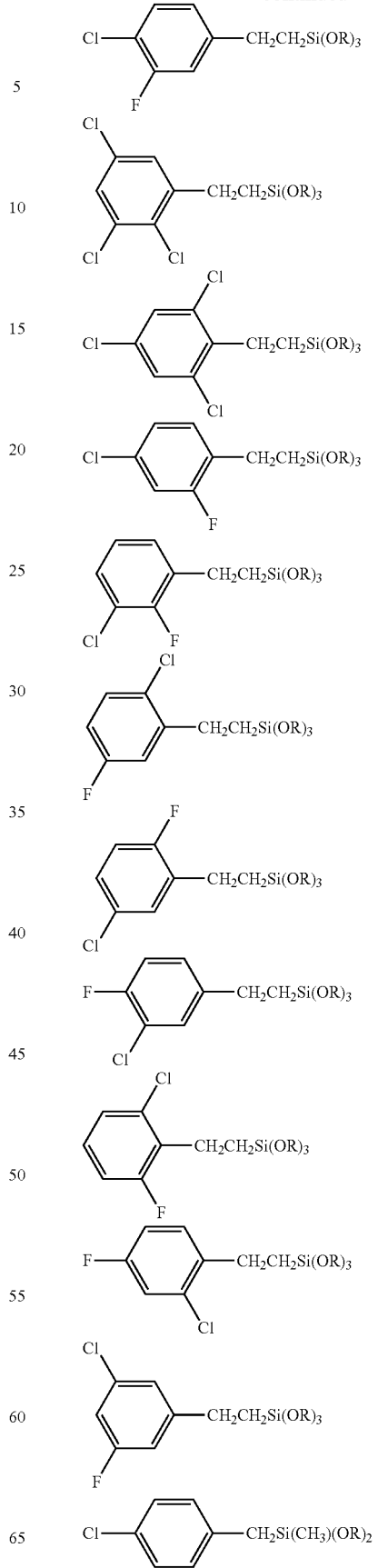

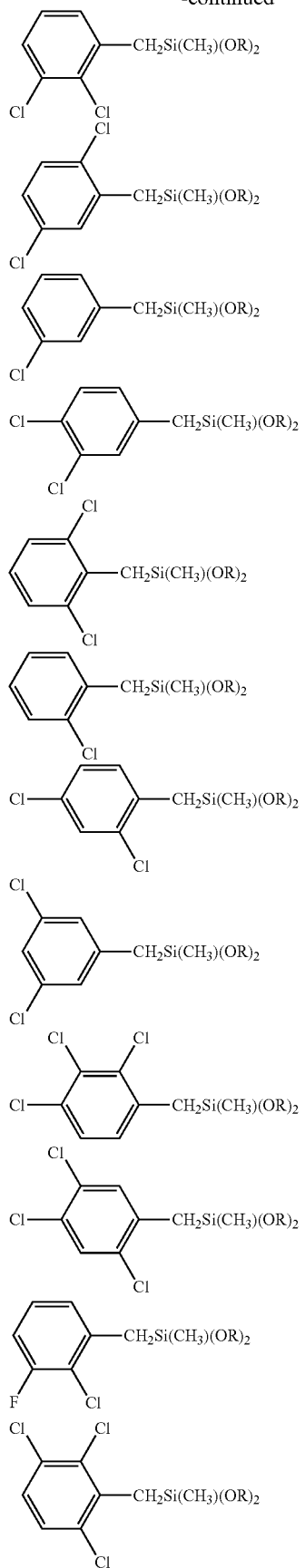
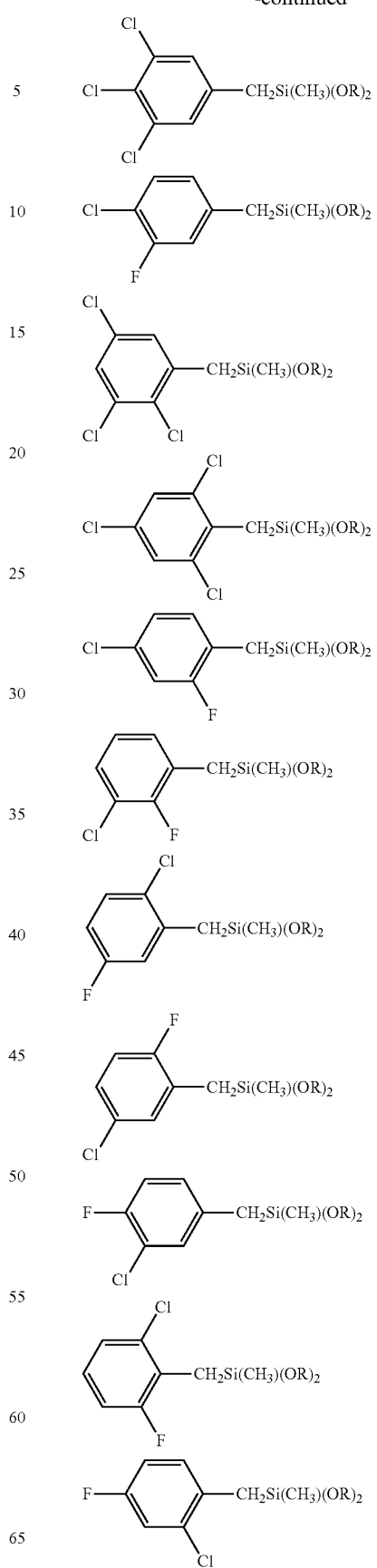

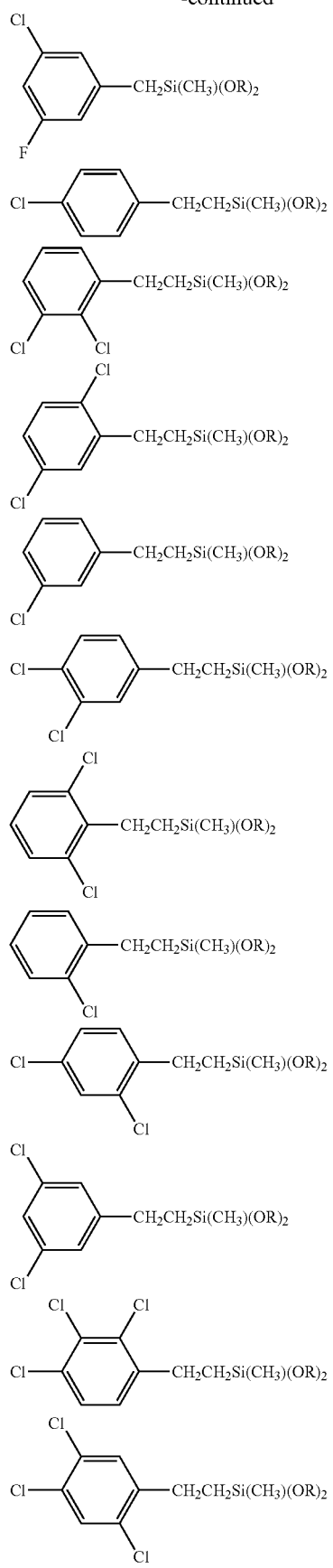
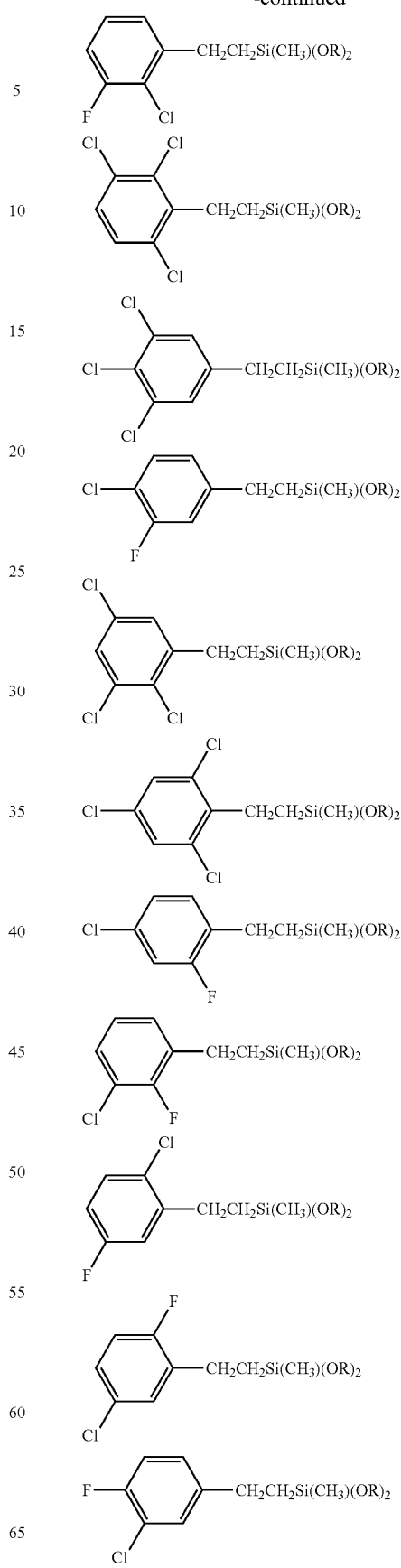

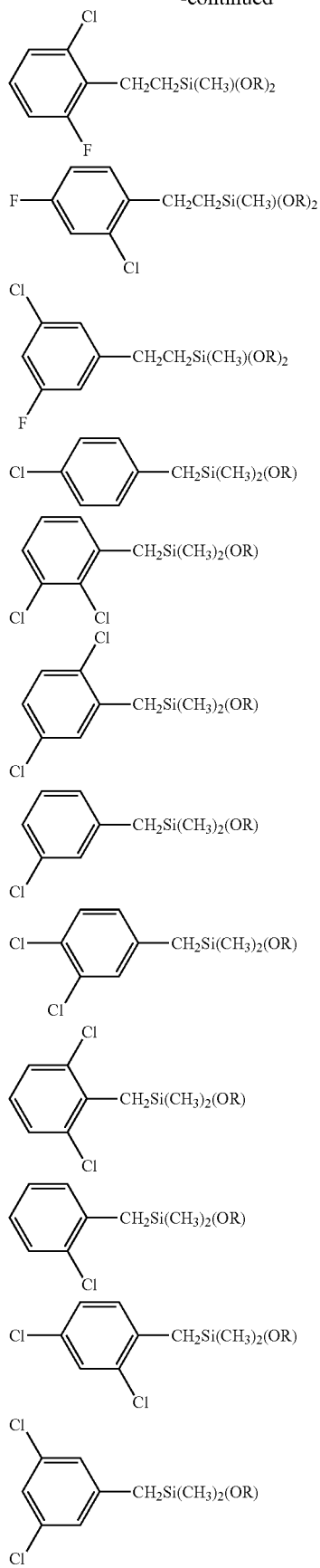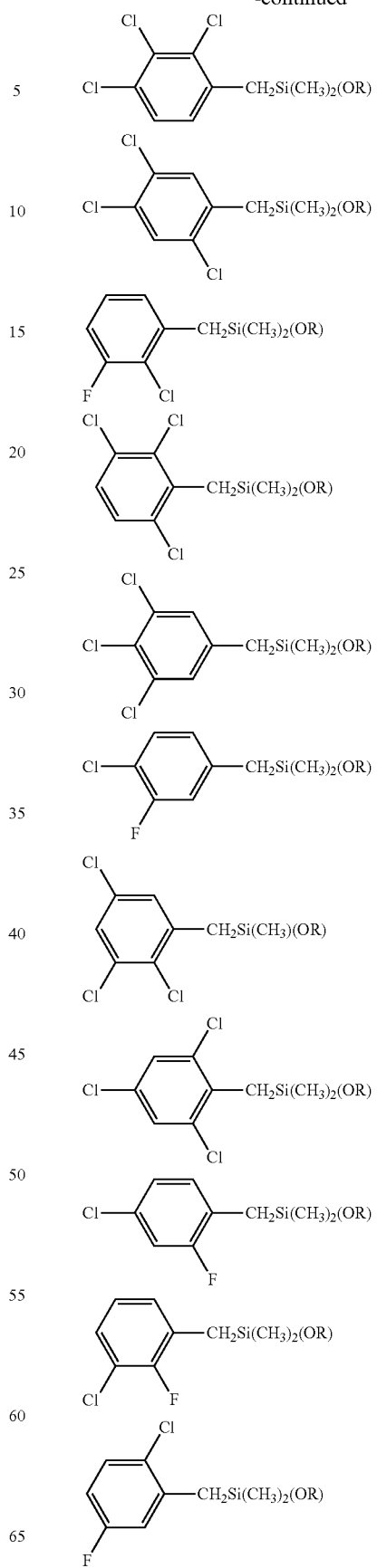

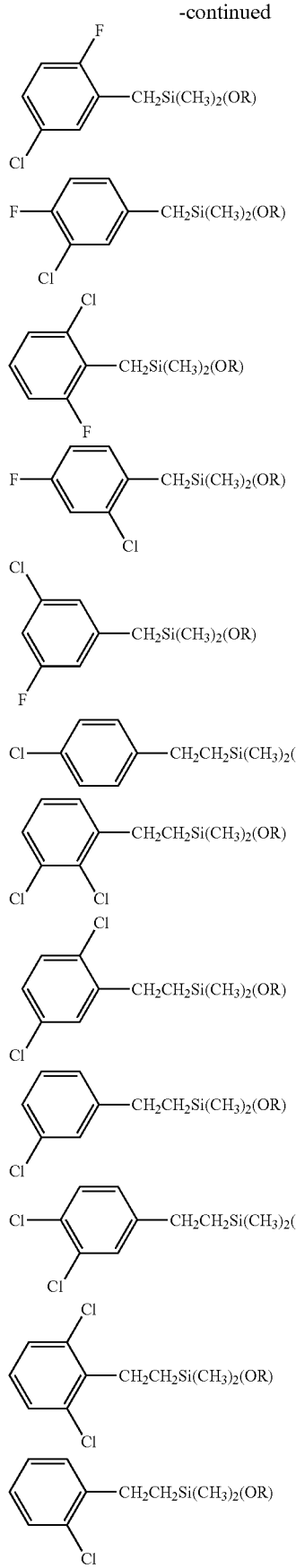
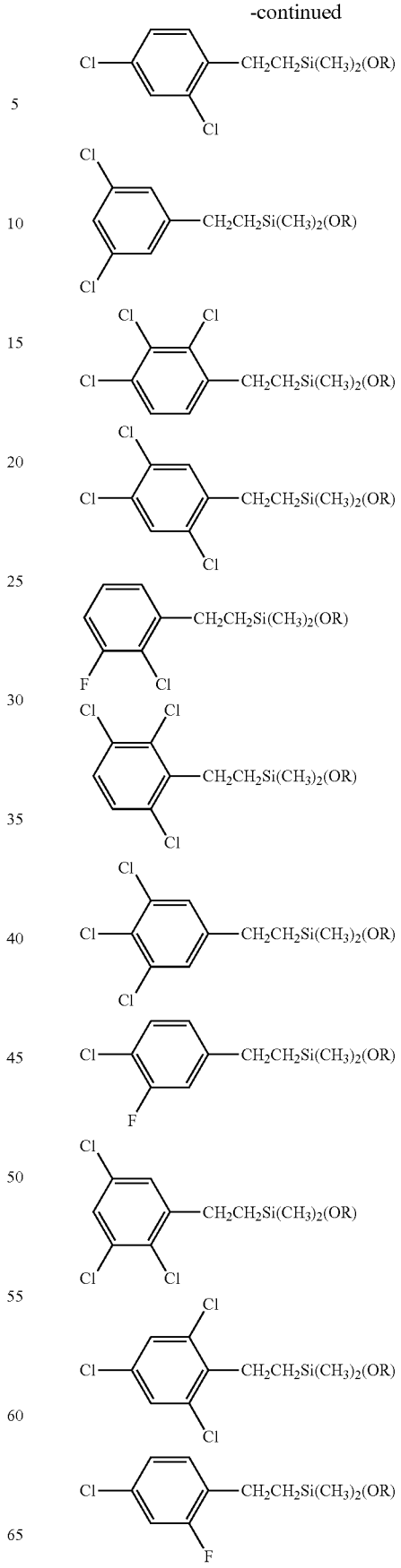

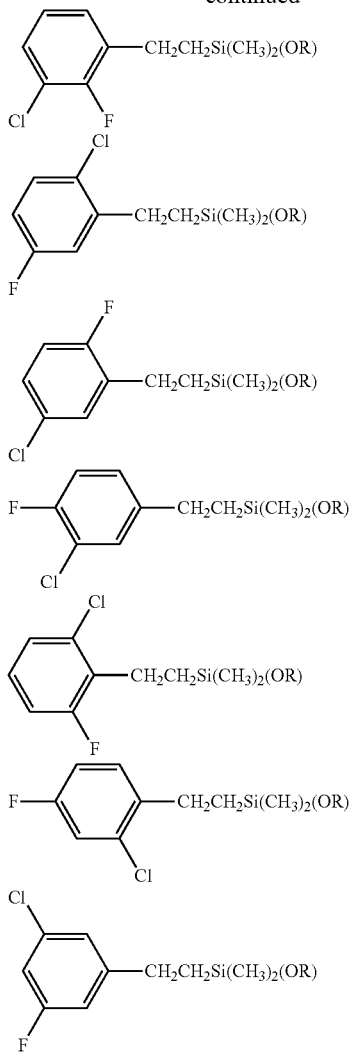

Thus, by introducing an organic group(s) substituted by a halogen atom(s), peeling property of the BPSG film in the wet etching process can be improved.

The silicon compound which can be used as Component (A) may be mentioned a material represented by the following general formula (A-1-4), $$Si(OR)_4 \qquad (A\text{-}1\text{-}4)$$

wherein, R represents a hydrocarbon group having 1 to 6 carbon atoms.

Preferable examples of the silicon compound represented by the above general formula (A-1-4) include tetramethoxy silane, tetraethoxy silane, tetrapropoxy silane, tetraisopropoxy silane, etc.

Especially preferable examples of the silicon compound represented by the above general formulae (A-1-1) to (A-1-4) include tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenethyl trimethoxy silane, phenethyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, dipropyl dimethoxy silane, dibutyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, dimethyl phenethyl methoxy silane, etc.

Other example of the organic groups represented by the above $R^1$, $R^2$, $R^3$, $R^4$, $R^5$ and $R^6$ includes an organic group having one or more of a carbon-oxygen single bond or a carbon-oxygen double bond. Specifically, an organic group having one or more of a group selected from the group consisting of an epoxy group, an ester group, an alkoxyl group, and a hydroxyl group may be mentioned. As specific example of this organic group, an organic group shown by the following general formula (4) can be mentioned.

$$\{U\text{-}Q_1\text{-}(S_1)_{v1}\text{-}Q_2\text{-}\}_u\text{-}(T)_{v2}\text{-}Q_3\text{-}(S_2)_{v3}\text{-}Q_4\text{-} \qquad (4)$$

wherein, U represents a hydrogen atom, a hydroxyl group,

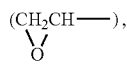

an alkoxyl group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represent —$C_qH_{(2q-p)}U_p$—, wherein U has the same meaning as defined above, p represents an integer of 0 to 3, q represents an integer of 0 to 10 (however, q=0 means a single bond); u represents an integer of 0 to 3; each of $S_1$ and $S_2$ independently represent —O—, —CO—, —OCO—, —COO—, or —OCOO—. Each of v1, v2, and v3 independently represent 0 or 1. Concurrently with the above, T represents divalent group comprising an alicycle or an aromatic ring optionally containing a heteroatom, and specific examples of the alicycle or the aromatic ring T optionally containing a heteroatom such as an oxygen atom include those shown below. In T, a bonding site between $Q_2$ and $Q_3$ is not particularly restricted; and the site is appropriately selected by considering reactivity due to steric factors, availability of commercially reagents, and so on.

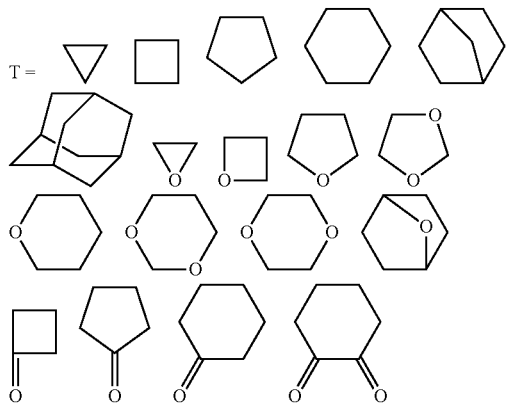

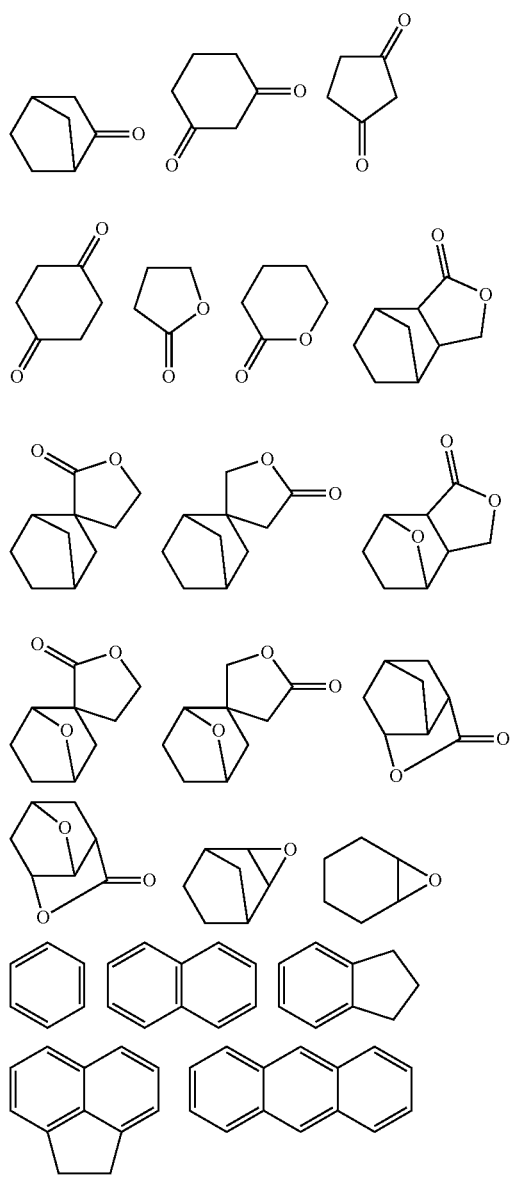
Preferable examples of the organic group having one or more of a carbon-oxygen single bond or a carbon-oxygen double bond in the above general formula (4) include those shown below. Meanwhile, in the following formulae, (Si) is described to show the bonding sites to the Si.
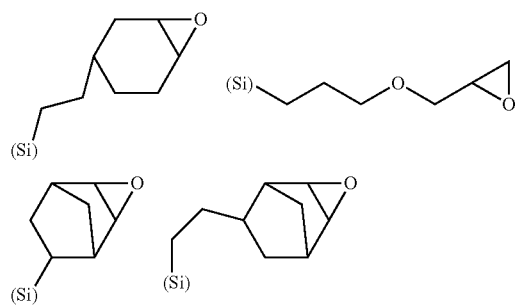
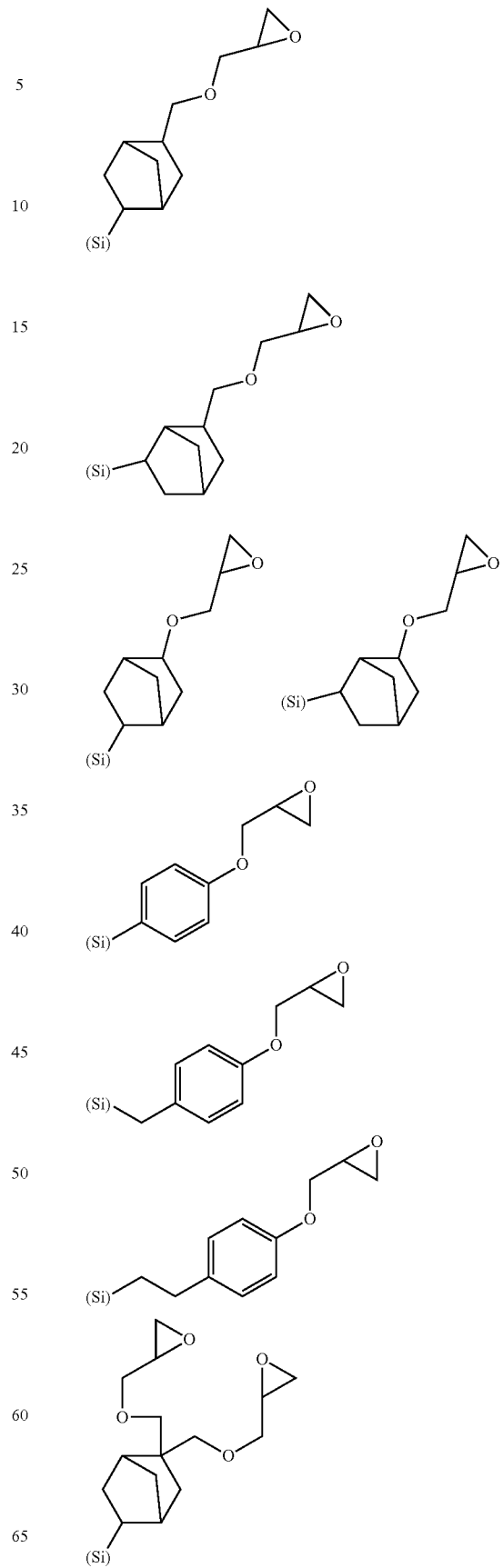

45
-continued
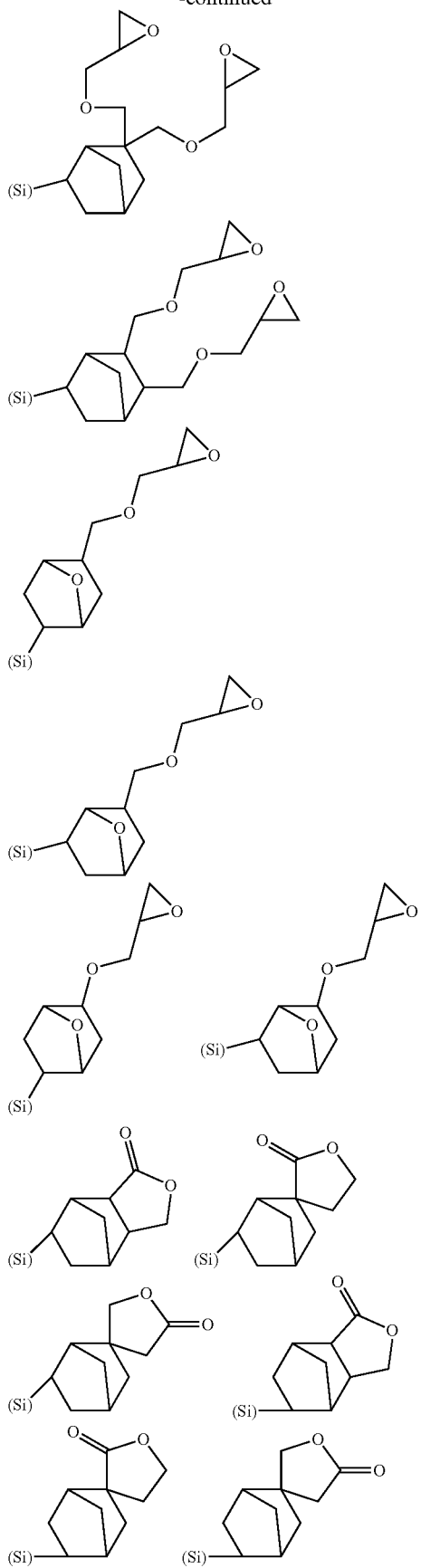
46
-continued
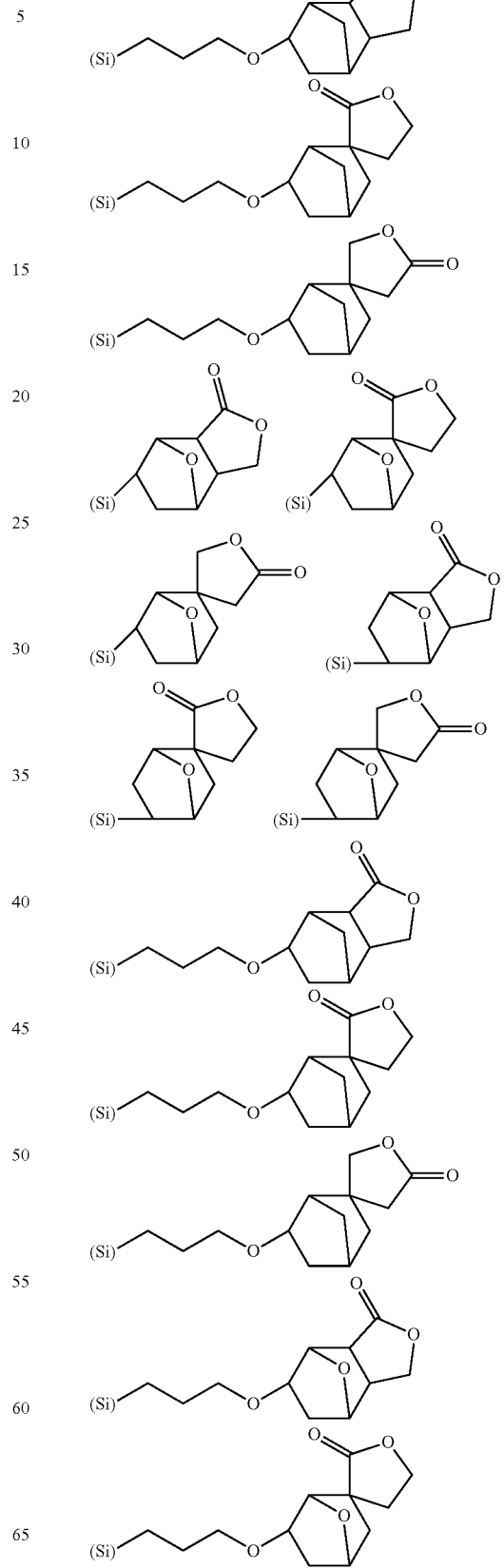

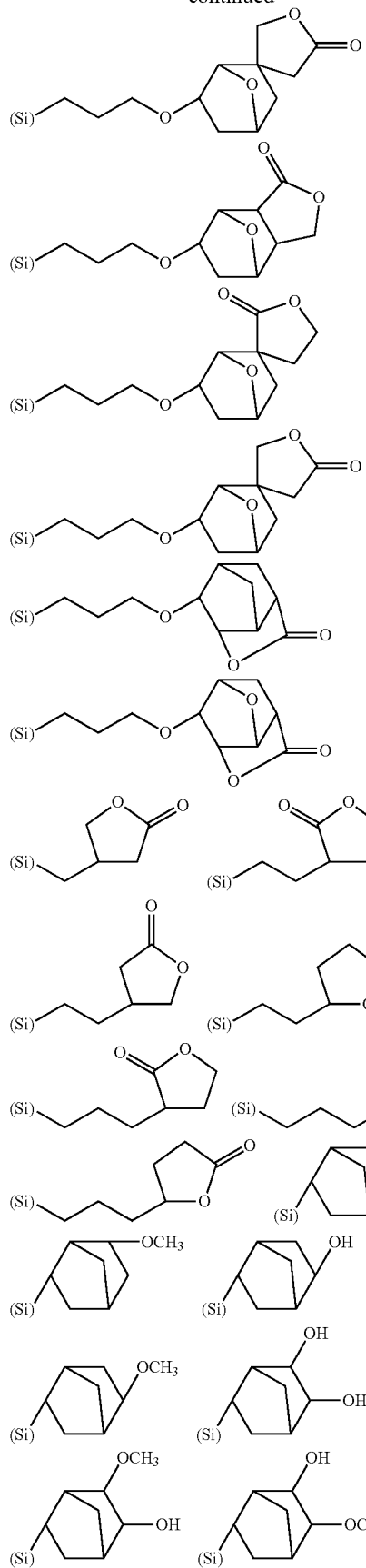
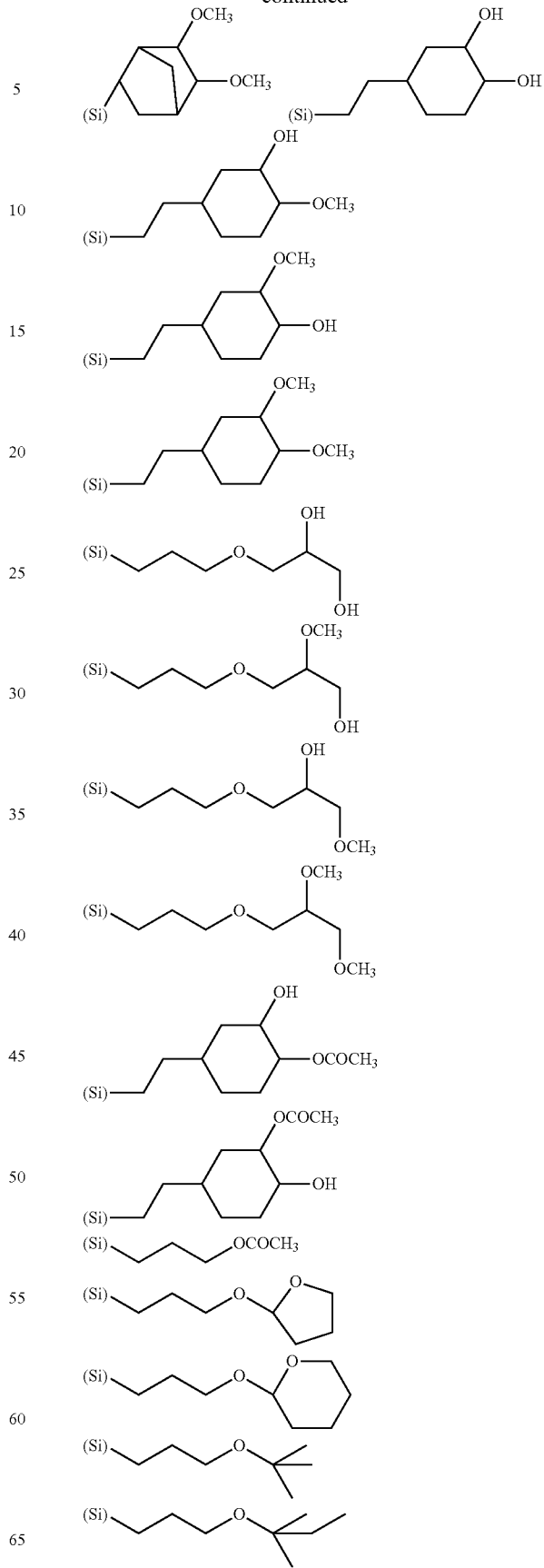

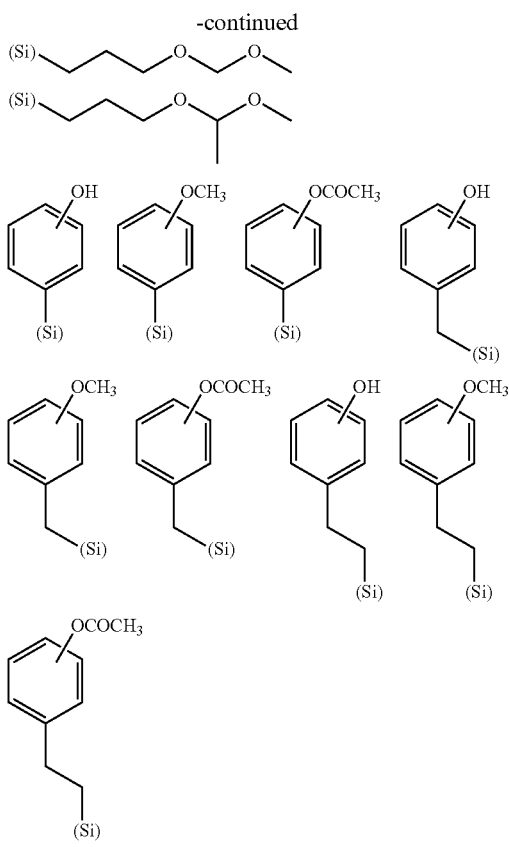

Further, as the organic groups shown by $R^1$, $R^2$, $R^3$, $R^4$, $R^5$ and $R^6$, an organic group having a Si—Si bond can be used. Groups shown below are the specific examples thereof.

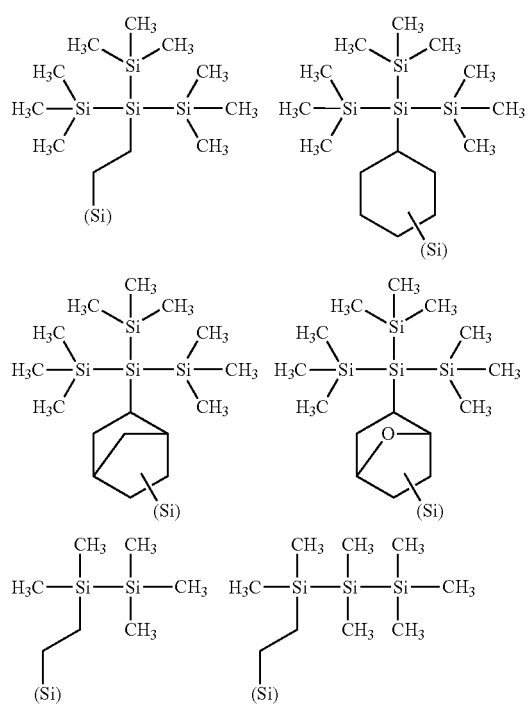

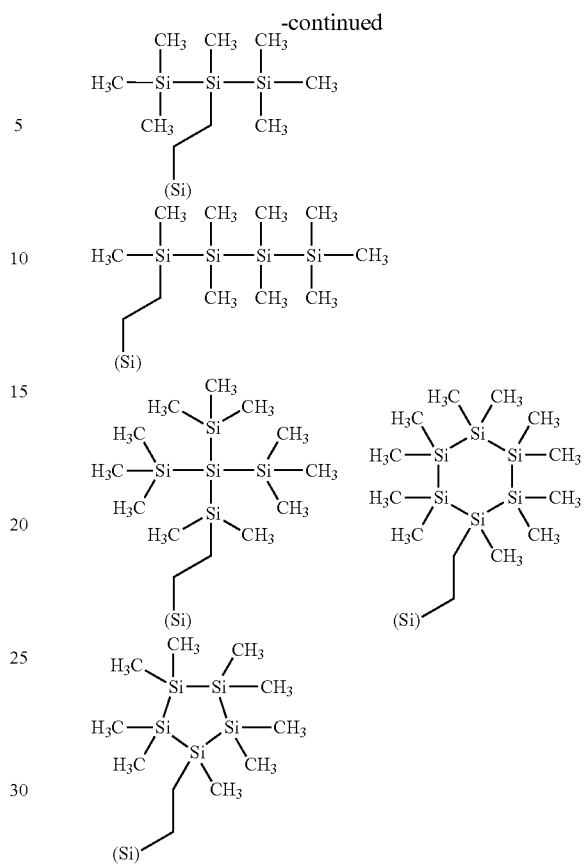

[Phosphorus Compound]

The phosphorus compound which can be used as Component (A) may be mentioned a material represented by the following general formula (A-2-1), $$PX_3 \qquad \text{(A-2-1)}$$

wherein, X represents a halogen atom, a hydroxyl group or an alkoxy group having 1 to 6 carbon atoms.

Preferable examples of the phosphorus compound represented by the above general formula (A-2-1) include phosphorus trichloride, phosphorus tribromide, phosphorus acid, trimethyl phosphite, triethyl phosphite, tripropyl phosphite, etc.

The phosphorus compound which can be used as Component (A) may be mentioned a material represented by the following general formula (A-2-2), $$POX_3 \qquad \text{(A-2-2)}$$

wherein, X represents a halogen atom, a hydroxyl group or an alkoxy group having 1 to 6 carbon atoms.

Preferable examples of the phosphorus compound represented by the above general formula (A-2-2) include phosphorus oxytrichloride, phosphorus oxytribromide, phosphoric acid, trimethyl phosphate, triethyl phosphate, tripropyl phosphate, etc.

The phosphorus compound which can be used as Component (A) may be mentioned a material represented by the following general formulae (A-2-3) and (A-2-4), $$P_2O_5 \qquad \text{(A-2-3)}$$

$$H(HPO_3)_a OH \qquad \text{(A-2-4)}$$

wherein, "a" is an integer of 1 or more.

Diphosphorus pentaoxide represented by the above general formula (A-2-3), and a polyphosphoric acid represented by the above general formula (A-2-4) or a polyphosphate, etc., may be used as the phosphorus compound.

The phosphorus compound which can be used as Component (A) may be mentioned a material represented by the following general formula (A-2-5), $$R^7PX_2 \qquad (A\text{-}2\text{-}5)$$

wherein, $R^7$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the phosphorus compound represented by the above general formula (A-2-5) include $CH_3PCl_2$, $C_2H_5PCl_2$, $CH_3OPCl_2$, etc.

The phosphorus compound which can be used as Component (A) may be mentioned a material represented by the following general formula (A-2-6), $$R^7POX_2 \qquad (A\text{-}2\text{-}6)$$

wherein, $R^7$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the phosphorus compound represented by the above general formula (A-2-6) include $HPO(OCH_3)_2$, $HPO(OC_2H_5)_2$, $CH_3PO(OH)_2$, $CH_3PO(OCH_3)_2$, $CH_3POCl_2$, $C_6H_5PO(OH)_2$, $C_6H_5POCl_2$, $C_6H_5CH_2PO(OC_2H_5)_2$, etc.

[Boron Compound]

The boron compound which can be used as Component (A) may be mentioned a material represented by the following general formula (A-3-1), $$BX_3 \qquad (A\text{-}3\text{-}1)$$

wherein, X represents a halogen atom, a hydroxyl group or an alkoxy group having 1 to 6 carbon atoms.

Preferable examples of the boron compound represented by the above general formula (A-3-1) include boron trifluoride, boron trichloride, boric acid, trimethyl borate, triethyl borate, tripropyl borate, tributyl borate, triamyl borate, trihexyl borate, tricyclopentyl borate, tricyclohexyl borate, triallyl borate, triphenyl borate, ethyldimethyl borate, etc.

The boron compound which can be used as Component (A) may be mentioned a material represented by the following general formula (A-3-2), $$B_2O_3 \qquad (A\text{-}3\text{-}2)$$

Boron oxide represented by the above general formula (A-3-2) may be used as the boron compound.

The boron compound which can be used as Component (A) may be mentioned a material represented by the following general formula (A-3-3), $$R^8BX_2 \qquad (A\text{-}3\text{-}3)$$

wherein, $R^8$ represents a hydrogen atom or an organic group having 1 to 30 carbon atoms, wherein a hydrogen atom(s) in the organic group may be substituted by a halogen atom(s); X represents a halogen atom, a hydroxyl group or an alkoxy group having 1 to 6 carbon atoms.

Preferable examples of the boron compound represented by the above general formula (A-3-3) include $C_6H_5B(OH)_2$, $CH_3B(OC_3H_7)_2$, $CH_3B(OH)_2$, $C_6H_{11}B(OH)_2$, etc.

A mixture (monomer) containing one or more silicon compounds mentioned above, and either one of or both of one or more phosphorus compounds mentioned above and one or more boron compounds mentioned above is subjected to hydrolysis, condensation, or hydrolysis condensation, whereby a silicon-containing compound (polymer) which becomes a material for the composition for forming a coating type BPSG film can be synthesized.

The above-mentioned hydrolysis, condensation, or hydrolysis condensation reaction can be carried out by using one or more kinds of compounds selected from inorganic acid, aliphatic sulfonic acid, and aromatic sulfonic acid as acid catalyst.

Specific examples of the acid catalyst used include fluorinated acid, hydrochloric acid, hydrobromic acid, sulfuric acid, nitric acid, perchloric acid, phosphoric acid, methanesulfonic acid, benzenesulfonic acid, toluenesulfonic acid, etc. The catalyst is preferably used in the range of $1\times10^{-6}$ to 10 moles, more preferably $1\times10^{-5}$ to 5 moles, and much more preferably $1\times10^{-4}$ to 1 mole, relative to 1 mole of monomers.

The amount of water for obtaining a polymer from these monomers is preferably added in the range of 0.01 to 100 moles, more preferably 0.05 to 50 moles, and much more preferably 0.1 to 30 moles, relative to 1 mole of a hydrolysable substituent group bonded to monomers. If the amount is 100 moles or less, a reaction device does not become excessively large, therefore it is economical.

In operation, monomers are added to a catalyst aqueous solution to start hydrolysis condensation reaction. Organic solvent may be added to the catalyst aqueous solution, and monomers may be diluted with the organic solvent, or both may be performed. The reaction temperature is preferably in the range of 0 to 100° C., and more preferably 5 to 80° C. A method in which the reaction temperature is maintained in the range of 5 to 80° C. when monomers are dropped, and then the mixture is aged in the range of 20 to 80° C., is preferable.

Preferable examples of the organic solvent that can be added to a catalyst aqueous solution or can dilute monomers include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone and mixture thereof.

Among them, water-soluble solvent is preferable, and specific examples thereof include alcohol such as methanol, ethanol, 1-propanol, and 2-propanol; polyvalent alcohol such as ethylene glycol and propylene glycol; polyvalent alcohol condensate derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; tetrahydrofuran, etc. Particularly preferable is solvent with a boiling point of 100° C. or less.

The amount of the organic solvent used is preferably in the range of 0 to 1,000 ml, and particularly preferably 0 to 500 ml, relative to 1 mole of monomers. If the amount of the organic solvent is 1,000 ml or less, a reaction vessel does not become excessively large, therefore it is economical.

Then, if necessary, neutralization reaction of the catalyst is carried out and alcohol produced by hydrolysis condensation reaction is removed under reduced pressure to obtain a reaction mixture aqueous solution. The amount of an alkaline substance to be used for neutralization is preferably 0.1 to 2 equivalent weight, relative to acid used as the catalyst. The alkaline substance may be any substance so long as if shows alkalinity in water.

Subsequently, it is preferable that a by-product such as alcohol produced by hydrolysis condensation reaction be removed from the reaction mixture. The temperature for heating the reaction mixture is preferably in the range of 0 to 100° C., more preferably 10 to 90° C., and much more preferably 15 to 80° C., though it is depending on the kind of the organic solvent added and the alcohol produced by reaction. Degree of vacuum is preferably an atmospheric pressure or less, more preferably 80 kPa or less in the absolute pressure, and much more preferably 50 kPa or less in the absolute pressure, though it is depending on the kinds of the organic solvent and the alcohol to be removed, of an exhausting equipment, and of a condensation equipment, as well as heating temperature. Although it is difficult to know exactly an amount of the alcohol removed, it is preferable that about 80% or more by mass of a produced alcohol and so forth be removed.

Next, the acid catalyst used in hydrolysis condensation reaction may be removed from the reaction mixture. A method for removing acid catalyst is to mix water and the polymer, and extract the polymer with organic solvent. As the organic solvent used, the one that can dissolve the polymer and achieve two-layer separation by mixing with water is preferable. Specific examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, etc., and mixture thereof.

Moreover, mixture of water-soluble organic solvent and slightly water-soluble organic solvent can be used. Preferable examples thereof include methanol+ethyl acetate mixture, ethanol+ethyl acetate mixture, 1-propanol+ethyl acetate mixture, 2-propanol+ethyl acetate mixture, butanediol monomethyl ether+ethyl acetate mixture, propylene glycol monomethyl ether+ethyl acetate mixture, ethylene glycol monomethyl ether+ethyl acetate mixture, butanediol monoethyl ether+ethyl acetate mixture, propylene glycol monoethyl ether+ethyl acetate mixture, ethylene glycol monoethyl ether+ethyl acetate mixture, butanediol monopropyl ether+ethyl acetate mixture, propylene glycol monopropyl ether+ethyl acetate mixture, ethylene glycol monopropyl ether+ethyl acetate mixture, methanol+methyl isobutyl ketone mixture, ethanol+methyl isobutyl ketone mixture, 1-propanol+methyl isobutyl ketone mixture, 2-propanol+methyl isobutyl ketone mixture, propylene glycol monomethyl ether+methyl isobutyl ketone mixture, ethylene glycol monomethyl ether+methyl isobutyl ketone mixture, propylene glycol monoethyl ether+methyl isobutyl ketone mixture, ethylene glycol monoethyl ether+methyl isobutyl ketone mixture, propylene glycol monopropyl ether+methyl isobutyl ketone mixture, ethylene glycol monopropyl ether+methyl isobutyl ketone mixture, methanol+cyclopentyl methyl ether mixture, ethanol+cyclopentyl methyl ether mixture, 1-propanol+cyclopentyl methyl ether mixture, 2-propanol+cyclopentyl methyl ether mixture, propylene glycol monomethyl ether+cyclopentyl methyl ether mixture, ethylene glycol monomethyl ether+cyclopentyl methyl ether mixture, propylene glycol monoethyl ether+cyclopentyl methyl ether mixture, ethylene glycol monoethyl ether+cyclopentyl methyl ether mixture, propylene glycol monopropyl ether+cyclopentyl methyl ether mixture, ethylene glycol monopropyl ether+cyclopentyl methyl ether mixture, methanol+propylene glycol methyl ether acetate mixture, ethanol+propylene glycol methyl ether acetate mixture, 1-propanol+propylene glycol methyl ether acetate mixture, 2-propanol+propylene glycol methyl ether acetate mixture, propylene glycol monomethyl ether+propylene glycol methyl ether acetate mixture, ethylene glycol monomethyl ether+propylene glycol methyl ether acetate mixture, propylene glycol monoethyl ether+propylene glycol methyl ether acetate mixture, ethylene glycol monoethyl ether+propylene glycol methyl ether acetate mixture, propylene glycol monopropyl ether+propylene glycol methyl ether acetate mixture, and ethylene glycol monopropyl ether+propylene glycol methyl ether acetate mixture, etc., but are not restricted to combination of these mixtures.

The mixing ratio of the water-soluble organic solvent and the slightly water-soluble organic solvent is determined accordingly. The water-soluble organic solvent is preferably 0.1 to 1,000 parts by mass, more preferably 1 to 500 parts by mass, and much more preferably 2 to 100 parts by mass, relative to 100 parts by mass of the slightly water-soluble organic solvent.

Subsequently, the reaction mixture may be washed with neutral water. As the water, water called deionized water or ultrapure water may be used. The amount of the water is preferably 0.01 to 100 L, more preferably 0.05 to 50 L, and much more preferably 0.1 to 5 L, relative to 1 L of the polymer solution. The method for cleaning is to charge both the reaction mixture and water into the same container, agitate them and then settled to separate a water layer. Number of washing may be 1 time or more, though the range of about 1 to about 5 times is preferable, because washing of 10 times or more is not worth to have full effects thereof.

In this operation of water-washing, number of washing and amount of water for washing may be determined arbitrarily in view of effects of catalyst removal and fractionation because there is a case that a part of the polymer escapes into a water layer, thereby substantially the same effect as fractionation operation is obtained.

Other methods for removing acid catalyst include a method by ion-exchange resin, and a method for removing acid catalyst after neutralization with an epoxy compound such as ethylene oxide and propylene oxide. These methods can be selected arbitrarily according to the acid catalyst used in the reaction.

To any of the polymer solution which the acid catalyst remained therein and which the acid catalyst removed therefrom is added a final solvent, and then, the solvents therein are exchanged under reduced pressure to obtain a polymer solution. Temperature at the time of this solvent exchange operation is preferably in the range of 0 to 100° C., more preferably in the range of 10 to 90° C., or much more preferably in the range of 15 to 80° C., though it is depending on the kinds of the reaction solvent and of the extraction solvent to be removed. Degree of the vacuum in this operation is preferably an atmospheric pressure or less, more preferably 80 kPa or less in the absolute pressure, or much more preferably 50 kPa or less in the absolute pressure, though it is depending on the kinds of the extraction solvent to be removed, of an exhausting equipment, and of a condensation equipment, as well as heating temperature.

In this operation, sometimes the polymer may become unstable because of change of the solvent. This occurs due to compatibility of the polymer with the final solvent; and thus, in order to prevent this from occurring, a monovalent, divalent, or more polyvalent alcohol or ether compound having cyclic ether as a substituent may be added thereto as a stabilizer. Adding amount thereof is preferably in the range of 0 to 25 parts by mass, more preferably in the range of 0 to 15 parts by mass, or much more preferably in the range of 0 to 5 parts by mass, or 0.5 parts or more by mass when it is added, relative to 100 parts by mass of the polymer contained in the solution before the solvent exchange. If necessary, a stabilizer may be added into the solution before the solvent exchange operation.

The concentration of the polymer is preferably in the range of 0.1 to 20% by mass. If the concentration is in such a range, a condensation reaction of the polymer does not occur; thereby the polymer does not change to the state that it cannot be dissolved into an organic solvent again. Further, when the concentration is in such a range, amount of the solvent becomes appropriate, therefore it is economical.

Preferable examples of the final solvent added to the polymer include alcohol solvent, and particularly monoalkyl ether derivatives such as ethylene glycol, diethylene glycol, triethylene glycol, propylene glycol, dipropylene glycol, butanediol, etc. Preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, etc.

In addition, if these solvents are a main solvent, a non-alcoholic solvent may be added thereinto as an adjuvant solvent. Specific examples of this adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxy propionate, ethyl 3-ethoxy propionate, t-butyl acetate, t-butyl propionate, propylene glycol mono-t-butyl ether acetate, γ-butyrolactone, methyl isobutyl ketone, cyclopentyl methyl ether, etc.

In another operation, water or water-containing organic solvent is added to monomers or an organic solution of monomers to start hydrolysis reaction. The acid catalyst may be added to monomers or an organic solution of monomers, or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

As the organic solvent, water-soluble solvent is preferable, and specific examples thereof include polyvalent alcohol condensate derivatives such as methanol, ethanol, 1-propanol, 2-propanol, 1-butanol, 2-butanol, 2-methyl-1-propanol, acetone, tetrahydrofuran, acetonitrile, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, propylene glycol monopropyl ether, etc., and a mixture thereof.

The amount of the organic solvent used may be the same amount as before. A reaction mixture obtained is post-treated like the above-mentioned method to obtain a polymer.

The hydrolysis, condensation, or hydrolysis condensation for synthesizing the polymer can be carried out by using a base catalyst. Specific examples of the base catalyst used include methylamine, ethylamine, propylamine, butylamine, ethylenediamine, hexamethylene diamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclo cyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. The amount of the catalyst used may be the same amount as the above-mentioned acid catalyst.

The amount of water for obtaining a polymer from these monomers is preferably added in the range of 0.1 to 50 moles, relative to 1 mole of a hydrolysable substituent group bonded to a monomer. If the amount is 50 moles or less, a reaction device does not become excessively large, therefore it is economical.

The operation method of the reaction may be the same method as that of using the above-mentioned acid catalyst.

The organic solvent which can be added to the catalyst aqueous solution, or can dilute the monomer may be preferably used the same materials as that of using the above-mentioned acid catalyst. Meanwhile, an amount of the organic solvent to be used is preferably 0 to 1,000 ml, relative to 1 mole of the monomer. By using such an amount, the reaction vessel does not become excessively large, therefore it is economical.

Thereafter, if necessary, neutralization reaction of the catalyst is carried out, and alcohol produced by the hydrolysis condensation reaction is removed under reduced pressure to obtain a reaction mixture aqueous solution. The amount of an acid substance to be used for neutralization is preferably 0.1 to 2 equivalent weight, relative to basic substance used as the catalyst. The acid substance may be any substance so long as it shows acidity in water.

Subsequently, by-products such as an alcohol, etc., produced by the hydrolysis condensation reaction are preferably removed from the reaction mixture. At this time, the temperature for heating the reaction mixture and degree of vacuum may be the same temperature and degree of vacuum as those of using the above-mentioned acid catalyst.

Next, the base catalyst used for the hydrolysis condensation may be removed from the reaction mixture. The organic solvent to be used at the time of removing the base catalyst may be the same materials as that of using the above-mentioned acid catalyst.

Also, the base catalyst can be removed by using the same mixture of the water-soluble organic solvent and the slightly water-soluble organic solvent as that of using the above-mentioned acid catalyst. Meanwhile, the mixing ratio of the water-soluble organic solvent and the slightly water-soluble organic solvent may be the same ratio as that of using the above-mentioned acid catalyst.

Subsequently, the reaction mixture may be washed with neutral water. The washing method may be the same method as that of using the above-mentioned acid catalyst.

A final solvent is added to the washed polymer, and solvent exchange operation is carried out under reduced pressure to obtain a polymer solution. Temperature and degree of vacuum of the solvent exchange operation may be the same temperature and degree of vacuum as those of using the above-mentioned acid catalyst.

Also, at this time, a monovalent, divalent, or more polyvalent alcohol or ether compound having cyclic ether as a substituent may be added as a stabilizer similarly to the case where the above-mentioned acid catalyst is used. Further, the polymer solution is preferably made with a 0.1 to 20% by mass concentration.

Preferable examples of the final solvent added to the polymer include alcohol solvent, and particularly monoalkyl ether such as ethylene glycol, diethylene glycol, triethylene glycol, propylene glycol, dipropylene glycol, etc. Preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, etc.

In addition, if these solvents are a main solvent, a non-alcoholic solvent may be added thereinto as an adjuvant solvent. As the adjuvant solvent, the same solvent as in the case of using the above-mentioned acid catalyst may be used.

In another operation, water or water-containing organic solvent is added to monomers or an organic solution of monomers to start hydrolysis reaction. The base catalyst may be added to monomers or an organic solution of monomers, or added to water or water-containing organic solvent. The reaction temperature is preferably in the range of 0 to 100° C., and more preferably 10 to 80° C. A method for heating a mixture at 10 to 50° C. when water is dropped and then heating the mixture at 20 to 80° C. to age the mixture is preferable.

As the organic solvent, water-soluble solvent is preferable, and specific examples thereof include polyvalent alcohol condensate derivatives such as methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, propylene glycol monopropyl ether, etc., and a mixture thereof.

The amount of the organic solvent used may be the same amount as before. A reaction mixture obtained is post-treated like the above-mentioned method to obtain a polymer.

The molecular weight of the polymer obtained can be adjusted not only by selecting monomers, but also controlling reaction conditions during polymerization. The molecular weight of the polymer obtained is not particularly restricted, but preferably is 100,000 or less, more preferably 200 to 50,000, and much more preferably 300 to 30,000. If the average molecular weight is 100,000 or less, generation of foreign matters and coating spots can be suppressed. Meanwhile, the above average molecular weight is obtained as data, in terms of polystyrene as a reference material, by means of gel-permeation chromatography (GPC) by using RI as a detector and tetrahydrofuran as an eluent.

[Component (B)]

The composition for forming a coating type BPSG film of the present invention may preferably further contain, in addition to the above-mentioned Component (A), as Component (B), one or more selected from one or more silicon compounds represented by the following general formula (B-1), a hydrolysate, a condensate and a hydrolysis condensate thereof, $$R^{1B}{}_{b1}R^{2B}{}_{b2}R^{3B}{}_{b3}Si(OR^{0B})_{(4-b1-b2-b3)} \quad (B-1)$$

wherein, $R^{0B}$ represents a hydrocarbon group having 1 to 6 carbon atoms; $R^{1B}$, $R^{2B}$ and $R^{3B}$ each represent a hydrogen atom or an organic group having 1 to 30 carbon atoms; and b1, b2 and b3 are each 0 or 1, and satisfy $1 \le b1+b2+b3 \le 3$.

The silicon compound represented by the general formula (B-1) may be mentioned the same materials as those of the specific examples of the silicon compounds represented by the general formulae (A-1-1) to (A-1-3) among the above-mentioned Component (A).

Also, it is preferable that one or more of $R^{1B}$, $R^{2B}$ and $R^{3B}$ in the general formula (B-1) is/are an organic group(s) having a hydroxyl group or a carboxyl group each substituted by an acid-labile group.

As such a compound represented by the general formula (B-1), those in which two or three methoxy groups, ethoxy groups, propoxy groups or butoxy groups are contained on the silicon represented by the following structure as hydrolysable groups, may be used. Meanwhile, in the following structural formulae, (Si) is described to show the bonding sites to the Si.

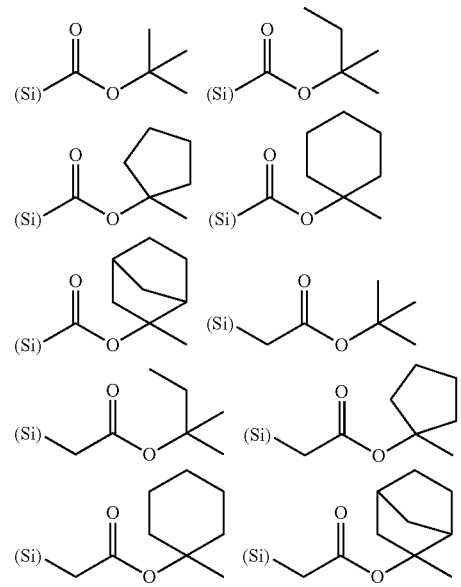

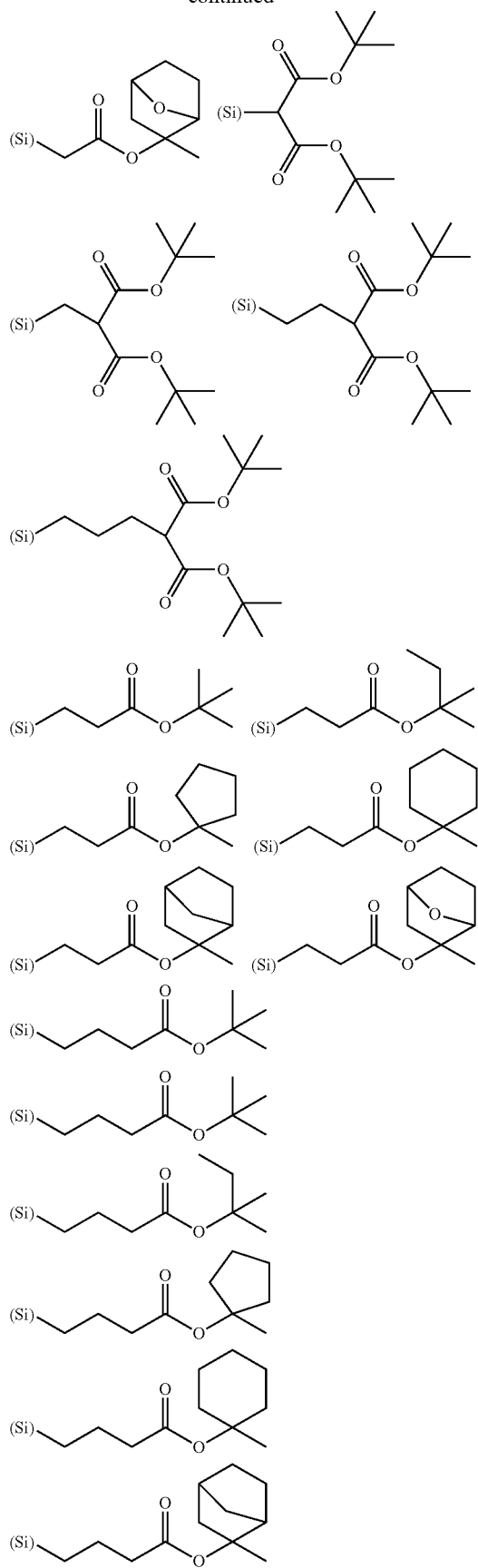
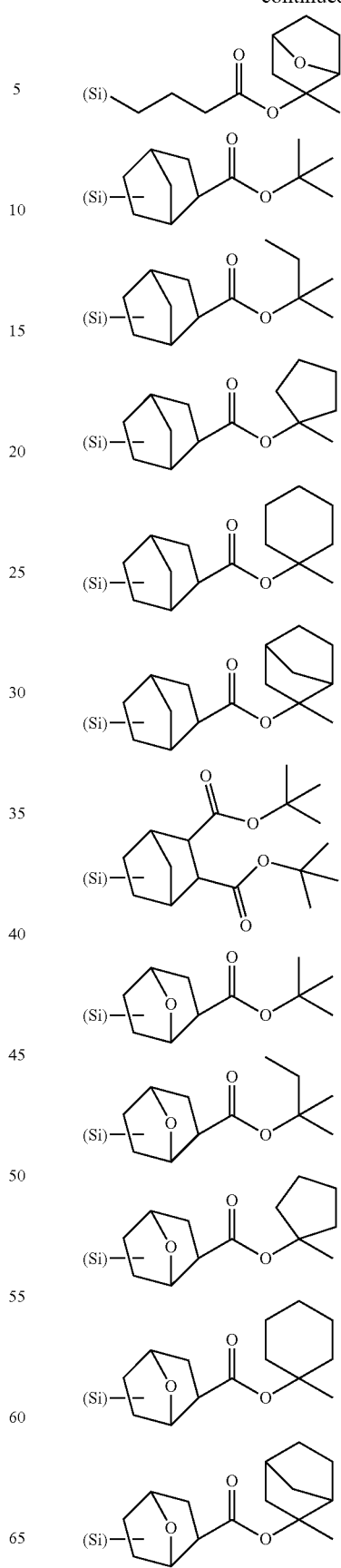

-continued
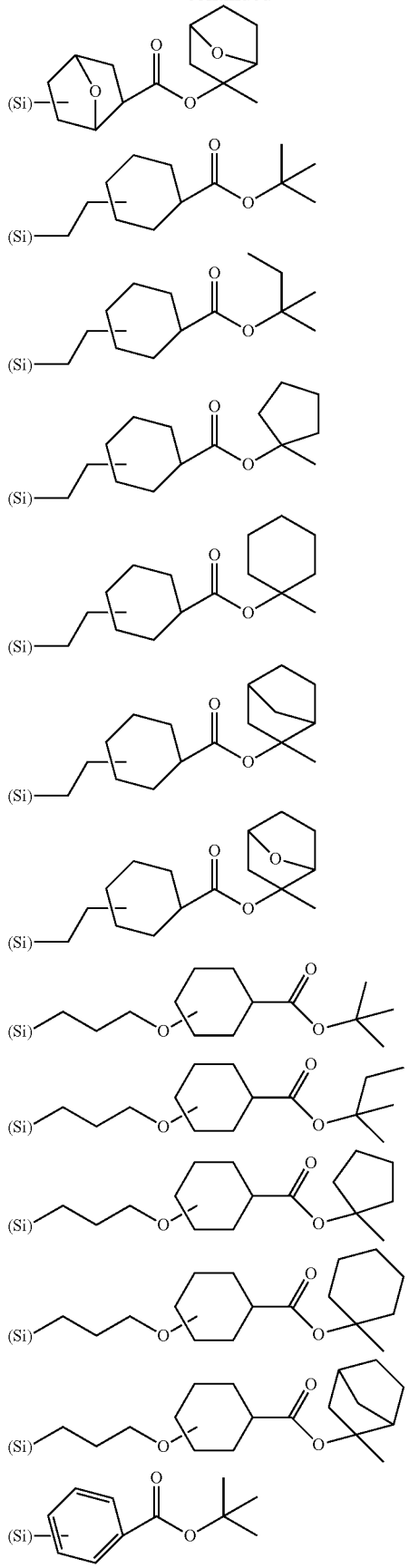
-continued
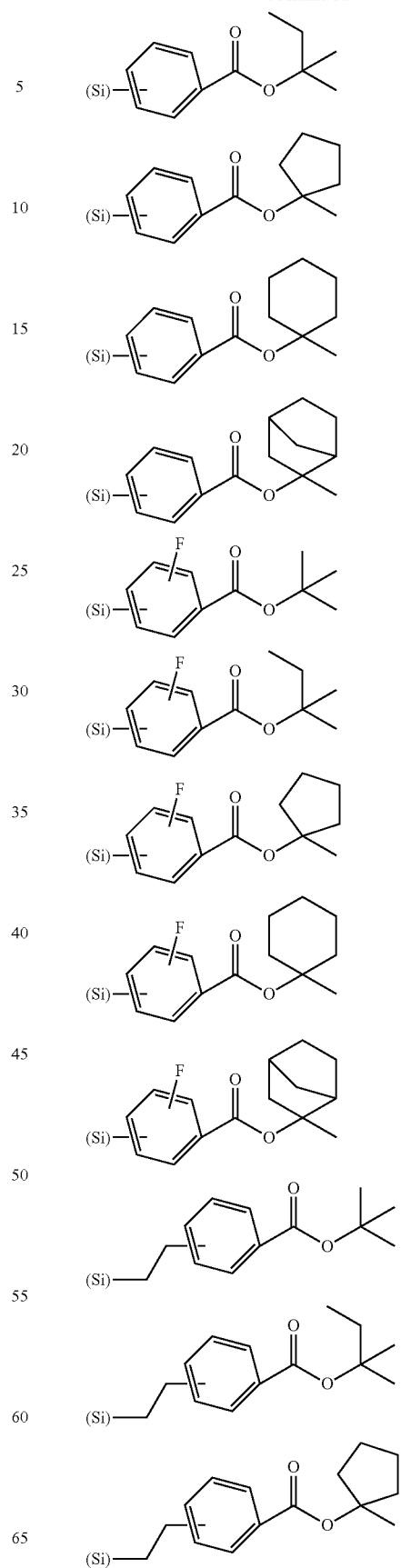

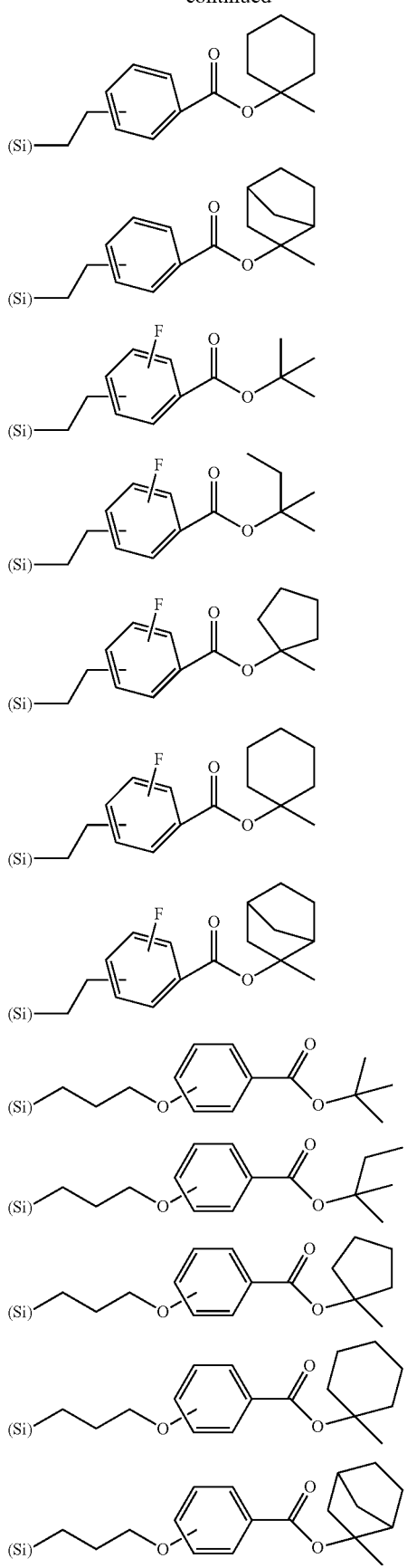
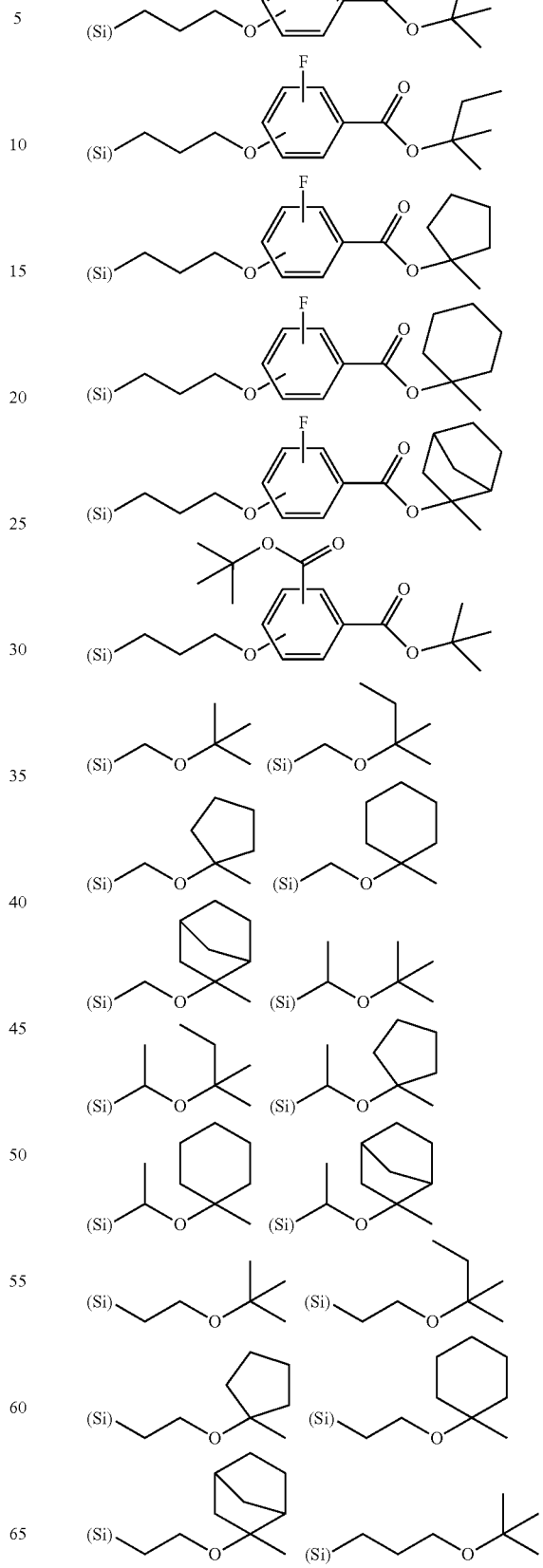

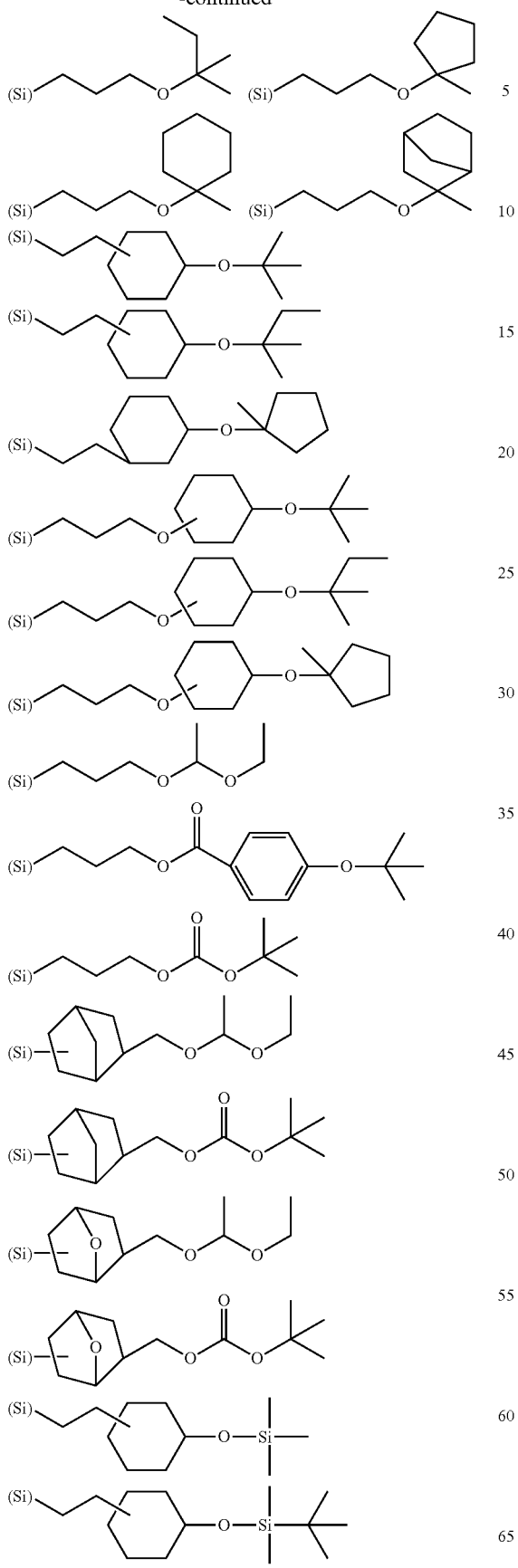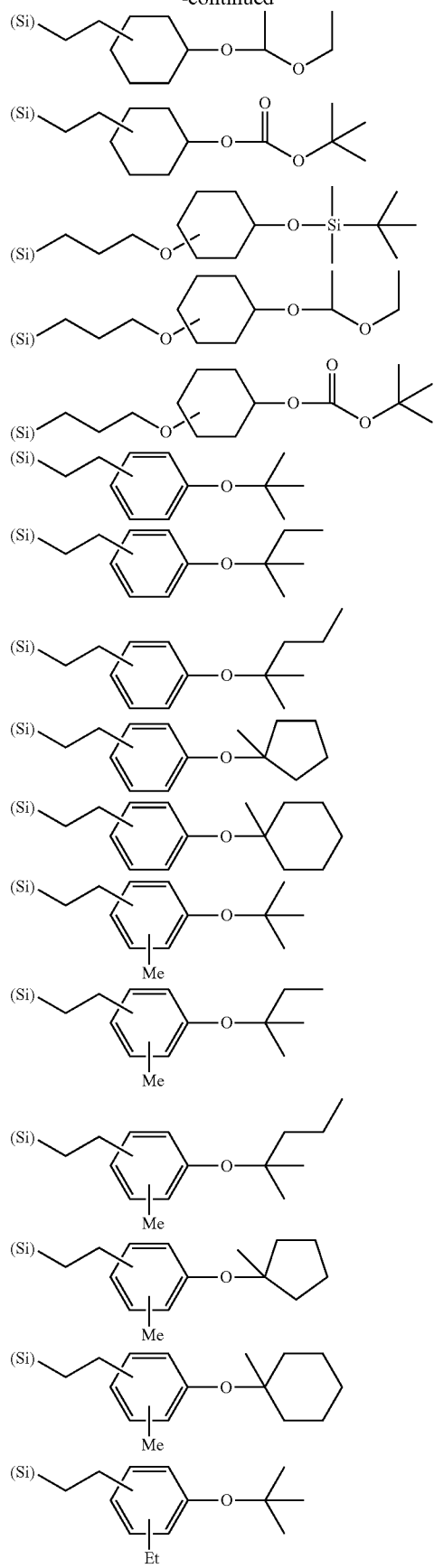

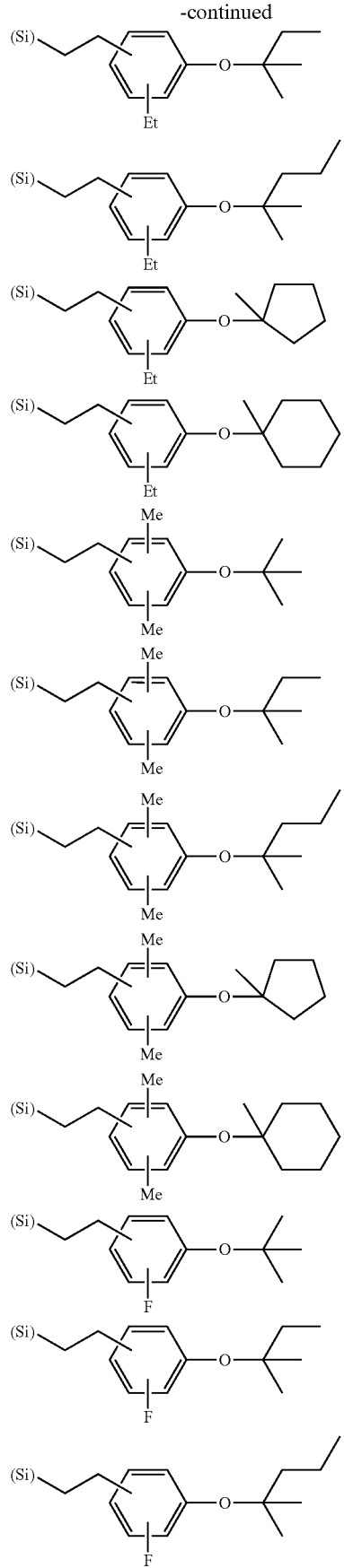
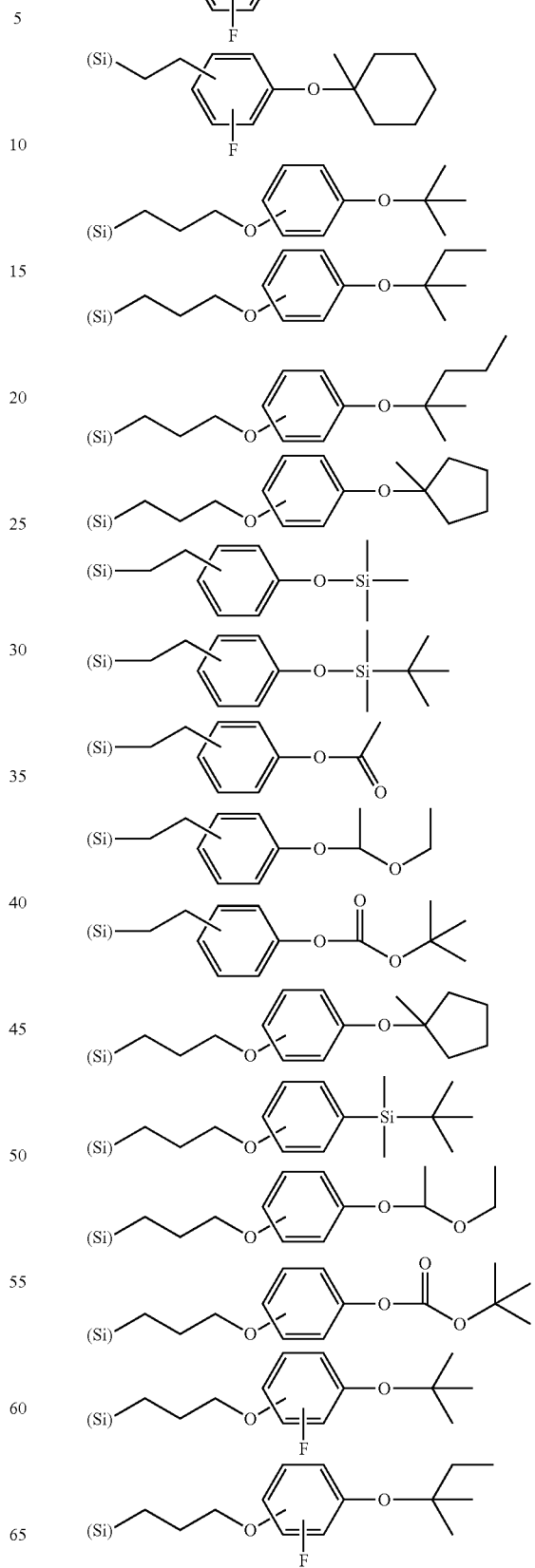

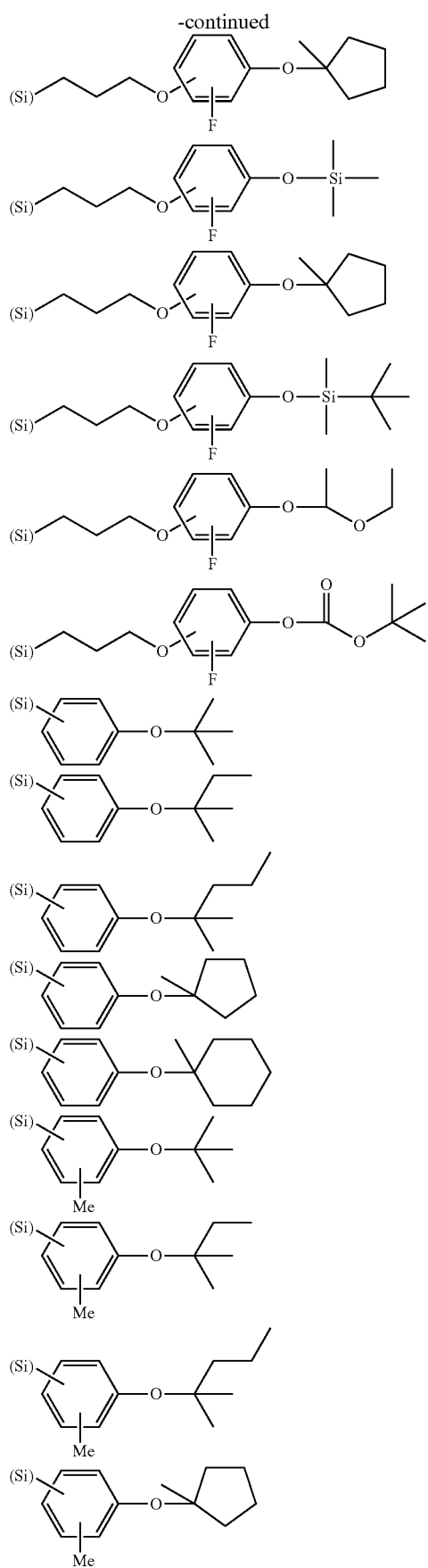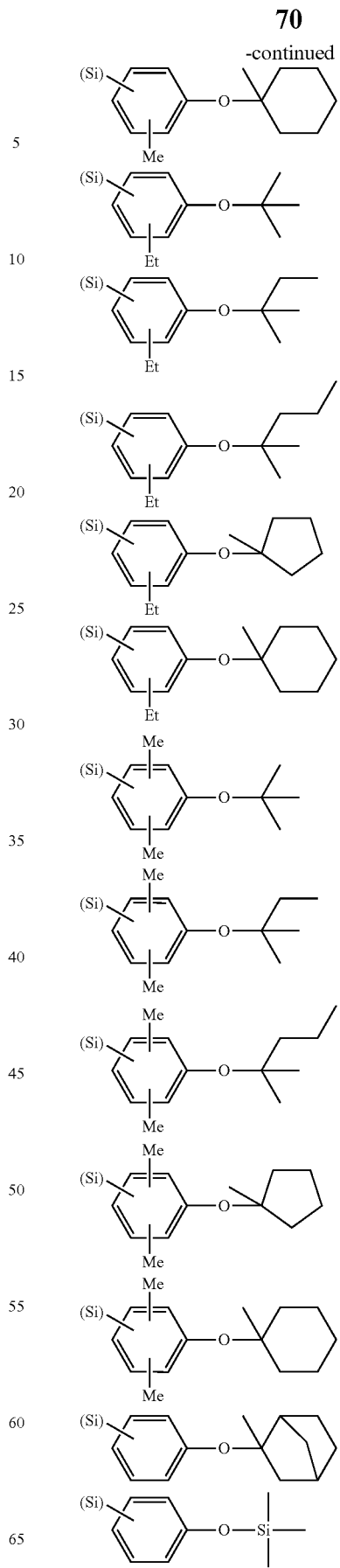

71
-continued
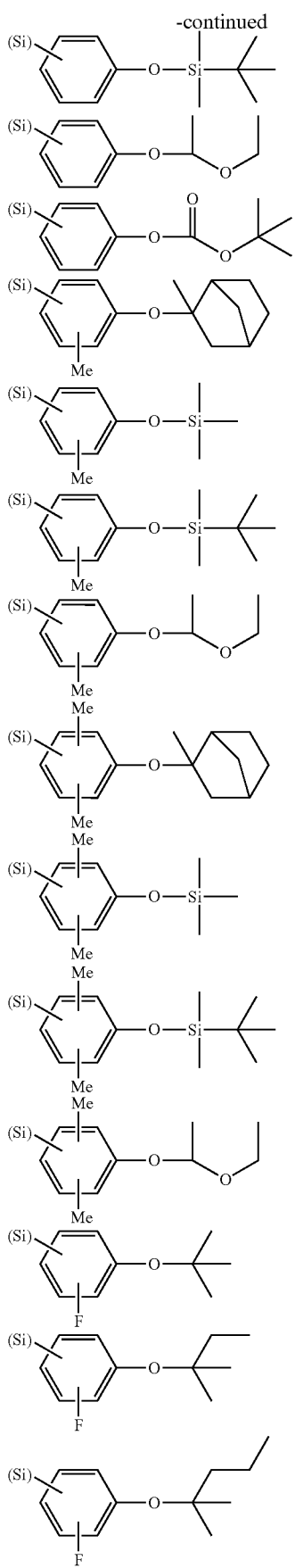
72
-continued
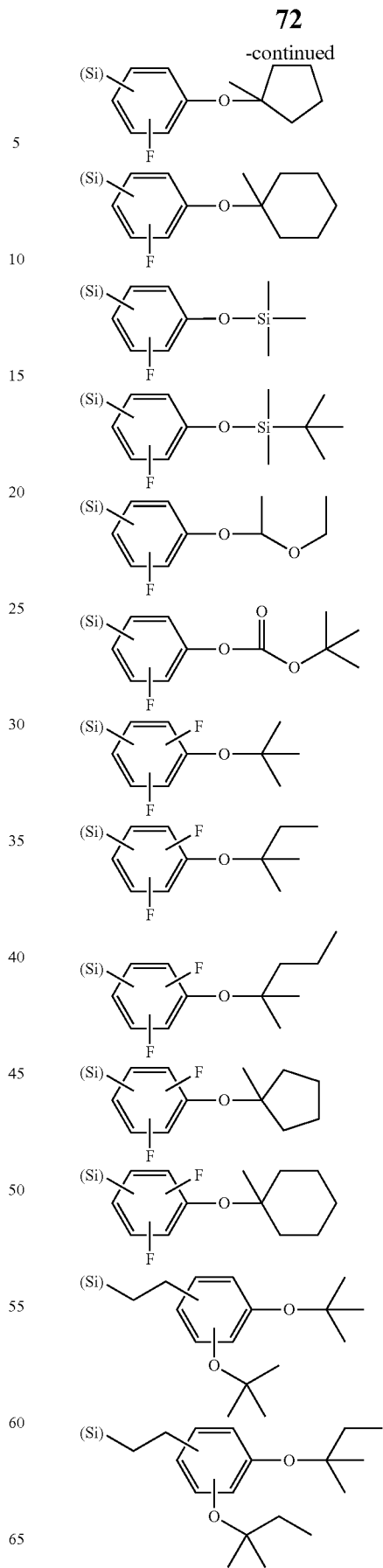

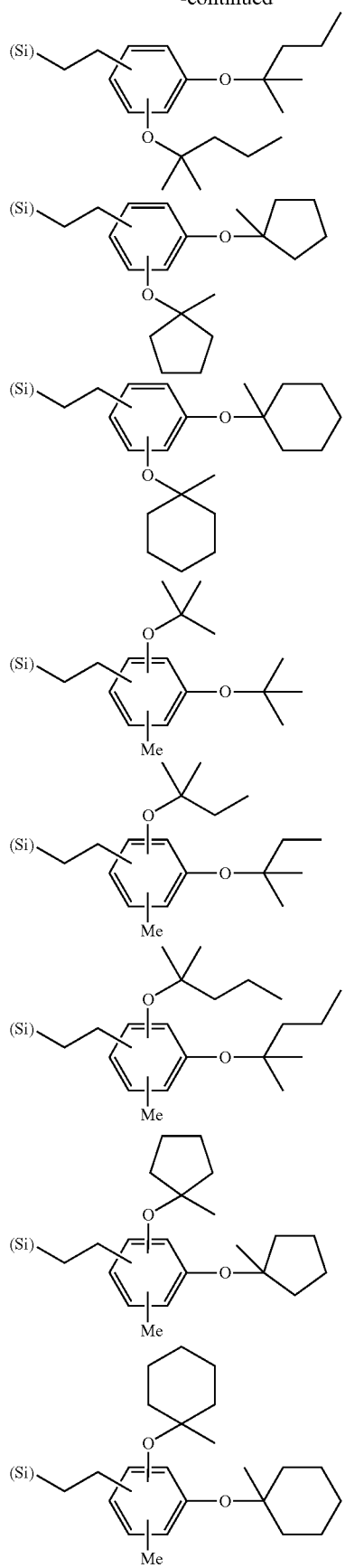
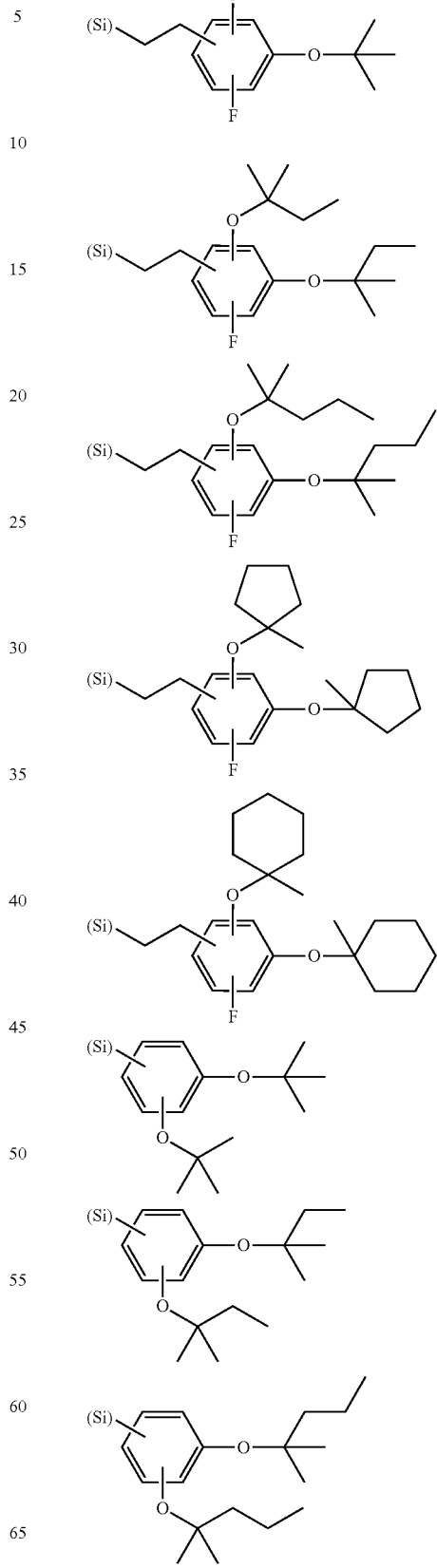

-continued

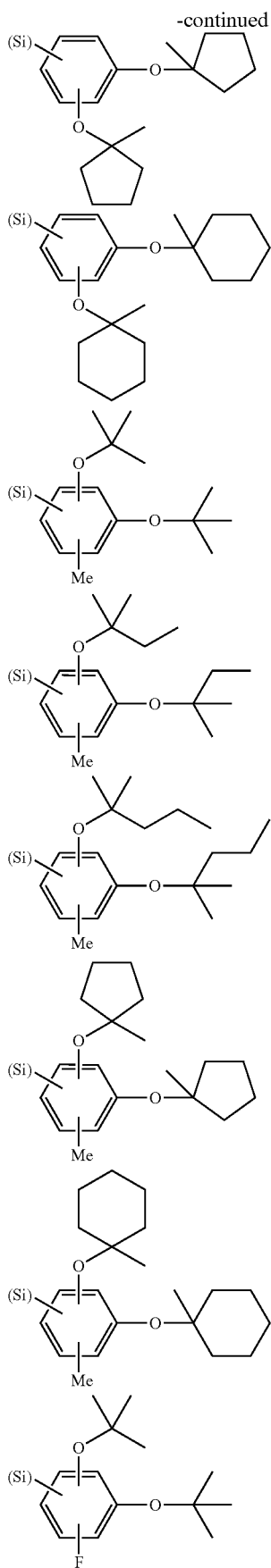

-continued

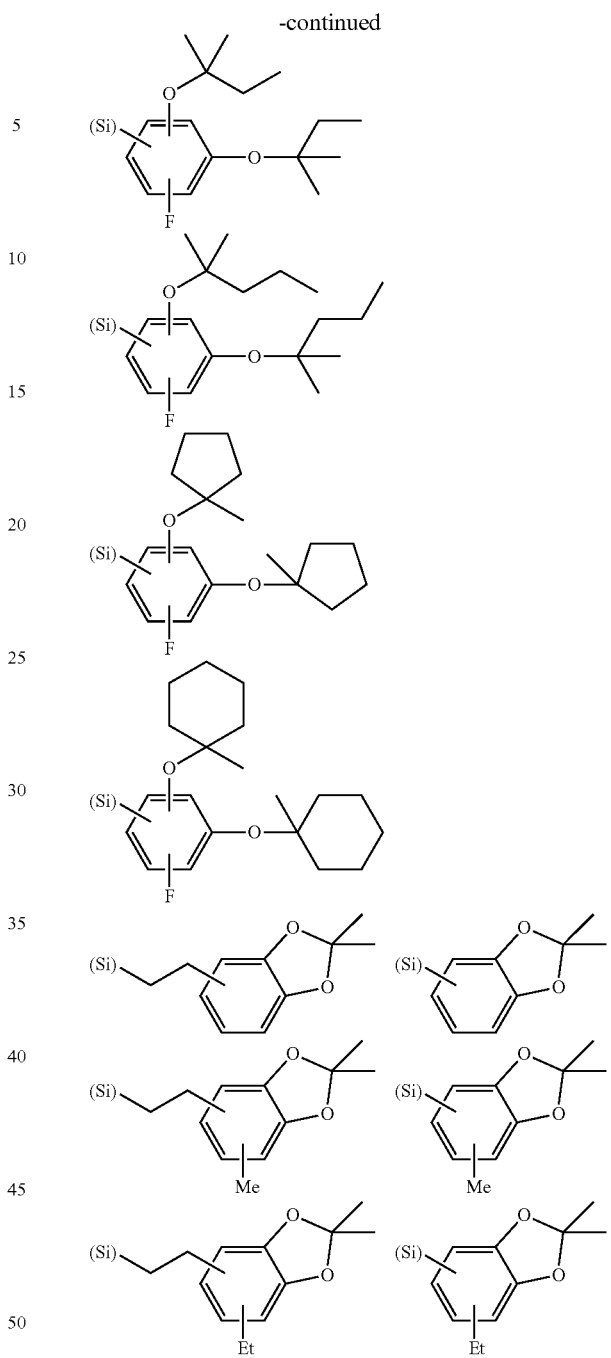

By using such Component (B) in addition to Component (A), when it is used as a resist under layer film, a composition for forming a coating type BPSG film in which adhesiveness to the photoresist pattern is improved, and causing no collapse of the pattern even in fine pattern, can be obtained.

Further, the above-mentioned Component (B) preferably comprises one or more selected from one or more silicon compounds represented by the above general formulae (A-1-1) to (A-1-4), one or more phosphorus compounds represented by the above general formulae (A-2-1) to (A-2-6), and one or more boron compounds represented by the above general formulae (A-3-1) to (A-3-3) each singly or a mixture thereof, and a hydrolysate, a condensate and a hydrolysis condensate thereof.

By using such Component (B) containing the silicon compound(s), the phosphorus compound(s) and the boron compound(s), the composition for forming a coating type BPSG film containing the structure comprising a silicic acid as a skeletal structure, the structure comprising a phosphoric acid as a skeletal structure, and the structure comprising a boric acid as a skeletal structure as mentioned above, can be more reliably obtained.

Incidentally, hydrolysis, condensation or hydrolysis condensation reaction in Component (B) can be carried out in the same manner as in the hydrolysis, condensation or hydrolysis condensation reaction of the above-mentioned Component (A).

Moreover, the composition for forming a coating type BPSG film of the present invention preferably contains an organic compound(s) having 2 or more hydroxyl groups or carboxyl groups in one molecule. Such an organic compound(s) may be mentioned the compounds mentioned below. Meanwhile, Y in the following general formula represents a hydrogen atom, a methyl group, or a hydroxymethyl group, $R^9$ represents a methylene group, a carbonyl group or a phenylene group, and "n" is an integer of 3 or more and less than 100. "na" represents a natural number of 1 to 3, "nb" represents a natural number of 1 or more, and "nc" represents a natural number of 2 to 4.

Meanwhile, in the structural formulae mentioned below, an enantioisomer (enantiomer) or a diastereoisomer (diastereomer) can exist, and each of the structural formulae mentioned below represents all of these stereoisomers. These stereoisomers may be used solely, or may be used as a mixture.

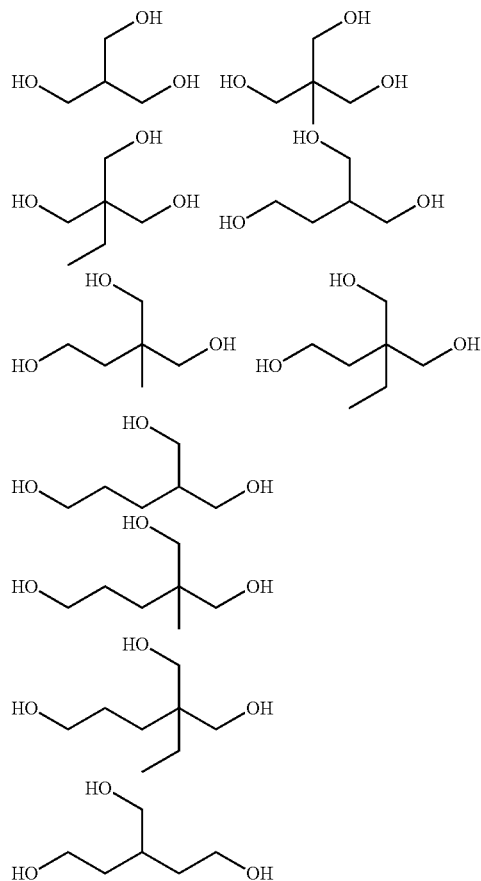

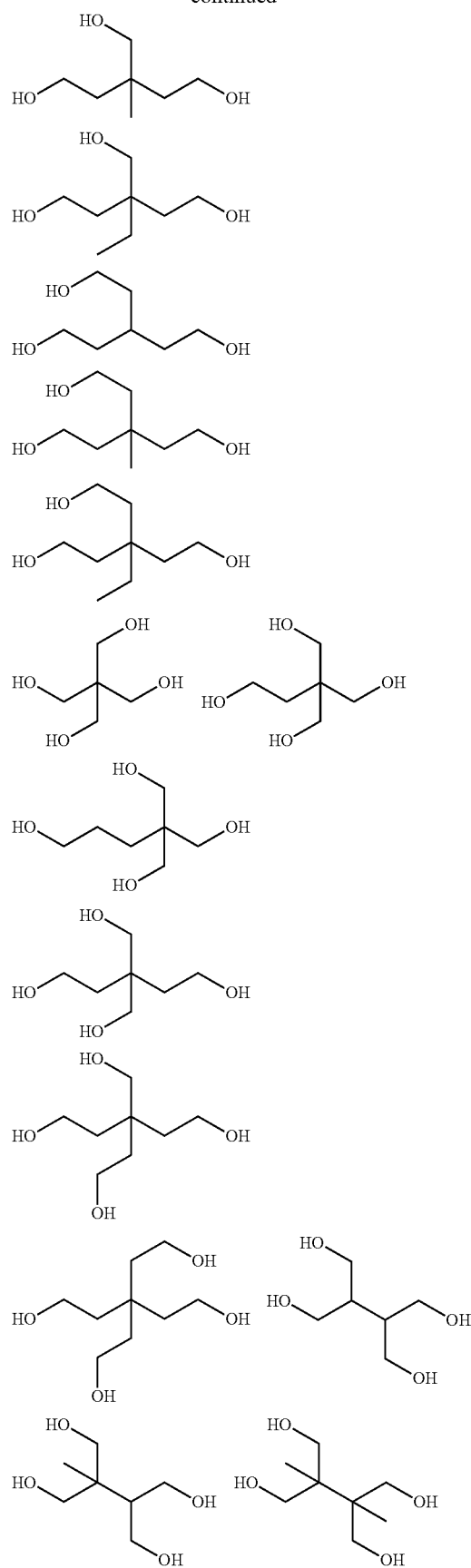

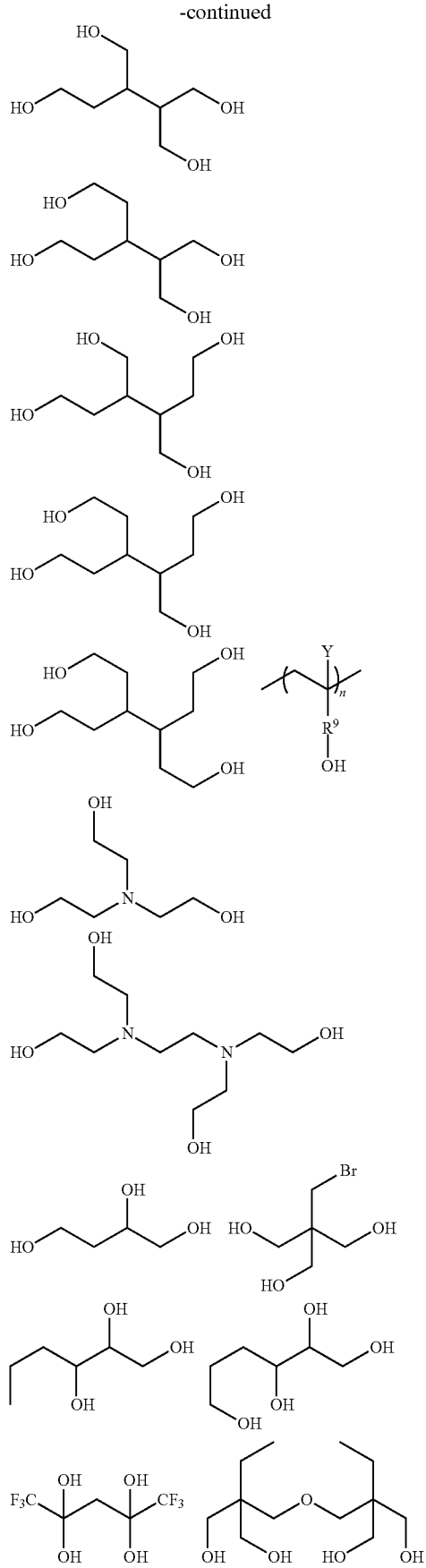
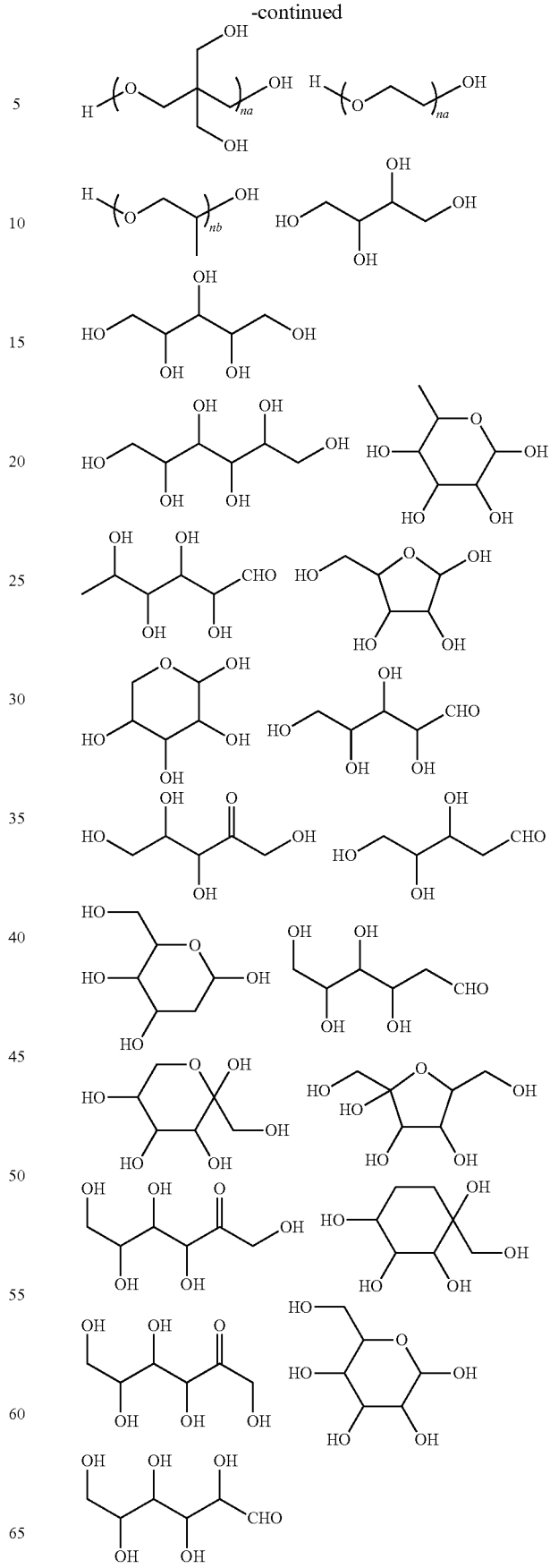

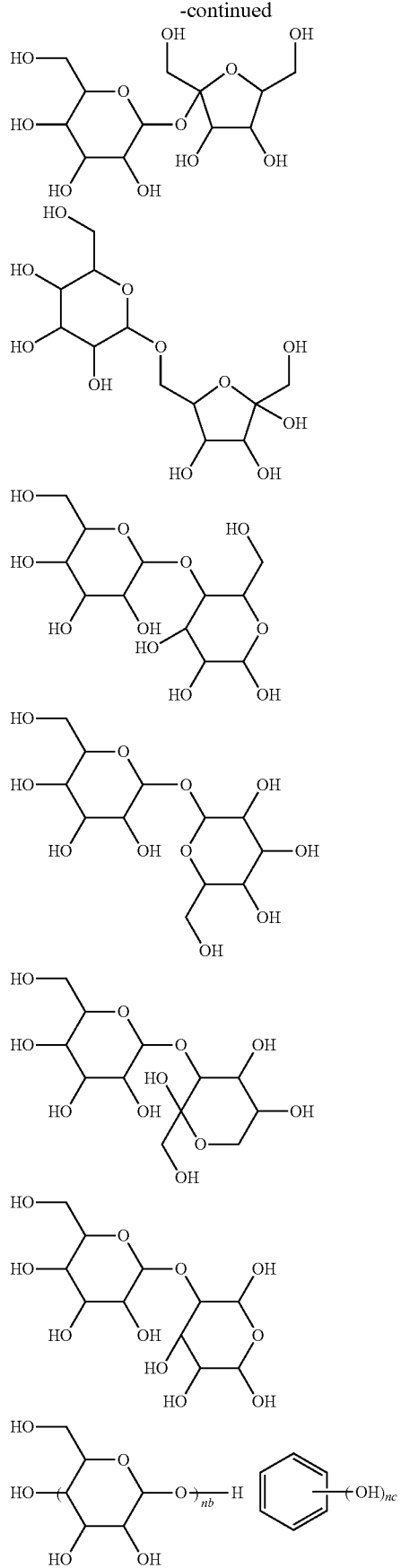

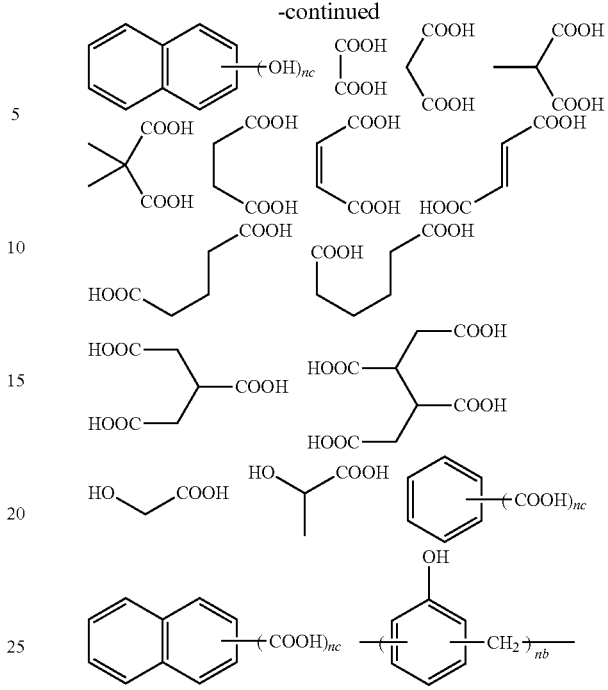

The above-mentioned organic compound(s) may be used one kind alone or two or more kinds in combination. The amount thereof to be added is preferably 0.001 to 50 parts by mass, or more preferably 0.01 to 30 parts by mass, relative to 100 parts by mass of the polymer of the above Component (A).

By adding such an organic compound(s), collapse of the BPSG film is promoted at the time of the wet etching whereby peeling becomes easy.

[Other Additives]

A thermal crosslinking accelerator may be added to the composition for forming a coating type BPSG film of the present invention. As the thermal crosslinking accelerator usable in the composition for forming a coating type BPSG film of the present invention, those materials described in the Japanese Patent Laid-Open Publication No. 2007-302873 can be exemplified. The thermal crosslinking accelerator can be used one kind alone or two or more kinds in combination. Meanwhile, adding amount of the thermal crosslinking accelerator is preferably 0.01 to 50 parts by mass, or more preferably 0.1 to 40 parts by mass, relative to 100 parts by mass of the above-mentioned polymer of the above Component (A).

To improve stability of the composition for forming a coating type BPSG film of the present invention, a monovalent, divalent or more polyvalent organic acid having 1 to 30 carbon atoms may be added thereinto. Preferable examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, etc. Especially, oxalic acid, maleic acid, formic acid, acetic acid, propionic acid, citric acid, and the like are preferable. To keep stability, two or more kinds of these acids may be used. Adding amount thereof is 0.001 to 25 parts by mass, preferably 0.01 to 15 parts by mass, or more preferably 0.1 to 5 parts by mass, relative to 100 parts by mass of silicon which is contained in the composition. Alternatively, the organic acid is preferably added such that pH of the composition may become $0 \leq pH \leq 7$, more preferably $0.3 \leq pH \leq 6.5$, or much more preferably $0.5 \leq pH \leq 6$.

A monovalent, divalent, or more polyvalent alcohol or ether compound having cyclic ether as a substituent may be added to the composition for forming a coating type BPSG film of the present invention as a stabilizer. By adding the stabilizer, stability of the polymer can be improved. As the stabilizer usable in the composition for forming a coating type BPSG film of the present invention, those materials described in the paragraphs (0180) to (0184) of Japanese Patent Laid-Open Publication No. 2009-126940 can be exemplified.

Water may be added to the composition for forming a coating type BPSG film of the present invention. When water is added thereinto, the polymer is hydrated whereby improving a lithography performance. Water content in the solvent component of the composition for forming a coating type BPSG film is preferably more than 0% by mass and less than 50% by mass, more preferably 0.3 to 30% by mass, or much more preferably 0.5 to 20% by mass. Amount of all solvents including water is preferably 100 to 100,000 parts by mass, or more preferably 200 to 50,000 parts by mass, relative to 100 parts by mass of the polymer of the Component (A). By adding in such amount, lithography performance can be improved, and uniformity of the coated film does not tend to be deteriorated, thereby causing of eye holes can be suppressed.

A photo-acid generator may be added to the composition for forming a coating type BPSG film of the present invention. As the photo-acid generator usable in the composition for forming a coating type BPSG film of the present invention, those materials described in the paragraphs (0160) to (0179) of Japanese Patent Laid-Open Publication No. 2009-126940 can be exemplified.

A surfactant may be added to the composition for forming a coating type BPSG film of the present invention, if necessary. As the surfactant usable in the composition for forming a coating type BPSG film of the present invention, those materials described in the paragraph (0185) of Japanese Patent Laid-Open Publication No. 2009-126940 can be exemplified.

A phosphoric acid salt compound or a boric acid salt compound may be added to the composition for forming a coating type BPSG film of the present invention as a thermal crosslinking accelerator, if necessary. Such a phosphoric acid salt compound may be mentioned, for example, an ammonium salt such as ammonium phosphate, tetramethyl ammonium phosphate, tetrabutyl ammonium phosphate, etc., or a sulfonium salt such as triphenyl sulfonium phosphate, etc. Also, such a boric acid salt compound may be mentioned, for example, an ammonium salt such as ammonium borate, tetramethyl ammonium borate, tetrabutyl ammonium borate, etc., or a sulfonium salt such as triphenyl sulfonium borate, etc.

Also, a phosphoric acid or a boric acid may be added to the composition for forming a coating type BPSG film of the present invention, if necessary.

By using the compounds as mentioned above, the composition for forming a coating type BPSG film of the present invention can be obtained. An example of the preferred embodiments of the composition for forming a coating type BPSG film of the present invention may be mentioned those having the following structures.

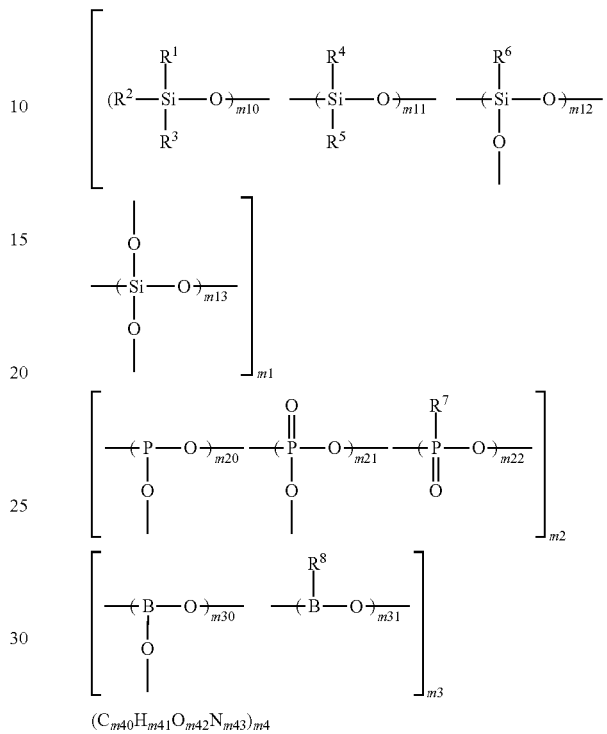

wherein m1, m2, m3 and m4 each represent a molar fraction in the composition of the structure comprising the respective elements as a main component, and satisfy $m1+m2+m3+m4=1$, $0.5<m1<1$, $0<m2<0.2$, $0<m3<0.2$, $0 \leq m4<0.3$, and $0.001 \leq m2+m3 \leq 0.3$; m10, m11, m12, m13, m20, m21, m22, m30 and m31 each have the same meanings as defined above; m40, m41, m42 and m43 each represent a ratio of an elemental composition in the structure comprising a carbon as a skeletal structure, and satisfy $m40+m41+m42+m43=1$, $0<m40 \leq 0.4$, $0<m41 \leq 0.6$, and $0<m42 \leq 0.2$, $0 \leq m43 \leq 0.1$; and $R^1$, $R^2$, $R^3$, $R^4$, $R^5$, $R^6$, $R^7$ and $R^8$ each have the same meanings as defined above.

As mentioned above, according to the composition for forming a coating type BPSG film of the present invention, it gives a composition for forming a coating type BPSG film which is excellent in adhesiveness in fine pattern, and is capable of easily subjecting to wet etching with a peeling solution which does not cause any damage to the semiconductor apparatus substrate, the coating type organic film or the CVD film mainly comprising carbon which are necessary in the patterning process.

[Substrate]

Also, the present invention provides a substrate which is used in the manufacturing process of the semiconductor apparatus, and comprises a BPSG film formed on a body to be processed by coating the above-mentioned composition for forming a coating type BPSG film.

Further, at this time, the BPSG film formed by coating the composition for forming a coating type BPSG film of the present invention on a body to be processed may function as at least one of a resist under layer film, a flattening film and an insulating film.

The BPSG film formed by using the composition for forming a coating type BPSG film of the present invention is excellent in adhesiveness in fine pattern, and can be easily subjected to wet etching with a peeling solution which does not cause any damage to the semiconductor apparatus substrate, the coating type organic film or the CVD film mainly comprising carbon which are necessary in the patterning process, so that it is suitable as a resist under layer film.

Also, the BPSG film formed by using the composition for forming a coating type BPSG film of the present invention is a coating type so that it can be formed without generating particles, shows the same heat-fusible property as that of the conventional BPSG film formed by the CVD method, and can be easily flattened by subjecting to heat treatment; therefore it is suitable as a flattening film.

Further, the BPSG film formed by using the composition for forming a coating type BPSG film of the present invention is a coating type so that it can be formed without generating particles; therefore it is also suitable as an insulating film.

Moreover, the above-mentioned BPSG film can be formed by using a semiconductor apparatus substrate on which a part or whole of the semiconductor circuits has/have been formed as a body to be processed, and spin coating the composition for forming a coating type BPSG film on the semiconductor apparatus substrate and baking the same.

[Patterning Process]

In the present invention, a pattern can be formed by; forming an organic under layer film on a body to be processed by using a coating type organic under layer film material, forming a BPSG film on the organic under layer film by using the composition for forming a coating type BPSG film, forming an upper layer resist film on the BPSG film, forming a pattern to the upper layer resist film, pattern transferring to the BPSG film by etching using the upper layer resist film having the formed pattern as a mask, pattern transferring to the organic under layer film by etching using the BPSG film having the formed pattern as a mask, and forming a mask pattern for processing the body to be processed.

Further, in the present invention, a pattern can also be formed by; forming a hard mask mainly comprising carbon on a body to be processed by a CVD method, forming a BPSG film on the hard mask by using the composition for forming a coating type BPSG film, forming an upper layer resist film on the BPSG film, forming a pattern to the upper layer resist film, pattern transferring to the BPSG film by etching using the upper layer resist film having the formed pattern as a mask, pattern transferring to the hard mask by etching using the BPSG film having the formed pattern as a mask, and forming a mask pattern for processing the body to be processed.

As the body to be processed used in the patterning process of the present invention, material in which any of a metal film, an amorphous metal film, a metal carbide film, a metal oxide film, a metal nitride film, a metal oxycarbide film or a metal oxynitride film is formed on a semiconductor apparatus substrate on which a part or whole of semiconductor circuits has/have been formed, as a layer to be processed, can be used.

As the semiconductor apparatus substrate, silicon substrate is generally used. However, the substrate is not limited to this and may be Si, an amorphous silicon ($\alpha$-Si), p-Si, $SiO_2$, SiN, SiON, W, TiN, Al, or the like. The substrate may be a material different from the layer to be processed.

As the metal constitutes the body to be processed, silicon, titanium, tungsten, hafnium, zirconium, chromium, germanium, copper, aluminum, indium, gallium, arsenic, palladium, iron, tantalum, iridium, molybdenum, or an alloy thereof can be used. The layer to be processed may be made of Si, $SiO_2$, SiN, SiON, p-Si, $\alpha$-Si, TiN, BPSG, SOG, Cr, CrO, CrON, MoSi, W, W—Si, Al, Cu, Al—Si, or the like; various low dielectric constant (low-k) films, or etching stopper films. The thickness of the layer is preferably 50 to 10,000 nm, or more preferably 100 to 5,000 nm.

In the patterning process of the present invention, an organic under layer film, or a hard mask mainly comprising carbon can be formed on the body to be processed. Among these, the organic under layer film can be formed from the coating type organic under layer film material by using the spin coating method, etc., and the hard mask mainly comprising carbon can be formed form a material of an organic hard mask mainly comprising carbon by using the CVD method. Such a coating type organic under layer film and a CVD film mainly comprising carbon are not particularly limited, and preferably a material which shows a sufficient antireflection film function when the upper layer resist film is subjected to pattern formation by exposure. By forming such a coating type organic under layer film or a CVD film mainly comprising carbon, a pattern formed to the upper layer resist film can be transferred to the body to be processed without generating the difference in size conversion.

The BPSG film used in the patterning process of the present invention can be formed on a body to be processed by the spin coating method, etc., as same method as the photoresist film (an upper layer resist film) using the composition for forming a coating type BPSG film. After spin coating, it is desired to be baked for evaporating the solvent, preventing from mixing with the upper layer resist film, and promoting the cross-linking reaction. The baking temperature is preferably in the range of 50 to 500° C., and the heating time is preferably in the range of 10 to 300 seconds. Particularly preferable temperature range is 400° C. or less for reducing heat damage to the devices, though it is depending on the structure of the devices to be manufactured.

Also, pattern formation of the above-mentioned upper layer resist film is preferably carried out by a lithography method using light with a wavelength of 300 nm or less or EUV light, an electron beam direct drawing method, a directed self-assembly method or a nano-imprinting lithography method. By using these methods, a fine pattern can be formed to the upper layer resist film.

The composition for forming an upper layer resist film may be optionally selected depending on the method for forming the pattern to the upper layer resist film. For example, when lithography using light with a wavelength of 300 nm or less or EUV light is carried out, a chemical amplification type photoresist film material may be used as the composition for forming an upper layer resist film. Such a photoresist film material may be exemplified by a material, in which a photoresist film is formed and exposed, and then, the exposed portion is dissolved by using an alkaline developing solution to form a positive type pattern, or the unexposed portion is dissolved by using a developing solution comprising an organic solvent to form a negative type pattern.

Also, when the lithography is carried out by using an ArF excimer laser light as the light with a wavelength of 300 nm or less, any material can be used as the composition for forming an upper layer resist film so long as it is a usual resist composition for ArF excimer laser light. As such a resist composition for the ArF excimer laser light, many candidates have been well-known. When the well-known resins are roughly classified, there are a poly(meth)acryl type, a COMA (Cycloolefin Maleic Anhydride) type, a COMA-(meth)acryl hybrid type, a ROMP (Ring Opening Metathesis Polymerization) series and a polynorbornene type material, etc. Among them, the resist composition using the poly(meth)acryl type resin secures its etching resistance by introducing an alicyclic skeletal structure at the side chain, so that it is excellent in resolution property as compared with the other resin type, whereby it is preferably used.

The patterning process of the present invention is excellent in pattern adhesiveness of the resist under layer film, so that even when fine pattern is formed at the upper layer resist film, it cause no collapse of the pattern, etc. It is also excellent in etching selectivity to the organic film or the silicon-containing film, so that by optimizing the combination of the coating type organic under layer film or the CVD film mainly comprising carbon, pattern transfer can be carried out without generating the difference in size conversion.

After subjecting to the process for forming the mask pattern for processing the body to be processed, a process for removing the BPSG film by wet etching may be carried out.

When the BPSG film of the present invention is to be wet etched, a peeling solution containing hydrogen peroxide is preferably used. At this time, it is further preferable that a pH of the solution is adjusted by adding an acid or an alkali to promote peeling. The pH adjusting agent may be mentioned an inorganic acid such as hydrochloric acid, sulfuric acid, etc., an organic acid such as acetic acid, oxalic acid, tartaric acid, citric acid, lactic acid, etc., an alkali containing nitrogen such as ammonia, ethanolamine, tetramethylammonium hydroxide, etc., and an organic acid compound containing nitrogen such as EDTA (ethylenediamine tetraacetic acid), etc.

Wet etching may be carried out only by preparing a peeling solution at 0° C. to 80° C., preferably at 5° C. to 60° C., and dipping a silicon wafer formed substrate to be processed. If further necessary, it is possible that the BPSG film can be easily removed by the conventional manner such as spraying a peeling solution onto the surface thereof, coating a peeling solution while rotating a wafer, etc.

Thus, when a pattern is formed by using the composition for forming a coating type BPSG film of the present invention, it is possible to wet etch the BPSG film without causing any damage to the coating type organic under layer film or the CVD film mainly comprising carbon easily.

EXAMPLES

Hereinafter, the present invention will be specifically described with reference to Synthesis Examples, Examples and Comparative Examples, but it is not restricted thereto. "%" in the following Examples represents "% by mass" and the molecular weight is measured by GPC.

Synthesis of Component (A)

Synthesis Example (A1)

To a mixture comprising 120 g of methanol, 1 g of 70% nitric acid and 60 g of deionized water was added a mixture comprising 5.0 g of phenyl trimethoxy silane [Monomer 100], 17.0 g of methyl trimethoxy silane [Monomer 101], 45.7 g of tetramethoxy silane [Monomer 102], 6.3 g of tributyl phosphate [Monomer 112] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12%) of a PGEE solution containing the silicon-containing compound (A1). When the molecular weight of the product in terms of the polystyrene was measured, then it was Mw=2,500.

Synthesis Examples (A2) to (A4)

Synthesis examples (A2) to (A4) were synthesized by using monomers shown in the following Table 1 under the same conditions as in Synthesis example (A1) to prepare PGEE solutions of the silicon-containing compounds (A2) to (A4), respectively.

Synthesis Example (A5)

To a mixture comprising 120 g of methanol, 3 g of 85% phosphoric acid [Monomer 113], 1 g of 70% nitric acid and 60 g of deionized water was added a mixture comprising 5.0 g of phenyl trimethoxy silane [Monomer 100], 10.2 g of methyl trimethoxy silane [Monomer 101], 53.3 g of tetramethoxy silane [Monomer 102] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11%) of a PGEE solution containing the silicon-containing compound (A5). When the molecular weight of the product in terms of the polystyrene was measured, then it was Mw=3,000.

Synthesis Example (A6)

To a mixture comprising 120 g of methanol, 1.5 g of boric acid [Monomer 116], 1 g of 70% nitric acid and 60 g of deionized water was added a mixture comprising 5.0 g of phenyl trimethoxy silane [Monomer 100], 17 g of methyl trimethoxy silane [Monomer 101], 45.7 g of tetramethoxy silane [Monomer 102] and 6.3 g of tributyl phosphate [Monomer 112], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11.1%) of a PGEE solution containing the silicon-containing compound (A6). When the molecular weight of the product in terms of the polystyrene was measured, then it was Mw=2,700.

Synthesis Example (A7)

To a mixture comprising 120 g of methanol, 3 g of 85% phosphoric acid [Monomer 113], 1.5 g of boric acid [Monomer 116], 1 g of 70% nitric acid and 60 g of deionized water was added a mixture comprising 5.0 g of phenyl trimethoxy silane [Monomer 100], 17 g of methyl trimethoxy silane [Monomer 101] and 45.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 10.6%) of a PGEE solution containing the silicon-containing compound (A7). When the molecular weight of the product in terms of the polystyrene was measured, then it was Mw=3,100.

Synthesis Example (A8)

To a mixture comprising 120 g of methanol, 3 g of 85% phosphoric acid [Monomer 113], 1 g of 70% nitric acid and 60 g of deionized water was added a mixture comprising 5.4 g of 4-fluorophenyl trimethoxy silane [Monomer 104] and 68.5 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 12.0%) of a PGEE solution containing the silicon-containing compound (A8). When the molecular weight of the product in terms of the polystyrene was measured, then it was Mw=3,400.

Synthesis Example (A9)

To a mixture comprising 120 g of methanol, 1 g of 70% nitric acid and 60 g of deionized water was added a mixture comprising 5.0 g of phenyl trimethoxy silane [Monomer 100], 5.2 g of trimethyl borate [Monomer 115] and 64.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 260 g (polymer concentration: 11.7%) of a PGEE solution containing the silicon-containing compound (A9). When the molecular weight of the product in terms of the polystyrene was measured, then it was Mw=2,700.

Synthesis Example (A10)

To a mixture comprising 120 g of methanol, 3 g of 85% phosphoric acid [Monomer 113], 1.5 g of boric acid [Monomer 116], 1 g of 70% nitric acid and 60 g of deionized water was added a mixture comprising 5.8 g of 4-chlorophenyl trimethoxy silane [Monomer 105] and 64.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 310 g (polymer concentration: 10.5%) of a PGEE solution containing the silicon-containing compound (A10). When the molecular weight of the product in terms of the polystyrene was measured, then it was Mw=3,000.

Synthesis Example (A11)

To a mixture comprising 120 g of methanol, 3 g of 85% phosphoric acid [Monomer 113], 1.5 g of boric acid [Monomer 116], 1 g of 70% nitric acid and 60 g of deionized water was added a mixture comprising 5.0 g of phenyl trimethoxy silane [Monomer 100], 13.6 g of methyl trimethoxy silane [Monomer 101], 9.3 g of 4-acetoxy-4,4-bistrifluoromethyl-butyl trimethoxy silane [Monomer 106] and 45.7 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 10.6%) of a PGEE solution containing the silicon-containing compound (A11). When the molecular weight of the product in terms of the polystyrene was measured, then it was Mw=2,700.

Synthesis Example (A12)

To a mixture comprising 120 g of methanol, 3 g of 85% phosphoric acid [Monomer 113], 1.5 g of boric acid [Monomer 116], 1 g of 70% nitric acid and 60 g of deionized water was added a mixture comprising 5.0 g of phenyltrimethoxysilane [Monomer 100] and 64.7 g of tetramethoxysilane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 270 g (polymer concentration: 11.5%) of a PGEE solution containing the silicon-containing compound (A12). When the molecular weight of the product in terms of the polystyrene was measured, then it was Mw=2,800.

Synthesis Example (A13)

To a mixture comprising 120 g of methanol, 2.1 g of phosphonic acid [Monomer 111], 1 g of 70% nitric acid and 60 g of deionized water was added a mixture comprising 68.5 g of tetramethoxy silane [Monomer 102] and 2.6 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 290 g (polymer concentration: 11.2%) of a PGEE solution containing the silicon-containing compound (A13). When the molecular weight of the product in terms of the polystyrene was measured, then it was Mw=3,100.

In the following, formulation amounts of Synthesis examples (A1) to (A13) are summarized in Table 1.

TABLE 1

| Synthesis examples | Materials for reaction | Mw |
|---|---|---|
| A1 | [Monomer 100]: 5 g, [Monomer 101]: 17 g, [Monomer 102]: 45.7 g, [Monomer 112]: 6.3 g, [Monomer 115]: 2.6 g | 2,500 |
| A2 | [Monomer 100]: 5 g, [Monomer 101]: 17 g, [Monomer 102]: 45.7 g, [Monomer 110]: 4 g, [Monomer 115]: 2.6 g | 3,200 |
| A3 | [Monomer 100]: 5 g, [Monomer 101]: 17 g, [Monomer 103]: 62.6 g, [Monomer 117]: 3.1 g, [Monomer 115]: 2.6 g | 3,000 |
| A4 | [Monomer 101]: 17 g, [Monomer 102]: 49.5 g, [Monomer 112]: 6.3 g, [Monomer 114]: 3 g | 3,000 |
| A5 | [Monomer 100]: 5 g, [Monomer 101]: 10.2 g, [Monomer 102]: 53.3 g, [Monomer 113]: 3 g, [Monomer 115]: 2.6 g | 3,000 |
| A6 | [Monomer 100]: 5 g, [Monomer 101]: 17 g, [Monomer 102]: 45.7 g, [Monomer 112]: 6.3 g, [Monomer 116]: 1.5 g | 2,700 |

TABLE 1-continued

| Synthesis examples | Materials for reaction | Mw |
|---|---|---|
| A7 | [Monomer 100]: 5 g, [Monomer 101]: 17 g, [Monomer 102]: 45.7 g, [Monomer 113]: 3 g, [Monomer 116]: 1.5 g | 3,100 |
| A8 | [Monomer 104]: 5.4 g, [Monomer 102]: 68.5 g, [Monomer 113]: 3 g | 3,400 |
| A9 | [Monomer 100]: 5 g, [Monomer 102]: 64.7 g, [Monomer 115]: 5.2 g | 2,700 |
| A10 | [Monomer 105]: 5.8 g, [Monomer 102]: 64.7 g, [Monomer 113]: 3 g, [Monomer 116]: 1.5 g | 3,000 |
| A11 | [Monomer 100]: 5 g, [Monomer 101]: 13.6 g, [Monomer 102]: 45.7 g [Monomer 106]: 9.3 g, [Monomer 113]: 3 g, [Monomer 116]: 1.5 g | 2,700 |
| A12 | [Monomer 100]: 5 g, [Monomer 102]: 64.7 g, [Monomer 113]: 3 g, [Monomer 116]: 1.5 g | 2,800 |
| A13 | [Monomer 102]: 68.5 g, [Monomer 111]: 2.1 g, [Monomer 115]: 2.6 g | 3,100 |

In the following, structural formulae of the compounds to be used in Synthesis examples (A1) to (A13) are shown.

PhSi (OCH$_3$)$_3$ [Monomer100]

CH$_3$Si (OCH$_3$)$_3$ [Monomer101]

Si (OCH$_3$)$_4$ [Monomer102]

Si (OC$_2$H$_5$)$_4$ [Monomer103]

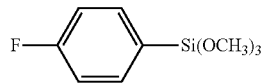 [Monomer104]

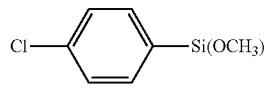 [Monomer105]

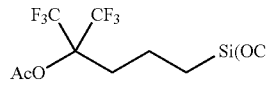 [Monomer106]

PhPO (OH)$_2$ [Monomer110]

H$_3$PO$_3$ [Monomer111]

PO (OC$_4$H$_9$)$_3$ [Monomer112]

H$_3$PO$_4$ [Monomer113]

PhB (OH)$_2$ [Monomer114]

B (OCH$_3$)$_3$ [Monomer115]

H$_3$BO$_3$ [Monomer116]

CH$_3$ PO(OCH$_3$)$_2$ [Monomer117]

Synthesis of Component (B)

Synthesis Example (B1)

To a mixture comprising 120 g of methanol, 1 g of methanesulfonic acid and 60 g of deionized water was added a mixture comprising 34.1 g of methyl trimethoxy silane [Monomer 101] and 26.0 g of trimethyl borate [Monomer 115], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 13%) of a PGEE solution containing the silicon-containing compound (B1). When the molecular weight of the product in terms of the polystyrene was measured, then it was Mw=3,200.

Synthesis Example (B2)

To a mixture comprising 120 g of methanol, 1 g of methanesulfonic acid and 60 g of deionized water was added a mixture comprising 9.9 g of phenyl trimethoxy silane [Monomer 100], 54.5 g of methyl trimethoxy silane [Monomer 101] and 12.5 g of tributyl phosphate [Monomer 112], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 310 g (polymer concentration: 11.9%) of a PGEE solution containing the silicon-containing compound (B2). When the molecular weight of the product in terms of the polystyrene was measured, then it was Mw=3,500.

Synthesis Example (B3)

To a mixture comprising 120 g of methanol, 1 g of methanesulfonic acid and 60 g of deionized water was added a mixture comprising 61.3 g of methyl trimethoxy silane [Monomer 101] and 7.6 g of tetramethoxy silane [Monomer 102], and the resulting mixture was maintained at 40° C. for 12 hours to carry out hydrolysis condensation. After completion of the reaction, 300 g of PGEE was added to the resulting mixture, and a by-produced alcohol and excess water were distilled off under reduced pressure to obtain 300 g (polymer concentration: 11.1%) of a PGEE solution containing the silicon-containing compound (B3). When the molecular weight of the product in terms of the polystyrene was measured, then it was Mw=3,500.

Synthesis Example (B4)

To a mixture comprising 120 g of methanol, 1 g of methanesulfonic acid and 60 g of deionized water was added a mixture comprising 34.1 g of methyl trimethoxy silane [Monomer 101] and 67.6 g of 4-t-butoxyphenyl trimethoxy silane [Monomer 120], and the resulting mixture was maintained at 40° C. for 12 hours to carry out hydrolysis condensation. After completion of the reaction, 500 g of PGEE was added to the resulting mixture, and a by-produced alcohol and excess water were distilled off under reduced pressure to obtain 570 g (polymer concentration: 11.7%) of a PGEE solution containing the silicon-containing compound (B4). When the molecular weight of the product in terms of the polystyrene was measured, then it was Mw=2,700.

Synthesis Examples (B5) to (B11)

Synthesis examples (B5) to (B11) were synthesized by using monomers shown in the following Table 2 under the same conditions as in Synthesis example (B4) to prepare PGEE solutions of the silicon-containing compounds (B5) to (B11), respectively.

In the following, formulation amounts of Synthesis examples (B1) to (B11) are summarized in Table 2.

TABLE 2

| Synthesis examples | Materials for reaction | Mw |
|---|---|---|
| B1 | [Monomer 101]: 34.1 g, [Monomer 115]: 26 g | 3,200 |
| B2 | [Monomer 100]: 9.9 g, [Monomer 101]: 54.5 g, [Monomer 112]: 12.5 g | 3,500 |
| B3 | [Monomer 101]: 61.3 g, [Monomer 102]: 7.6 g | 3,500 |
| B4 | [Monomer 101]: 34.1 g, [Monomer 120]: 67.6 g | 2,700 |
| B5 | [Monomer 101]: 34.1 g, [Monomer 121]: 74.6 g | 3,000 |
| B6 | [Monomer 101]: 34.1 g, [Monomer 122]: 81.6 g | 2,900 |
| B7 | [Monomer 101]: 34.1 g, [Monomer 123]: 83.1 g | 3,300 |
| B8 | [Monomer 101]: 34.1 g, [Monomer 124]: 74.6 g | 2,500 |
| B9 | [Monomer 101]: 34.1 g, [Monomer 125]: 83.6 g | 3,000 |
| B10 | [Monomer 101]: 34.1 g, [Monomer 126]: 89.2 g | 3,300 |
| B11 | [Monomer 101]: 34.1 g, [Monomer 127]: 82.6 g | 3,200 |

In the following, structural formulae of the compounds to be used in Synthesis examples (B1) to (B11) are shown.

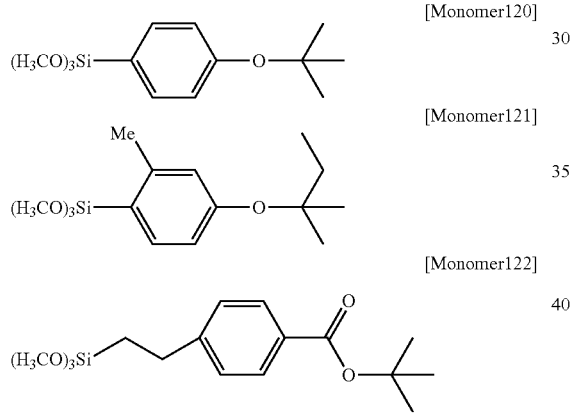

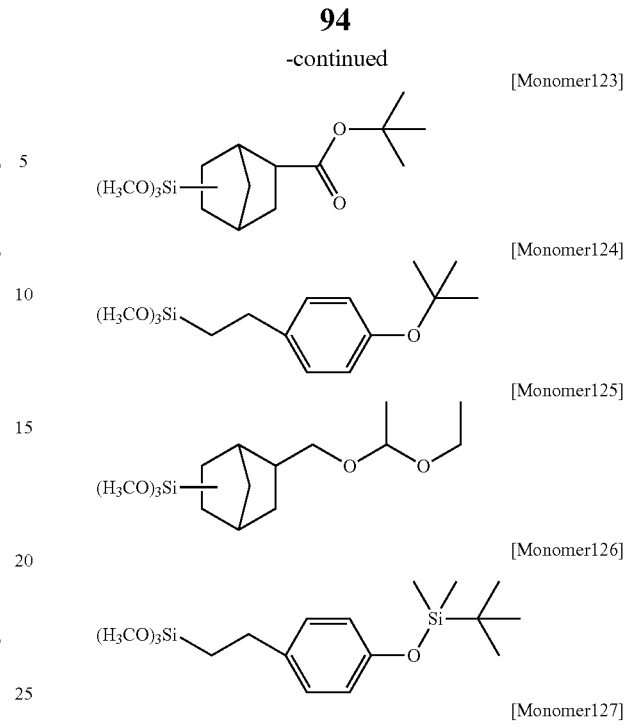

Examples and Comparative Examples

The silicon-containing compounds (A1) to (A13) obtained in the above Synthesis examples as Component (A), The silicon-containing compounds (B1) to (B11) obtained by the same as Component (B), additives, and the solvents were mixed with the ratios shown in Table 3, and the respective mixtures were filtered through 0.1 μm of a filter made of a fluorine resin to prepare the respective compositions for forming a coating type BPSG film solution which were named Sols. 1 to 26, respectively.

TABLE 3

| No. | Component (A) (Parts by mass) | Component (B) (Parts by mass) | Thermal crosslinking accelerator (Parts by mass) | Photo-acid generator (Parts by mass) | Organic acid (Parts by mass) | Other additives (Parts by mass) | Solvent (Parts by mass) |
|---|---|---|---|---|---|---|---|
| Sol. 1 | A1 (4.0) | — | TPSNO$_3$ (0.04) | — | Maleic acid (0.04) | — | PGEE/water (150/15) |
| Sol. 2 | A2 (4.0) | — | TPSMA (0.04) | — | Oxalic acid (0.04) | — | PGEE/water (150/15) |
| Sol. 3 | A3 (4.0) | — | TPSMA (0.04) | — | Maleic acid (0.04) | — | PGEE/water (150/15) |
| Sol. 4 | A4 (4.0) | — | TPSMA (0.04) | — | Maleic acid (0.04) | — | PGEE/water (150/15) |
| Sol. 5 | A5 (4.0) | — | TPSMA (0.04) | — | Oxalic acid (0.04) | — | PGEE/water (150/15) |
| Sol. 6 | A6 (4.0) | — | QMANO$_3$ (0.04) | — | Oxalic acid (0.04) | — | PGEE/water (150/15) |
| Sol. 7 | A7 (4.0) | — | TPSMA (0.04) | — | Maleic acid (0.04) | — | PGEE/water (150/15) |

TABLE 3-continued

| No. | Component (A) (Parts by mass) | Component (B) (Parts by mass) | Additives Thermal crosslinking accelerator (Parts by mass) | Photo-acid generator (Parts by mass) | Organic acid (Parts by mass) | Other additives (Parts by mass) | Solvent (Parts by mass) |
|---|---|---|---|---|---|---|---|
| Sol. 8 | A8 (3.6) | B1 (0.4) | TPSMA (0.04) | — | Maleic acid (0.04) | — | PGEE/water (150/15) |
| Sol. 9 | A9 (3.6) | B2 (0.4) | TPSMA (0.04) | TPSNf (0.04) | Maleic acid (0.04) | — | PGEE/water (150/15) |
| Sol. 10 | A10 (3.6) | B3 (0.4) | TPSNO$_3$ (0.04) | — | Maleic acid (0.04) | — | PGEE/water (150/15) |
| Sol. 11 | A11 (3.8) | B4 (0.2) | TPSMA (0.04) | — | Maleic acid (0.04) | — | PGEE/water (150/15) |
| Sol. 12 | A12 (3.8) | B5 (0.2) | TPSMA (0.04) | — | Oxalic acid (0.04) | — | PGEE/water (150/15) |
| Sol. 13 | A13 (3.9) | B6 (0.1) | TPSMA (0.04) | — | Maleic acid (0.04) | SORBOL (0.04) | PGEE/water (150/15) |
| Sol. 14 | A13 (3.9) | B7 (0.1) | TPSNO$_3$ (0.04) | — | Maleic acid (0.04) | — | PGEE/water (150/15) |
| Sol. 15 | A13 (3.9) | B8 (0.1) | TPSMA (0.04) | TPSNf (0.04) | Oxalic acid (0.04) | — | PGEE/water (150/15) |
| Sol. 16 | A13 (3.9) | B9 (0.1) | TPSMA (0.04) | — | Oxalic acid (0.04) | — | PGEE/water (150/15) |
| Sol. 17 | A13 (3.9) | B10 (0.1) | TPSMA (0.04) | — | Maleic acid (0.04) | XYTOL (0.04) | PGEE/water (150/15) |
| Sol. 18 | A13 (3.9) | B11 (0.1) | TPSMA (0.04) | — | Maleic acid (0.04) | — | PGEE/water (150/15) |
| Sol. 19 | A9 (3.8) | B2 (0.2) | TPSMA (0.04) | — | Maleic acid (0.04) | H$_3$BO$_3$ (0.01) | PGEE/water (150/15) |
| Sol. 20 | A10 (3.8) | B2 (0.2) | TPSMA (0.04) | — | Maleic acid (0.04) | H$_3$PO$_4$ (0.01) | PGEE/water (150/15) |
| Sol. 21 | A9 (3.8) | B2 (0.2) | TPSH$_2$BO$_3$ (0.04) | — | Maleic acid (0.04) | — | PGEE/water (150/15) |
| Sol. 22 | A10 (3.8) | B2 (0.2) | TPSH$_2$PO$_4$ (0.04) | — | Maleic acid (0.08) | TEAOH (0.04) | PGEE/water (150/15) |
| Sol. 23 | A1 (4.0) | — | TPSMA (0.04) | — | Maleic acid (0.04) | PEOL (0.04) | PGEE/water (150/15) |
| Sol. 24 | A8 (3.6) | B1 (0.4) | TPSMA (0.04) | — | Maleic acid (0.04) | TMOL (0.04) | PGEE/water (150/15) |
| Sol. 25 | A9 (4.0) | — | TPSMA (0.04) | — | Maleic acid (0.04) | — | PGEE/water (150/15) |
| Sol. 26 | A8 (4.0) | — | TPSMA (0.04) | — | Maleic acid (0.04) | — | PGEE/water (150/15) |

Additives in the above Table 3 used are as follows:
TPSH$_2$PO$_4$: Mono(triphenylsulfonium)phosphate
TPSH$_2$BO$_3$: Mono(triphenylsulfonium)borate
TPSMA: Mono(triphenylsulfonium)maleate
TPSNO$_3$: Triphenyl sulfonium nitrate
QMANO$_3$: Tetramethyl ammonium nitrate
TPSNf: Triphenyl sulfonium nonafluorobutanesulfonate
TAEOH: Triethanolamine
PEOL: Pentaerythritol
TMOL: Trimethylolethane
SORBOL: Sorbitol
XYTOL: Xylitol

[Coating Film Wet Etching Test]

Sols. 1 to 26 which were the compositions for forming a coating type BPSG film solution, were each spin coated on a silicon wafer, and heated at 240° C. for 160 seconds to form BPSG films, Films 1 to 26 each having a film thickness of 35 nm. These BPSG films were dipped in a 1% aqueous hydrogen peroxide containing 0.6% ammonia (hereinafter referred to as "ammonia per-water") at 50° C. for 10 minutes, and the remained film thickness was measured by M-2000 High-speed Spectroscopic Ellipsometer manufactured by J.A. Woollam Co., Inc. The results are shown in the following Table 4.

TABLE 4

| No. | Film thickness before treatment (Å) | Film thickness after treatment (Å) |
|---|---|---|
| Film 1 | 346 | 2 or less |
| Film 2 | 352 | 2 or less |
| Film 3 | 348 | 2 or less |
| Film 4 | 345 | 2 or less |
| Film 5 | 346 | 2 or less |
| Film 6 | 353 | 2 or less |
| Film 7 | 353 | 2 or less |
| Film 8 | 349 | 2 or less |
| Film 9 | 346 | 2 or less |
| Film 10 | 349 | 2 or less |
| Film 11 | 349 | 2 or less |
| Film 12 | 345 | 2 or less |
| Film 13 | 353 | 2 or less |
| Film 14 | 352 | 2 or less |
| Film 15 | 350 | 2 or less |
| Film 16 | 347 | 2 or less |
| Film 17 | 346 | 2 or less |
| Film 18 | 354 | 2 or less |
| Film 19 | 355 | 2 or less |
| Film 20 | 347 | 2 or less |
| Film 21 | 345 | 2 or less |
| Film 22 | 347 | 2 or less |
| Film 23 | 352 | 2 or less |
| Film 24 | 354 | 2 or less |

TABLE 4-continued

| No. | Film thickness before treatment (Å) | Film thickness after treatment (Å) |
|---|---|---|
| Film 25 | 349 | 51 |
| Film 26 | 350 | 30 |

As shown in the above Table 4, in the BPSG films, Films 1 to 24 formed by using the composition for forming a coating type BPSG film containing the silicic acid skeletal structure, the phosphoric acid skeletal structure and the boric acid skeletal structure, the film thicknesses after treatment by ammonia per-water were each 2 Å or less, whereby the film could be sufficiently removed by the ammonia per-water. On the other hand, in the BPSG film, Film 25 formed by using the composition for forming a coating type BPSG film without containing the phosphoric acid skeletal structure, and in the BPSG film, Film 26 formed by using the composition for forming a coating type BPSG film without containing the boric acid skeletal structure, the film thicknesses after treatment by ammonia per-water were each 30 Å or more, whereby the film could not be sufficiently removed by the ammonia per-water.

[Patterning Test by Positive Type Development]

A spin-on carbon film ODL-50 (Carbon content: 80% by mass) available from Shin-Etsu Chemical Co., Ltd., was formed on a silicon wafer with a film thickness of 200 nm. The compositions for forming a coating type BPSG film solutions, Sols. 1 to 24 were each coated thereon and heated at 240° C. for 60 seconds to form BPSG films, Films 1 to 24 with a film thickness of 35 nm, respectively.

Subsequently, the ArF resist solution for positive type development (PR-1) described in the following Table 5 was coated on the BPSG film, and baked at 110° C. for 60 seconds to form a photoresist film having a film thickness of 100 nm. Further, the liquid immersion protective film (TC-1) described in the following Table 6 was coated on the photoresist film and baked at 90° C. for 60 seconds to form a protective film with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive type line and space pattern.

A cross-sectional shape of the thus obtained substrate was observed by an electron microscope (S-9380) manufactured by Hitachi Ltd., and collapse of the pattern of the same was observed by an electron microscope (CG4000) manufactured by Hitachi High-Technologies Corporation.

The composition of the ArF resist solution for positive type development (PR-1) to be used for the patterning test by the above-mentioned positive type development is shown in the following Table 5.

TABLE 5

| No. | Polymer (Parts by mass) | Acid generator (Parts by mass) | Base (Parts by mass) | Solvent (Parts by mass) |
|---|---|---|---|---|
| PR-1 | ArF resist polymer 1 (100) | PAG1 (7.0) | Quencher (1.0) | PGMEA (2,500) |

Molecular weight, dispersity and the structural formula of the ArF resist polymer 1 shown in the above Table 5 are shown below.

ArF resist polymer 1: Molecular weight (Mw)=7,800
Dispersity (Mw/Mn)=1.78

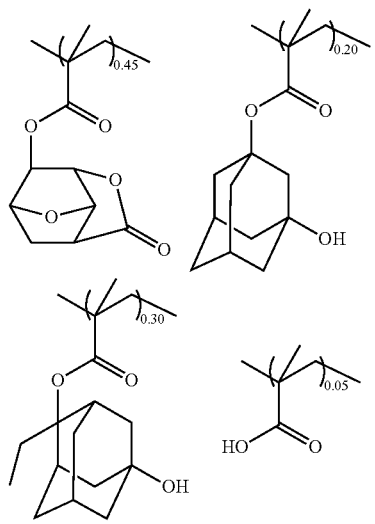

The structural formula of the acid generator: PAG1 shown in the above Table 5 is shown below.

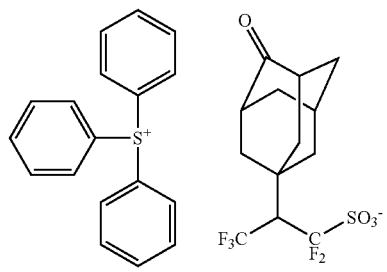

The structural formula of the base: Quencher shown in the above Table 5 is shown below.

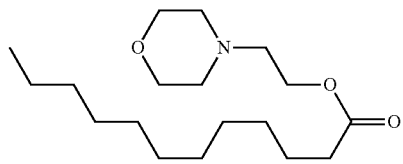 [SMILES: CCCCCCCCCCCC(=O)OCCN1CCOCC1]

The composition of the liquid immersion protective film (TC-1) to be used in the patterning test by the above-mentioned positive type development is shown in the following Table 6.

TABLE 6

| | Polymer (Parts by mass) | Organic solvent (Parts by mass) |
|---|---|---|
| TC-1 | Protective film polymer (100) | Diisoamylether(2700) 2-methyl-1-butanol(270) |

Molecular weight, dispersity and structural formula of the protective film polymer shown in the above Table 6 are shown below.

Protective film polymer: Molecular weight (Mw)=8,800
Dispersity (Mw/Mn)=1.69

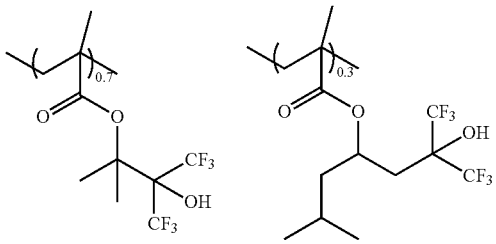

The results of observing the cross-sectional shape of the substrates and collapse of the pattern of the same obtained by the patterning test by the positive type development as mentioned above are shown in the following Table 7.

TABLE 7

| Examples | BPSG film | Cross-sectional pattern shape after development | Collapse of the pattern |
|---|---|---|---|
| Example 1-1 | Film 1 | Vertical shape | None |
| Example 1-2 | Film 2 | Vertical shape | None |
| Example 1-3 | Film 3 | Vertical shape | None |
| Example 1-4 | Film 4 | Vertical shape | None |
| Example 1-5 | Film 5 | Vertical shape | None |
| Example 1-6 | Film 6 | Vertical shape | None |
| Example 1-7 | Film 7 | Vertical shape | None |
| Example 1-8 | Film 8 | Vertical shape | None |
| Example 1-9 | Film 9 | Vertical shape | None |
| Example 1-10 | Film 10 | Vertical shape | None |
| Example 1-11 | Film 11 | Vertical shape | None |
| Example 1-12 | Film 12 | Vertical shape | None |
| Example 1-13 | Film 13 | Vertical shape | None |
| Example 1-14 | Film 14 | Vertical shape | None |
| Example 1-15 | Film 15 | Vertical shape | None |
| Example 1-16 | Film 16 | Vertical shape | None |
| Example 1-17 | Film 17 | Vertical shape | None |
| Example 1-18 | Film 18 | Vertical shape | None |
| Example 1-19 | Film 19 | Vertical shape | None |
| Example 1-20 | Film 20 | Vertical shape | None |
| Example 1-21 | Film 21 | Vertical shape | None |
| Example 1-22 | Film 22 | Vertical shape | None |
| Example 1-23 | Film 23 | Vertical shape | None |
| Example 1-24 | Film 24 | Vertical shape | None |

As shown in the above Table 7, in the positive type development, the substrate using the BPSG film of the present invention as a resist under layer film gave a resist cross-section of a vertical shape. Also, in such substrates, it could be admitted that no collapse of the pattern occurred.

[Patterning Test by Negative Type Development]

A spin-on carbon film ODL-50 (Carbon content: 80% by mass) available from Shin-Etsu Chemical Co., Ltd., was formed on a silicon wafer with a film thickness of 200 nm. The compositions for forming a coating type BPSG film solutions, Sols. 11 to 18 were each coated thereon and heated at 240° C. for 60 seconds to form BPSG films, Films 11 to 18 with a film thickness of 35 nm, respectively.

Subsequently, the ArF resist solution for negative type development (PR-2) described in the following Table 8 was coated on the BPSG film, and baked at 100° C. for 60 seconds to form a photoresist film having a film thickness of 100 nm. Further, the liquid immersion protective film (TC-1) described in the above Table 6 was coated on the photoresist film and baked at 90° C. for 60 seconds to form a protective film with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), and baked at 100° C. for 60 seconds (PEB). Then, while rotating with 30 rpm, butyl acetate was discharged for 3 seconds from a development nozzle as a developing solution, thereafter rotation was stopped, and paddle development was performed for 27 seconds. The resulting wafer was rinsed with diisoamyl ether and was spin dried, and baked at 100° C. for 20 seconds to evaporate the rinsing solvent. According to this patterning, 43 nm 1:1 negative type line and space pattern was obtained.

A cross-sectional shape of the thus obtained substrate was observed by an electron microscope (S-4700) manufactured by Hitachi Ltd., and collapse of the pattern of the same was observed by an electron microscope (CG4000) manufactured by Hitachi High-Technologies Corporation.

The composition of the ArF resist solution for negative type development (PR-2) to be used for the patterning test by the above-mentioned negative type development is shown in the following Table 8.

TABLE 8

| No. | Polymer (Parts by mass) | Acid generator (Parts by mass) | Base (Parts by mass) | Solvent (Parts by mass) |
|---|---|---|---|---|
| PR-2 | ArF resist polymer 2 (100) | PAG2 (7.0) | Quencher (1.0) | PGMEA (2,500) |

Molecular weight, dispersity and structural formula of the ArF resist polymer 2 shown in the above Table 8 are shown below.

ArF resist polymer 2: Molecular weight (Mw)=8,600
Dispersity (Mw/Mn)=1.88

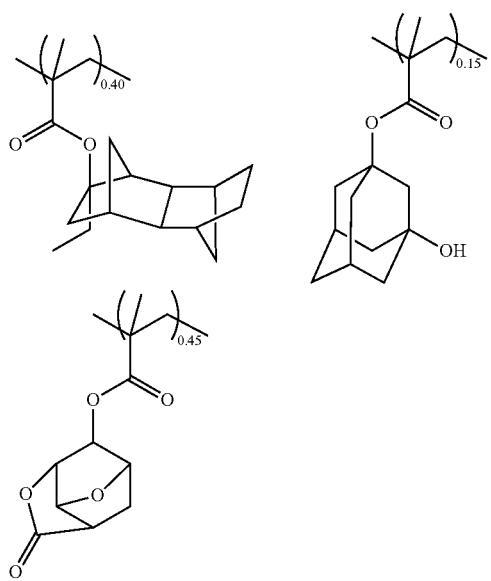

The structural formula of the acid generator: PAG2 shown in the above Table 8 is shown below.

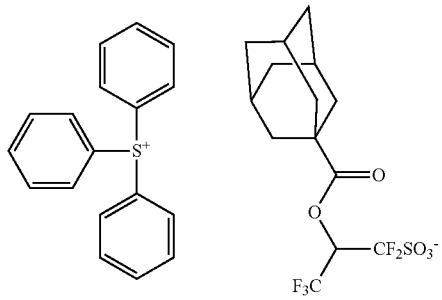

Meanwhile, the base: Quencher shown in the above Table 8 was used the same one as that used in PR-1 of the patterning test by the positive type development mentioned above.

The results of observing the cross-sectional shape of the substrates and collapse of the pattern of the same obtained by the patterning test by the negative type development as mentioned above are shown in the following Table 9.

TABLE 9

| Examples | BPSG film | Cross-sectional pattern shape after development | Collapse of the pattern |
|---|---|---|---|
| Example 2-1 | Film 11 | Vertical shape | None |
| Example 2-2 | Film 12 | Vertical shape | None |
| Example 2-3 | Film 13 | Vertical shape | None |
| Example 2-4 | Film 14 | Vertical shape | None |
| Example 2-5 | Film 15 | Vertical shape | None |
| Example 2-6 | Film 16 | Vertical shape | None |
| Example 2-7 | Film 17 | Vertical shape | None |
| Example 2-8 | Film 18 | Vertical shape | None |

As shown in the above Table 9, also in the negative type development, the substrate using the BPSG film of the present invention as a resist under layer film gave a resist cross-section of a vertical shape. Also, in such substrates, it could be admitted that no collapse of the pattern occurred.

From the results as mentioned above, it could be clarified that the coating type BPSG film formed by using the composition for forming a coating type BPSG film of the present invention can be easily wet etched by a peeling solution such as SC-1 (ammonia per-water), etc., which does not cause any damage to the coating type organic under layer film or the CVD film mainly comprising carbon. It could be also clarified that the coating type BPSG film formed by using the composition for forming a coating type BPSG film of the present invention shows good adhesiveness to the photoresist pattern formed thereon by using it as a resist under layer film, and it becomes a resist under layer film without causing collapse of the pattern even in fine pattern.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A composition for forming a coating type BPSG film, which comprises:

one or more polymers containing one or more structures comprising a silicic acid represented by the following general formula (1) as a skeletal structure, one or more structures comprising a phosphoric acid represented by the following general formula (2) as a skeletal structure and one or more structures comprising a boric acid represented by the following general formula (3) as a skeletal structure in one molecule,

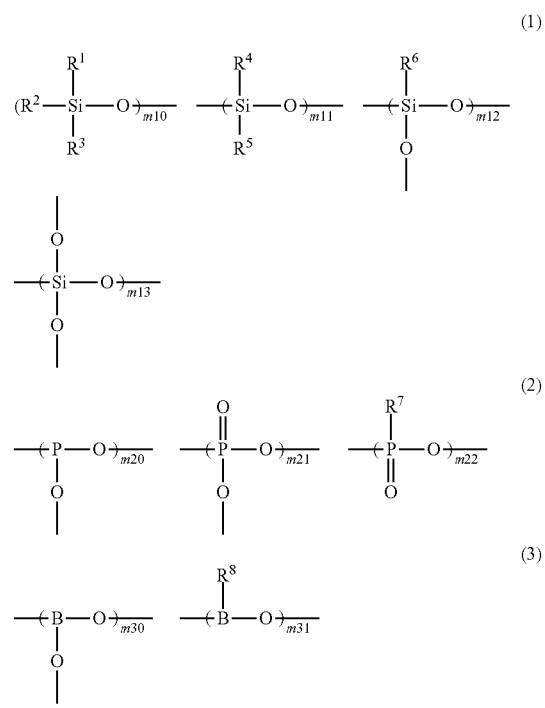

wherein, $R^1$, $R^2$, $R^3$, $R^4$, $R^5$, $R^6$, $R^7$ and $R^8$ each represent a hydrogen atom or an organic group having 1 to 30 carbon atoms, wherein a hydrogen atom(s) in the organic group may be substituted by a halogen atom(s); m10, m11, m12 and m13 each represent a molar fraction in the structure comprising a silicic acid as a skeletal structure, and satisfy $m10+m11+m12+m13=1$, $0 \leq m10 \leq 0.3$, $0 \leq m11 \leq 0.5$, $0 \leq m12 \leq 0.7$ and $0 < m13 \leq 1$; m20, m21 and m22 each represent a molar fraction in the structure comprising a phosphoric acid as a skeletal structure, and satisfy $m20+m21+m22=1$, $0 \leq m20 \leq 1$, $0 \leq m21 \leq 1$ and $0 \leq m22 < 1$; m30 and m31 each represent a molar fraction in the structure comprising a boric acid as a skeletal structure, and satisfy $m30+m31=1$, $0 \leq m30 \leq 1$ and $0 \leq m31 \leq 1$.

2. The composition for forming a coating type BPSG film according to claim 1, wherein the composition comprises, a solvent(s) and as said one or more polymers, a polymer selected from a hydrolysate, a condensate and a hydrolysis condensate of a mixture, as Component (A), which comprises one or more silicon compounds represented by the following general formulae (A-1-1) to (A-1-4), and both of one or more phosphorus compounds represented by the following general formulae (A-2-1) to (A-2-6) and one or more boron compounds represented by the following general formulae (A-3-1) to (A-3-3), $R^1R^2R^3SiOR$      (A-1-1)

$R^4R^5Si(OR)_2$      (A-1-2)

$R^6Si(OR)_3$ (A-1-3)

$Si(OR)_4$ (A-1-4)

wherein, R represents a hydrocarbon group having 1 to 6 carbon atoms; and $R^1$, $R^2$, $R^3$, $R^4$, $R^5$ and $R^6$ have the same meanings as defined above, $PX_3$ (A-2-1)

$POX_3$ (A-2-2)

$P_2O_5$ (A-2-3)

$H(HPO_3)_aOH$ (A-2-4)

$R^7PX_2$ (A-2-5)

$R^7POX_2$ (A-2-6)

wherein, $R^7$ has the same meaning as defined above; X represents a halogen atom, a hydroxyl group or an alkoxy group having 1 to 6 carbon atoms; and "a" is an integer of 1 or more, $BX_3$ (A-3-1)

$B_2O_3$ (A-3-2)

$R^8BX_2$ (A-3-3)

wherein, $R^8$ and X have the same meanings as defined above.

3. The composition for forming a coating type BPSG film according to claim 2, wherein the composition further comprises, as Component (B), one or more selected from one or more silicon compounds represented by the following general formula (B-1), a hydrolysate, a condensate and a hydrolysis condensate thereof,

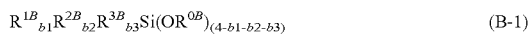 (B-1)

wherein, $R^{OB}$ represents a hydrocarbon group having 1 to 6 carbon atoms; $R^{1B}$, $R^{2B}$ and $R^{3B}$ each represent a hydrogen atom or an organic group having 1 to 30 carbon atoms; and b1, b2 and b3 are each 0 or 1, and satisfy $1 \leq b1+b2+b3 \leq 3$.

4. The composition for forming a coating type BPSG film according to claim 3, wherein one or more of $R^{1B}$, $R^{2B}$ and $R^{3B}$ in the above general formula (B-1) is/are an organic group(s) having a hydroxyl group or a carboxyl group each substituted by an acid-labile group.

5. The composition for forming a coating type BPSG film according to claim 3, wherein the Component (B) comprises one or more selected from one or more silicon compounds represented by the above general formulae (A-1-1) to (A-1-4), one or more phosphorus compounds represented by the above general formulae (A-2-1) to (A-2-6), and one or more boron compounds represented by the above general formulae (A-3-1) to (A-3-3) each alone, or a mixture thereof, and a hydrolysate, a condensate and a hydrolysis condensate thereof.

6. The composition for forming a coating type BPSG film according to claim 4, wherein the Component (B) comprises one or more selected from one or more silicon compounds represented by the above general formulae (A-1-1) to (A-1-4), one or more phosphorus compounds represented by the above general formulae (A-2-1) to (A-2-6), and one or more boron compounds represented by the above general formulae (A-3-1) to (A-3-3) each alone, or a mixture thereof, and a hydrolysate, a condensate and a hydrolysis condensate thereof.

7. The composition for forming a coating type BPSG film according to claim 1, wherein the composition further comprises an organic compound(s) having 2 or more hydroxyl groups or carboxyl groups in one molecule.

8. The composition for forming a coating type BPSG film according to claim 6, wherein the composition further comprises an organic compound(s) having 2 or more hydroxyl groups or carboxyl groups in one molecule.

9. A substrate which is to be used in a manufacturing process of a semiconductor apparatus, and comprises a BPSG film formed on a body to be processed by coating the composition for forming a coating type BPSG film according to claim 1.

10. The substrate according to claim 9, wherein the BPSG film functions as at least one of a resist under layer film, a flattening film and an insulating film.

11. The substrate according to claim 9, wherein the body to be processed is a semiconductor apparatus substrate on which a part or whole of semiconductor circuits has/have been formed, and the BPSG film is formed by spin coating the composition for forming a coating type BPSG film on the semiconductor apparatus substrate and baking the same.

12. A patterning process which comprises forming an organic under layer film on a body to be processed by using a coating type organic under layer film material, forming a BPSG film on the organic under layer film by using the composition for forming a coating type BPSG film according to claim 1, forming an upper layer resist film on the BPSG film, forming a pattern to the upper layer resist film, pattern transferring to the BPSG film by etching using the upper layer resist film having the formed pattern as a mask, and pattern transferring to the organic under layer film by etching using the BPSG film having the formed pattern as a mask, to form a mask pattern for processing the body to be processed.

13. A patterning process which comprises forming a hard mask mainly comprising carbon on a body to be processed by a CVD method, forming a BPSG film on the hard mask by using the composition for forming a coating type BPSG film according to claim 1, forming an upper layer resist film on the BPSG film, forming a pattern to the upper layer resist film, pattern transferring to the BPSG film by etching using the upper layer resist film having the formed pattern as a mask, and pattern transferring to the hard mask by etching using the BPSG film having the formed pattern as a mask, to form a mask pattern for processing the body to be processed.

14. The patterning process according to claim 12, wherein a process for removing the BPSG film by wet etching is carried out after subjecting to the process for fanning the mask pattern for processing the body to be processed.

15. The patterning process according to claim 13, wherein a process for removing the BPSG film by wet etching is carried out after subjecting to the process for forming the mask pattern for processing the body to be processed.

16. The patterning process according to claim 12, wherein the body to be processed is a material in which any of a metal film, an amorphous metal film, a metal carbide film, a metal oxide film, a metal nitride film, a metal oxycarbide film or a metal oxynitride film is formed on a semiconductor apparatus substrate on which a part or whole of semiconductor circuits has/have been formed, as a layer to be processed.

17. The patterning process according to claim 13, wherein the body to be processed is a material in which any of a metal film, an amorphous metal film, a metal carbide film, a metal oxide film, a metal nitride film, a metal oxycarbide film or a metal oxynitride film is formed on a semiconductor apparatus substrate on which a part or whole of semiconductor circuits has/have been fotined, as a layer to be processed.

18. The patterning process according to claim 12, wherein the metal constitutes the body to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

19. The patterning process according to claim 13, wherein the metal constitutes the body to be processed comprises silicon, titanium, tungsten, hafnium, zirconium, chromium, germanium, copper, aluminum, indium, gallium, arsenic, palladium, iron, tantalum, iridium, molybdenum, or an alloy thereof.

20. The patterning process according to claim 12, wherein pattern formation of the upper layer resist film is carried out by a lithography method using light with a wavelength of 300 nm or less or EUV light, an electron beam direct drawing method, a directed self-assembly method or a nano-imprinting lithography method.

21. The patterning process according to claim 13, wherein pattern formation of the upper layer resist film is carried out by a lithography method using light with a wavelength of 300 nm or less or EUV light, an electron beam direct drawing method, a directed self-assembly method or a nano-imprinting lithography method.

\* \* \* \* \*